(12) United States Patent
Nishimura

(10) Patent No.: US 11,315,848 B2
(45) Date of Patent: Apr. 26, 2022

(54) SEMICONDUCTOR DEVICE AND METHOD OF MANUFACTURING SEMICONDUCTOR DEVICE

(71) Applicant: ROHM CO., LTD., Kyoto (JP)

(72) Inventor: Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 118 days.

(21) Appl. No.: 16/703,037

(22) Filed: Dec. 4, 2019

(65) Prior Publication Data

US 2020/0266172 A1 Aug. 20, 2020

(30) Foreign Application Priority Data

Feb. 20, 2019 (JP) .............................. JP2019-028481

(51) Int. Cl.
*H01L 23/31* (2006.01)
*H01L 23/538* (2006.01)
(Continued)

(52) U.S. Cl.
CPC ........ *H01L 23/3121* (2013.01); *H01L 21/486* (2013.01); *H01L 21/4871* (2013.01); *H01L 21/563* (2013.01); *H01L 23/293* (2013.01); *H01L 23/49811* (2013.01); *H01L 23/49838* (2013.01); *H01L 23/5389* (2013.01); *H01L 24/05* (2013.01); *H01L 24/11* (2013.01); *H01L 24/13* (2013.01); *H01L 24/16* (2013.01); *H01L 24/73* (2013.01); *H01L 24/81* (2013.01); *H01L 23/147* (2013.01); *H01L 23/3735* (2013.01); *H01L 25/0655* (2013.01); *H01L 2021/60015* (2013.01); *H01L 2224/11464* (2013.01); *H01L 2224/13083* (2013.01); *H01L 2224/13111* (2013.01); *H01L 2224/13147* (2013.01); *H01L 2224/13155* (2013.01); *H01L 2224/14135* (2013.01); *H01L 2224/14136* (2013.01);
(Continued)

(58) Field of Classification Search
CPC ............. H01L 23/3121; H01L 23/5389; H01L 23/147; H01L 23/49861; H01L 23/4334; H01L 23/49838; H01L 21/563
See application file for complete search history.

(56) References Cited

U.S. PATENT DOCUMENTS 8,796,800 B2 * 8/2014 Oganesian ........ H01L 27/14618
257/433
9,735,113 B2 * 8/2017 Chi ........................ H01L 21/561
(Continued)

FOREIGN PATENT DOCUMENTS

JP        2005-277380 A        10/2005

*Primary Examiner* — Zandra V Smith
*Assistant Examiner* — Abbigale A Boyle
(74) *Attorney, Agent, or Firm* — Hamre, Schumann, Mueller & Larson, P.C.

(57) ABSTRACT

A semiconductor device, includes: a semiconductor element including an element main surface and an element back surface facing opposite sides in a thickness direction; a wiring part electrically connected to the semiconductor element; an electrode pad electrically connected to the wiring part; a sealing resin configured to cover a part of the semiconductor element; and a first metal layer configured to make contact with the element back surface and exposed from the sealing resin, wherein the semiconductor element overlaps the first metal layer when viewed in the thickness direction.

14 Claims, 40 Drawing Sheets

(51) Int. Cl.
*H01L 23/00* (2006.01)
*H01L 21/48* (2006.01)
*H01L 21/56* (2006.01)
*H01L 23/29* (2006.01)
*H01L 23/498* (2006.01)
H01L 23/14 (2006.01)
H01L 23/373 (2006.01)
H01L 25/065 (2006.01)
H01L 21/60 (2006.01)

(52) U.S. Cl.
CPC ............... *H01L 2224/16225* (2013.01); *H01L 2224/73203* (2013.01); *H01L 2224/81193* (2013.01)

(56) References Cited

U.S. PATENT DOCUMENTS

| | | | |
|---|---|---|---|
| 10,388,584 B2 * | 8/2019 | Pagaila | H01L 21/563 |
| 2012/0020028 A1 * | 1/2012 | Bachman | H05K 1/0201 |
| | | | 361/719 |
| 2012/0146177 A1 * | 6/2012 | Choi | H01L 25/16 |
| | | | 257/528 |

* cited by examiner

FIG. 5
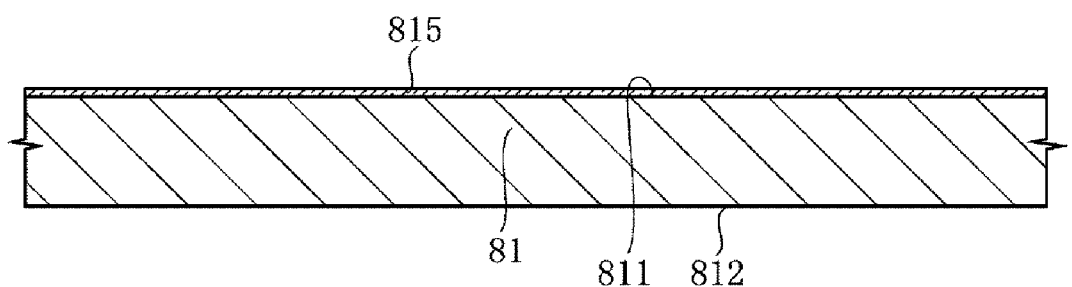
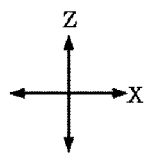
FIG. 6
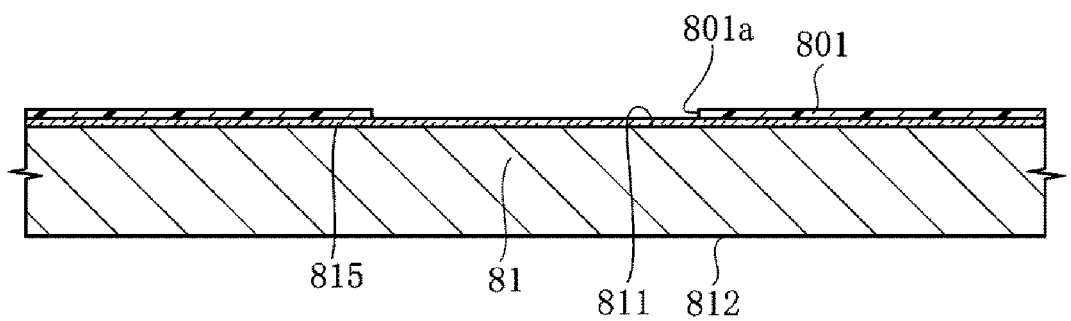
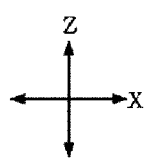

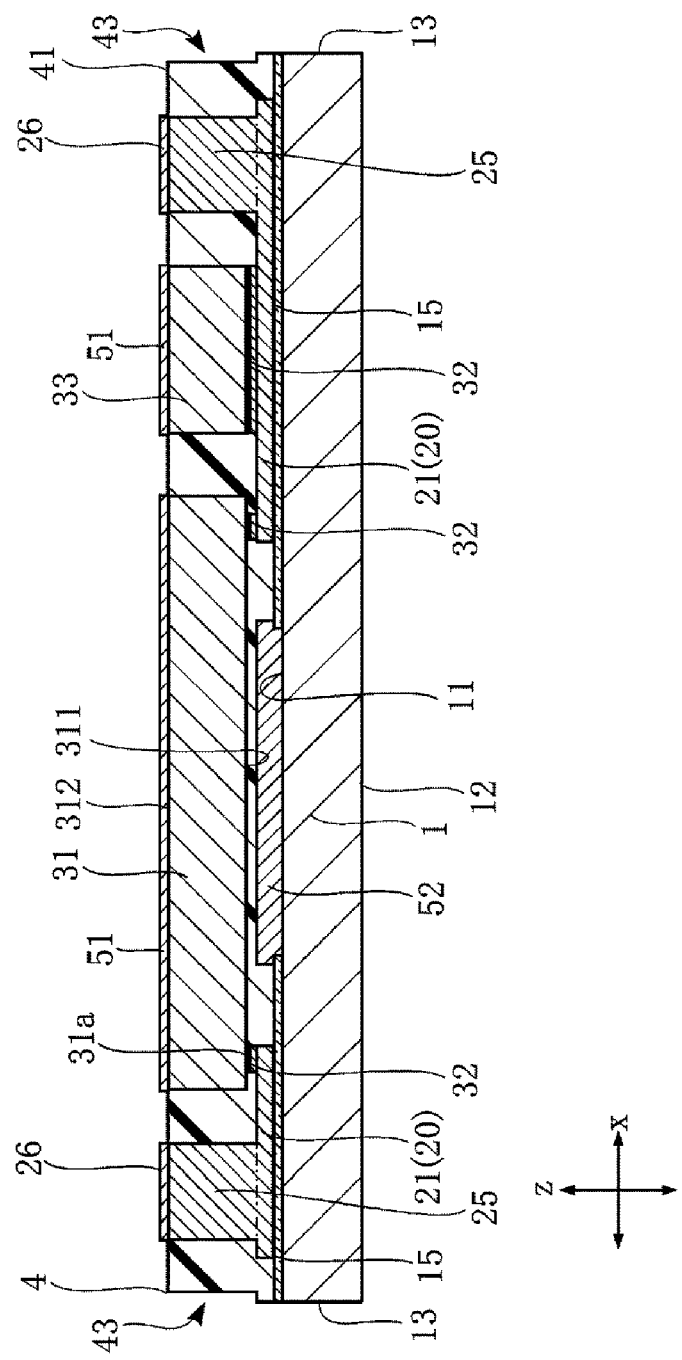

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2019-028481, filed on Feb. 20, 2019, the entire contents of which are incorporated herein by reference.

TECHNICAL FIELD

The present disclosure relates to a semiconductor device on which a semiconductor element is mounted and a manufacturing method thereof.

BACKGROUND

In recent years, there are available so-called micro-machines (MEMS: micro electro mechanical systems) in which various semiconductor elements are mounted on a microfabricated Si substrate (silicon wafer) by applying an LSI manufacturing technique. In manufacturing such a micro-machine, anisotropic etching using an alkaline solution is applied as a micro-fabrication technique for a Si substrate. By the anisotropic etching, fine recess portions can be formed on the Si substrate with high accuracy.

For example, in the related art, there is disclosed a semiconductor device (LED package) based on micro-machine manufacturing technology. In the semiconductor device, a recess having a bottom surface and a side surface is formed on a Si substrate, and an LED chip is mounted on the bottom surface of the recess. The LED chip is accommodated in the recess. Moreover, electrodes electrically connected to the LED chip are formed on the bottom surface and side surface of the recess. The electrodes are obtained by patterning, through photolithography and etching, a Ti layer and a Cu layer formed on the Si substrate including a recess by a sputtering method or the like. After forming the electrodes, an LED chip is mounted on the bottom surface of the recess, and a sealing resin is filled in the recess, thereby manufacturing the semiconductor device.

In the semiconductor device disclosed in the related art, even when a semiconductor element different from the LED chip is mounted, the semiconductor element is covered with a sealing resin. In the case where the semiconductor element generates a relatively large amount of heat when energized, there is a problem that the heat generated from the semiconductor element is not efficiently radiated to the outside because the heat conductivity of the sealing resin is lower than that of the Si substrate.

SUMMARY

Some embodiments of the present disclosure provide a semiconductor device capable of efficiently releasing heat generated from a semiconductor element to the outside and a method of manufacturing the semiconductor device.

According to one embodiment of the present disclosure, there is provided a semiconductor device. The semiconductor device includes: a semiconductor element including an element main surface and an element back surface facing opposite sides in a thickness direction; a wiring part electrically connected to the semiconductor element; an electrode pad electrically connected to the wiring part; a sealing resin configured to cover a part of the semiconductor element; and a first metal layer configured to make contact with the element back surface and exposed from the sealing resin, wherein the semiconductor element overlaps the first metal layer when viewed in the thickness direction.

According to another embodiment of the present disclosure, there is provided a method of manufacturing a semiconductor device. The method includes: providing a substrate made of a semiconductor material; forming a wiring part arranged on the substrate; mounting a semiconductor element by electrically connecting the semiconductor element having an element main surface and an element back surface facing opposite sides in a thickness direction to the wiring part such that the element main surface faces the substrate; forming a sealing resin that covers the semiconductor element; exposing the semiconductor element by removing a part of the sealing resin and exposing the element back surface; forming a first metal layer in contact with the element back surface exposed by the sealing resin; and forming an electrode pad electrically connected to the wiring part.

Other features and advantages of the present disclosure will become more apparent from the detailed description given below with reference to the accompanying drawings.

BRIEF DESCRIPTION OF DRAWINGS

FIG. 5 is a cross-sectional view illustrating a manufacturing step of the semiconductor device shown in FIG. 1.

FIG. 6 is a cross-sectional view illustrating a manufacturing step of the semiconductor device shown in FIG. 1.

FIG. 52 is a cross-sectional view of a semiconductor device according to a modification of the present disclosure.

DETAILED DESCRIPTION

Figure 1:
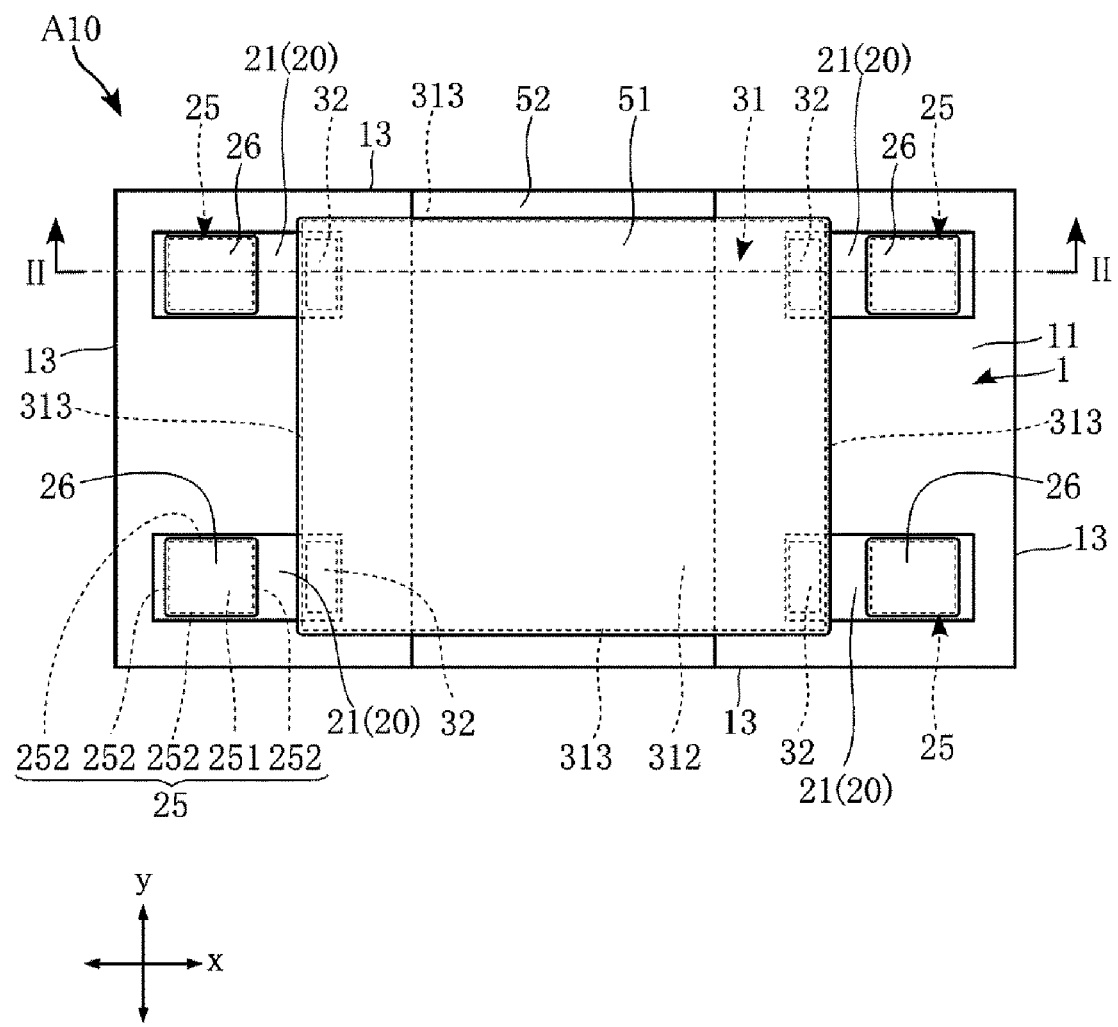
FIG. 1 is a plan view of a semiconductor device according to a first embodiment of the present disclosure.

Preferred embodiments of a semiconductor device and a method of manufacturing a semiconductor device according to the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

First Embodiment

A semiconductor device A10 according to a first embodiment of the present disclosure will be described with reference to FIGS. 1 to 4. The semiconductor device A10 includes a substrate 1, an insulating layer 15, a wiring part 20, columnar bodies 25, electrode pads 26, a semiconductor element 31, a bonding layer 32, a sealing resin 4, a first metal layer 51, and a second metal layer 52.

Figure 2:
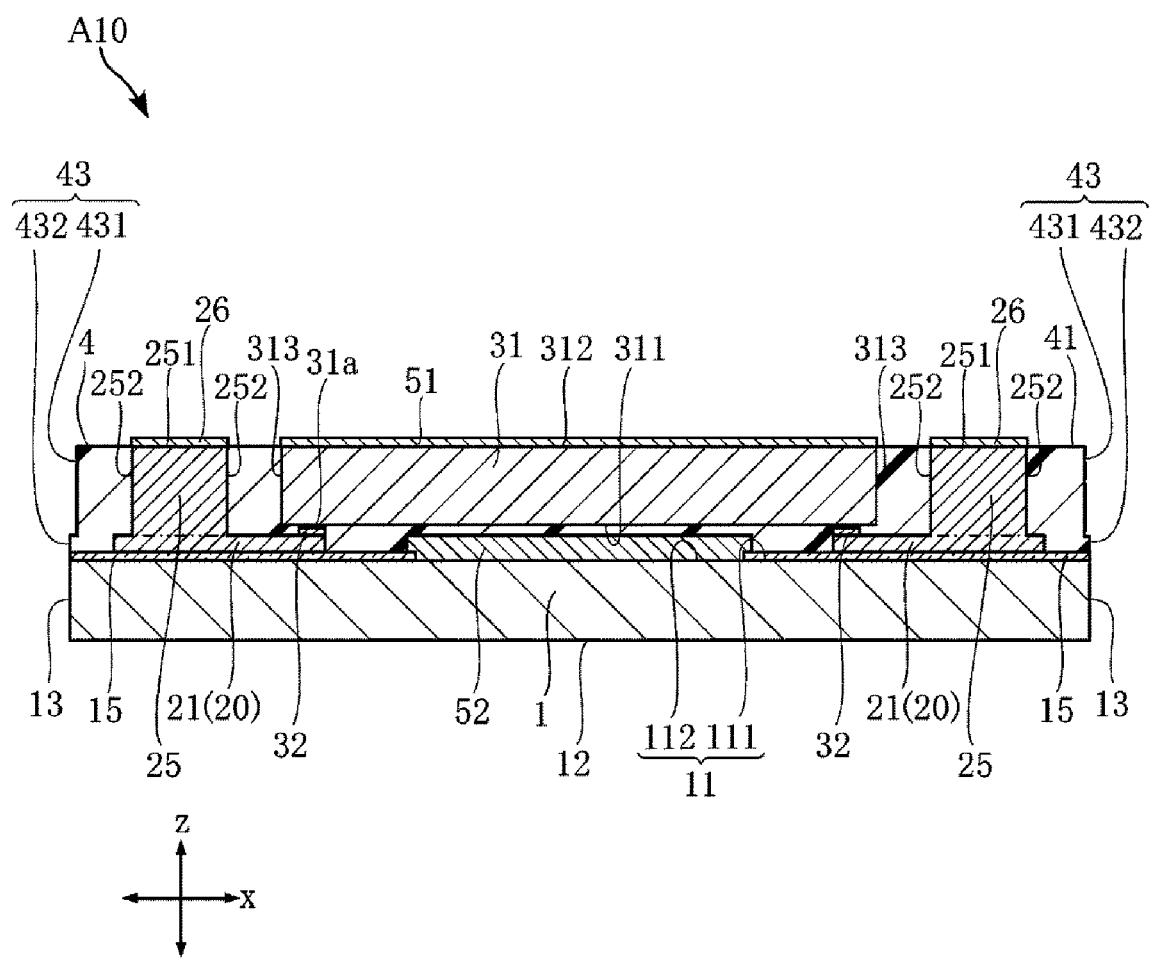
FIG. 2 is a sectional view taken along line II-II in FIG. 1.
Figure 3:
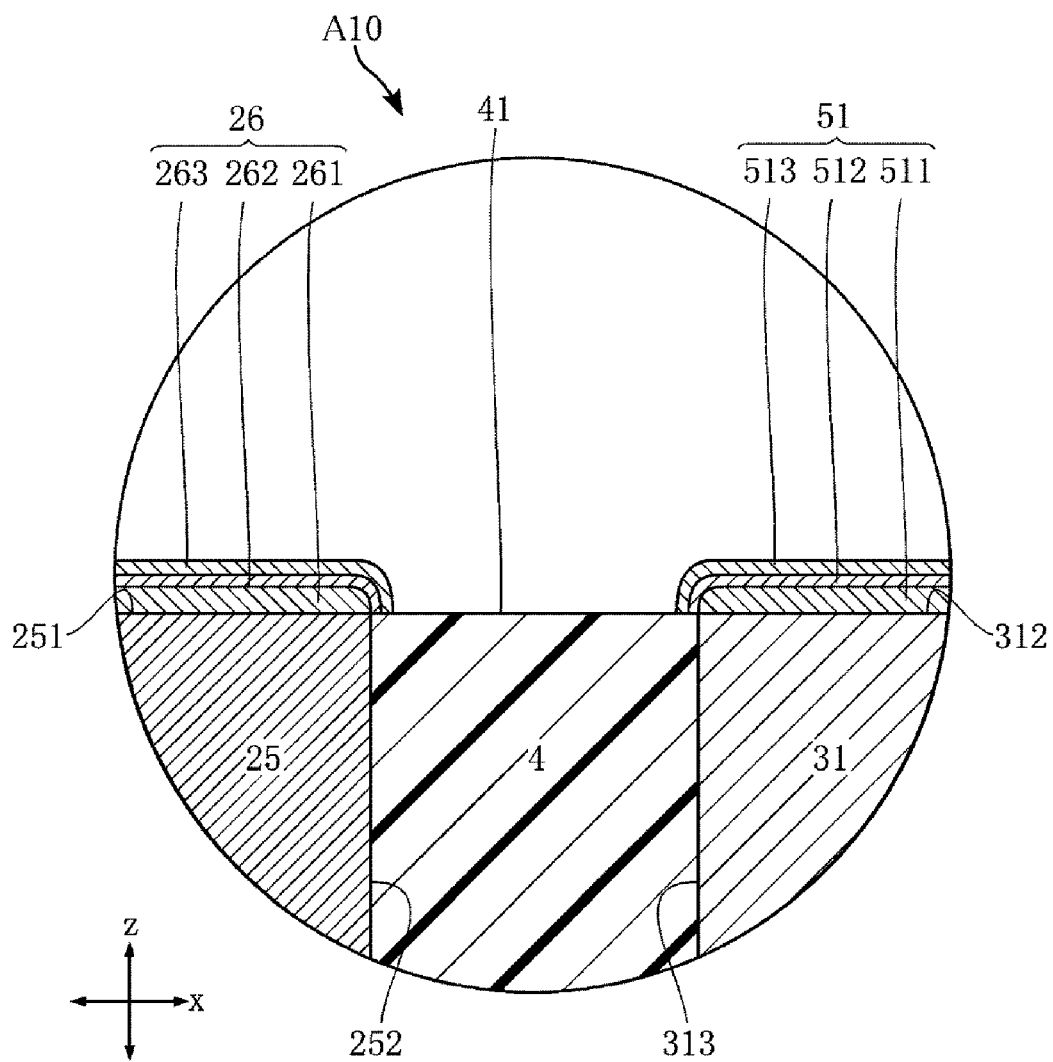
FIG. 3 is an enlarged view (partially enlarged sectional view) of a part of the sectional view shown in FIG. 2.
Figure 4:
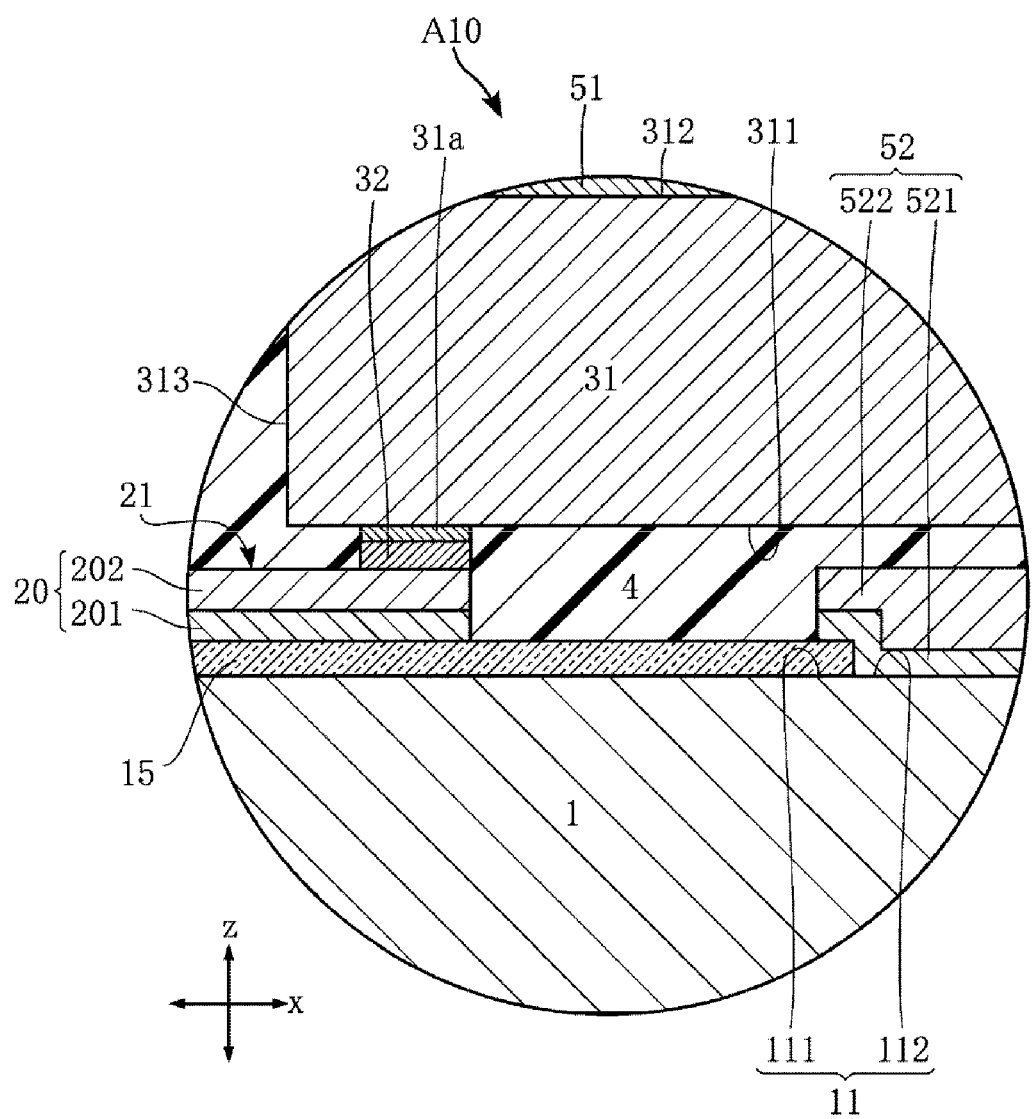
FIG. 4 is an enlarged view (partially enlarged sectional view) of a part of the sectional view shown in FIG. 2.

FIG. 1 is a plan view of the semiconductor device A10. For ease of understanding, the sealing resin 4 and the insulating layer 15 are omitted in FIG. 1. FIG. 2 is a cross-sectional view taken along line II-II in FIG. 1. FIG. 3 is an enlarged view (partially enlarged sectional view) of a part of the cross section shown in FIG. 2. FIG. 3 is a view for mainly explaining cross-sectional structures of the electrode pad 26 and the first metal layer 51. FIG. 4 is an enlarged view (partially enlarged sectional view) of a part of the cross section shown in FIG. 2. FIG. 4 is a view for mainly explaining cross-sectional structures of the wiring part 20 and the second metal layer 52.

The semiconductor device A10 shown in these figures is a device to be surface-mounted on circuit boards of various electronic devices. For convenience of explanation, a thickness direction of the substrate 1 is referred to as a thickness direction z. A longitudinal direction (left-right direction in a plan view) of the semiconductor device A10 orthogonal to the thickness direction z is referred to as a first direction x. The transverse direction (up-down direction in the plan view) of the semiconductor device A10 orthogonal to both the thickness direction z and the first direction x of the substrate 1 is referred to as a second direction y. As shown in FIG. 1, the semiconductor device A10 has a rectangular shape when viewed in the thickness direction z (hereinafter referred to as "in plan view"). The dimension in the thickness direction z of the semiconductor device A10 is, for example, about 300 to 400 μm, the dimension in the first direction x is, for example, about 200 to 7,000 μm, and the dimension in the second direction y is, for example, about 200 to 7,000 μm. Each dimension is not limited.

The substrate 1 is a support member on which the semiconductor element 31 is mounted thereon and serves as the basis of the semiconductor device A10. As shown in FIG. 1, the plan-view shape of the substrate 1 is a rectangular shape whose long side extends along the first direction x. The substrate 1 has a plate shape, and the dimension thereof in the thickness direction z is about 200 to 300 μm. The shape and dimensions of the substrate 1 are not limited. For example, the dimension of the substrate 1 in the thickness direction z may be about 40 μm. The substrate 1 is mainly composed of a monocrystalline intrinsic semiconductor material. This intrinsic semiconductor material is, for example, Si. The material of the substrate 1 is not limited. The substrate 1 has a substrate main surface 11, a substrate back surface 12 and a plurality of substrate side surfaces 13.

As shown in FIG. 2, the substrate main surface 11 and the substrate back surface 12 face opposite sides from each other and are separated from each other in the thickness direction z. As shown in FIG. 2, the substrate main surface 11 faces one side in the thickness direction z. The substrate main surface 11 is flat. Furthermore, the shape of the substrate main surface 11 is rectangular in plan view. In the present embodiment, the substrate main surface 11 faces a circuit board when the semiconductor device A10 is mounted on the circuit board. The substrate main surface 11 includes a covered region 111 and an exposed region 112. The covered region 111 is a region covered with the insulating layer 15. The exposed region 112 is a region not covered by the insulating layer 15 and is exposed from the insulating layer 15. In the present embodiment, the substrate main surface 11 corresponds to a "mounting surface" of the present disclosure.

The substrate back surface 12 faces the opposite side from the substrate main surface 11 in the thickness direction z. The substrate back surface 12 is flat. Furthermore, the shape of the substrate back surface 12 is rectangular in plan view. The substrate back surface 12 is exposed to the outside. As shown in FIG. 2, each of the substrate side surfaces 13 is sandwiched between the substrate main surface 11 and the substrate back surface 12. The substrate 1 has four substrate side surfaces 13 facing either the first direction x or the second direction y. All the substrate side surfaces 13 are flat and are orthogonal to the substrate main surface 11 and the substrate back surface 12.

The insulating layer 15 is a film having an electrical insulation property. As shown in FIG. 2, the insulating layer 15 covers a part (the covered region 111) of the substrate main surface 11 of the substrate 1. The insulating layer 15 electrically insulates the substrate 1 and the wiring part 20. The insulating layer 15 is made of, for example, $SiO_2$, and is formed by thermally oxidizing the substrate 1. The thickness of the insulating layer 15 (the dimension in the thickness direction z) is, for example, about 0.7 to 2.0 μm. The material, thickness and formation method of the insulating layer 15 are not limited.

As shown in FIGS. 1, 2, and 4, the wiring part 20 is a conductor formed on the substrate 1 and electrically connected to the semiconductor element 31. As shown in FIG. 4, the wiring part 20 includes a base layer 201 and a plating layer 202 which are stacked one above the other. The base layer 201 is formed on the substrate 1 and is electrically insulated from the substrate 1 by the insulating layer 15. The base layer 201 includes a Ti layer and a Cu layer stacked one above the other, and has a thickness of about 200 to 800 nm. The plating layer 202 is formed on the outer side of the base layer 201 (on the side opposite to the substrate 1) so as to make contact with the base layer 201. The plating layer 202 is made of Cu. The thickness of the plating layer 202 is set to be thicker than that of the base layer 201, and is about 3 to 20 μm. In the present embodiment, the base layer 201 is formed by a sputtering method. The plating layer 202 is formed by electrolytic plating. The material, film thickness and formation method of the wiring parts 20 are not limited. The wiring part 20 according to the present embodiment includes a plurality of main surface wirings 21.

Each of the main surface wirings 21 is disposed on the substrate main surface 11 as shown in FIGS. 1 and 2. In the present embodiment, the semiconductor device A10 includes four main surface wirings 21. Each main surface wiring 21 has a strip shape extending in the first direction x. The number, shape and arrangement of the main surface wirings 21 are not limited.

Each of the columnar bodies 25 is a conductor that connects the wiring part 20 and the electrode pad 26. In the present embodiment, the semiconductor device A10 has four columnar bodies 25. In the present embodiment, each columnar body 25 has a prismatic shape with a rectangular cross section in the x-y plane. The shape of each columnar body 25 is not limited, and may be, for example, a cylindrical columnar shape. One end (the lower end shown in FIG. 2) of each columnar body 25 in the thickness direction z is connected to the wiring part 20 (main surface wiring 21) and protrudes from the wiring part 20 in the thickness direction z. Furthermore, the other end (the upper end shown in FIG. 2) of each columnar body 25 in the thickness direction z is exposed from the sealing resin 4 and connected to the electrode pad 26. Each columnar body 25 has a top surface 251 and a plurality of side surfaces 252. In each columnar body 25, the top surface 251 corresponds to the other end. The top surface 251 is exposed from the sealing resin 4 and is in contact with each electrode pad 26. The side surfaces 252 are parallel to the thickness direction z. In the present embodiment, each columnar body 25 has four side surfaces 252, and each of the four side surfaces 252 faces one of the first direction x and the second direction y. Each of the side surfaces 252 is covered with the sealing resin 4. Each columnar body 25 is made of, for example, Cu and is formed by electrolytic plating. The number, material and formation method of the columnar bodies 25 are not limited. In the present embodiment, as shown in FIG. 2, each columnar body 25 and the wiring part 20 (each main surface wiring 21) are integrated by being joined at the boundaries thereof. They may not be joined and may not be integrated.

The electrode pads 26 are terminals for surface-mounting the semiconductor device A10 on a circuit board of an electronic device. In the present embodiment, the semiconductor device A10 has four electrode pads 26. Each of the electrode pads 26 is a conductor having a rectangular shape in plan view. Each electrode pad 26 is configured to make contact with the entire top surface 251 of each columnar body 25 exposed from the sealing resin 4. Each electrode pad 26 partially overlaps each main surface wiring 21 and the sealing resin 4 in plan view. In the present embodiment, as shown in FIG. 3, each electrode pad 26 includes, for example, a Ni layer 261, a Pd layer 262, and an Au layer 263, which are stacked one above another. In the present embodiment, the Ni layer 261 is in contact with a columnar wiring, the Au layer 263 is exposed to the outside, and the Pd layer 262 is interposed between the Ni layer 261 and the Au layer 263. As shown in FIG. 1, the electrode pads 26 are all located on the outer periphery of the first metal layer 51 in plan view. In the present embodiment, the thickness (dimension in the thickness direction z) of each electrode pad 26 is, for example, about 3 to 15 μm. In the present embodiment, the electrode pads 26 are formed by electroless plating. The number, thickness, material, shape and formation method of the electrode pads 26 are not limited. For example, the electrode pads 26 may have a structure in which the Ni layer 261 and the Au layer 263 are stacked without including the Pd layer 262.

The wiring part 20 (the plurality of main surface wirings 21), the plurality of columnar bodies 25, and the plurality of electrode pads 26 constitute a conductive path between the circuit board, on which the semiconductor device A10 is mounted, and the semiconductor element 31. The arrangement of the wiring part 20, the plurality of columnar bodies 25, and the plurality of electrode pads 26 shown in FIGS. 1 and 2 is one example. The arrangement of the wiring part 20, the plurality of columnar bodies 25, and the plurality of electrode pads 26 in the actual semiconductor device A10 is not limited thereto.

The semiconductor element 31 is electrically connected to the wiring part 20 as shown in FIG. 2. The semiconductor element 31 has a rectangular shape in plan view. The semiconductor element 31 is flip-chip mounted on the substrate 1. In the present embodiment, an accommodation space for the semiconductor element 31 is formed by the plurality of columnar bodies 25. The semiconductor element 31 according to the present embodiment is an integrated circuit (IC) in which a circuit for driving a switching element such as, for example, a MOSFET (Metal Oxide Semiconductor Field Effect Transistor) or the like is formed. The semiconductor element 31 is not limited thereto and may be an element in which various circuits are formed. The semiconductor element 31 may also be, for example, a Hall element. The semiconductor element 31 has an element main surface 311, an element back surface 312, and a plurality of element side surfaces 313.

As shown in FIG. 2, the element main surface 311 and the element back surface 312 face opposite sides from each other and are separated from each other in the thickness direction z. The element main surface 311 faces the substrate main surface 11. A plurality of electrode bumps 31a is formed on the element main surface 311. Each electrode bump 31a includes, for example, an alloy solder containing Sn, an alloy solder layer containing Sn/Ni layer/Cu layer, an alloy solder layer containing Sn/Cu layer, or an Au layer/Pd layer/Ni layer. The element back surface 312 faces the same direction as the substrate main surface 11 (thickness direction z). The element back surface 312 is exposed from the sealing resin 4. Each of the element side surfaces 313 is parallel to the thickness direction z. The semiconductor element 31 in the present embodiment has four element side surfaces 313, and each of the four element side surfaces 313 faces either the first direction x or the second direction y. Each element side surface 313 is covered with the sealing resin 4.

As shown in FIGS. 2 and 4, each of the bonding layers 32 is a conductor interposed between each electrode bump 31a of the semiconductor element 31 and each main surface wiring 21. The semiconductor element 31 is fixedly connected to each main surface wiring 21 by each bonding layer 32, and electrical connection between the semiconductor element 31 and each main surface wiring 21 (wiring part 20) is ensured. The bonding layer 32 according to the present embodiment includes a Ni layer and an alloy layer containing Sn, which are stacked one above the other. The alloy layer is, for example, a lead-free solder such as a Sn—Ag alloy or a Sn—Sb alloy. In the present embodiment, the Ni layer is in contact with the main surface wirings 21, and the alloy layer is in contact with the electrode bumps 31a. The material of the bonding layer 32 is not limited. For example, a Cu layer may be interposed between the Ni layer and the main surface wirings 21, the Ni layer may not be present, or the alloy layer may not be present.

The sealing resin 4 is a synthetic resin having an electrical insulation property and containing, for example, a black epoxy resin as a main ingredient. As shown in FIG. 2, the sealing resin 4 covers a part of the semiconductor element 31 and the columnar bodies 25. In the present embodiment, the sealing resin 4 overlaps the substrate 1 in plan view and has a rectangular shape in plan view. The material and shape of the sealing resin 4 are not limited. The sealing resin 4 has a resin main surface 41 and a plurality of resin side surfaces 43. The resin main surface 41 and the plurality of resin side surfaces 43 are both exposed in the semiconductor device A10.

The resin main surface 41 faces the same direction as the substrate main surface 11 (thickness direction z). The resin main surface 41 is flat. As shown in FIG. 2, the resin main surface 41 is flush with the top surfaces 251 of the columnar bodies 25 and the element back surface 312 of the semiconductor element 31.

Each of the plurality of resin side surfaces 43 is sandwiched between the resin main surface 41 and the insulating layer 15. Each resin side surface 43 is parallel to the thickness direction z. The sealing resin 4 of the present embodiment has four resin side surfaces 43, and each of the four resin side surfaces 43 faces one of the first direction x and the second direction y. In the present embodiment, each resin side surface 43 has a first resin side surface 431 and a second resin side surface 432 as shown in FIG. 2. The first resin side surface 431 is flat, and one end edge of the first resin side surface 431 in the thickness direction z is connected to the resin main surface 41. The second resin side surface 432 is flat, and one end edge of the second resin side surface 432 in the thickness direction z is connected to the insulating layer 15. The first resin side surface 431 is disposed more inside the semiconductor device A10 than the second resin side surface 432 in plan view. Therefore, each resin side surface 43 has two steps. The second resin side surface 432 is flush with the substrate side surface 13 of the substrate 1. The configuration of the resin side surface 43 is not limited thereto. For example, the first resin side surface 431 may be disposed more outside the semiconductor device A10 than the second resin side surface 432 in plan view. Alternatively, each resin side surface 43 may not have two steps and may be one flat surface.

As shown in FIGS. 1 and 2, the first metal layer 51 covers the element back surface 312 of the semiconductor element 31. Therefore, the semiconductor element 31 overlaps the first metal layer 51 in plan view. The first metal layer 51 is exposed from the sealing resin 4 and is exposed to the outside of the semiconductor device A10. The first metal layer 51 substantially coincides with the electrode pad 26 in the thickness direction z. That is, the first metal layer 51 overlaps each electrode pad 26 when viewed from the direction orthogonal to the thickness direction z. The first metal layer 51 is spaced apart from each of the plurality of electrode pads 26 and is insulated. The thickness of the first metal layer 51 is, for example, about 3 to 15 µm.

For example, as shown in FIG. 3, the first metal layer 51 includes a Ni layer 511, a Pd layer 512 and an Au layer 513 which are stacked one above another. The first metal layer 51 is formed by, for example, electroless plating. That is, the first metal layer 51 of the present embodiment is made of the same material as the electrode pad 26 and is formed by the same forming method. The material and forming method of the first metal layer 51 are not limited. In the first metal layer 51, the Ni layer 511 is in contact with the semiconductor element 31 (element back surface 312), and the Au layer 513 is exposed to the outside. The Pd layer 512 is interposed between the Ni layer 511 and the Au layer 513. The first metal layer 51 may have a structure in which the Ni layer 511 and the Au layer 513 are stacked without including the Pd layer 512. In the present embodiment, as shown in FIG. 3, the end edge of the Ni layer 511 and the plurality of element side surfaces 313 substantially coincide with each other in plan view.

As shown in FIG. 2, the second metal layer 52 is disposed more to the front toward a direction that the element main surface 311 of the semiconductor element 31 faces than the semiconductor element 31 in the thickness direction z. In the present embodiment, the second metal layer 52 is disposed between the semiconductor element 31 (element main surface 311) and the substrate 1 (substrate main surface 11). The second metal layer 52 is separated from the semiconductor element 31 in the thickness direction z. The sealing resin 4 is filled between the second metal layer 52 and the semiconductor element 31. The second metal layer 52 makes contact with the substrate 1 in the exposed region 112 of the substrate main surface 11 of the substrate 1. The second metal layer 52 at least partially overlaps the semiconductor element 31 in plan view. In the example shown in FIG. 1, the second metal layer 52 entirely overlaps the semiconductor element 31. In plan view, the second metal layer 52 is connected to the substrate main surface 11 over a region from one edge of the substrate main surface 11 to the other edge thereof in the second direction y. Furthermore, an upper surface of the second metal layer 52 shown in FIG. 4 is substantially the same as an upper surface of the wiring part 20 shown in FIG. 4 in the thickness direction z. The upper surface of the second metal layer 52 shown in FIG. 4 and the upper surface of the wiring part 20 shown in FIG. 4 may be different in the thickness direction z.

For example, as shown in FIG. 4, the second metal layer 52 includes a base layer 521 and a plating layer 522 which are stacked one above the other. The base layer 521 includes a Ti layer and a Cu layer stacked one above the other and is formed by, for example, a sputtering method. The plating layer 522 is made of Cu and is formed by, for example, electrolytic plating. That is, the second metal layer 52 in the present embodiment is made of the same material as the wiring part 20 and is formed by the same formation method. The material and forming method of the second metal layer 52 are not limited. In the present embodiment, the second metal layer 52 has conductivity and, therefore, is disposed apart from the wiring part 20. The second metal layer 52 may be used as a ground wiring by electrically connecting the portion of the wiring part 20 serving as a ground (reference potential) and the second metal layer 52.

Next, an example of a method of manufacturing the semiconductor device A10 will be described with reference to FIGS. 5 to 19. In these figures, there is shown a cross section in the y-z plane taken along line II-II in FIG. 1. Furthermore, the thickness direction z, the first direction x, and the second direction y of a base 81 (described later) shown in these figures are the same as the directions indicated by the thickness direction z, the first direction x, and the second direction y of the substrate 1 shown in FIGS. 1 to 4.

First, as shown in FIG. 5, the base 81 is provided. The base 81 corresponds to the substrate 1 of the semiconductor device A10. The base 81 is made of a monocrystalline crystal intrinsic semiconductor material. In the present embodiment, the base 81 is a Si single crystal. The base 81 has such a size that a plurality of substrates 1 of the semiconductor device A10 can be obtained. That is, in a subsequent manufacturing step, it is assumed that a plurality of semiconductor devices A10 are manufactured collectively. As shown in FIG. 5, the base 81 has a front surface 811 and a back surface 812 that face opposite sides in the thickness direction z. The front surface 811 is a portion that will become a substrate main surface 11 later.

Figure 7:
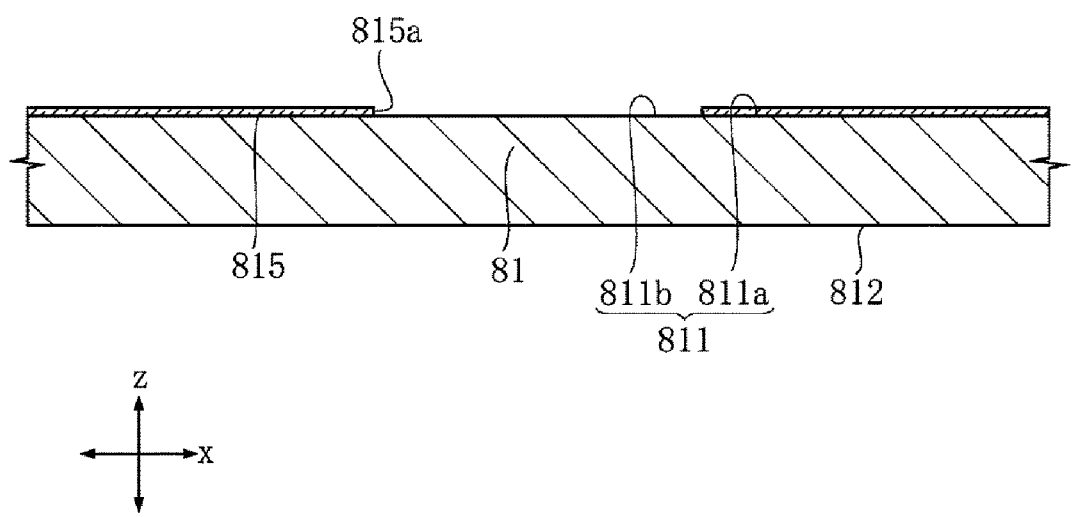
FIG. 7 is a cross-sectional view illustrating a manufacturing step of the semiconductor device shown in FIG. 1.

Next, as shown in FIGS. 5 to 7, an insulating layer 815 is formed. The insulating layer 815 corresponds to the insulating layer 15 of the semiconductor device A10. In the step of forming the insulating layer 815 (the insulating layer forming step), the front surface 811 of the base 81 is thermally oxidized to form the insulating layer 815 over the entire surface 811 as shown in FIG. 5. The thickness of the insulating layer 815 is, for example, about 0.7 to 2.0 μm. Then, as shown in FIG. 6, a resist layer 801 is formed. The resist layer 801 is formed by photolithography. For example, after the resist layer 801 is formed so as to cover the entire surface of the insulating layer 815 by a spin coat method using a spin coater (rotary coating apparatus) or the like, the resist layer 801 is exposed and developed to form a pattern. The resist layer 801 constituting the pattern has an opening 801a. From the opening 801a, a part of the insulating layer 815 is exposed. Then, by removing a part of the insulating layer 815 exposed from the resist layer 801, the insulating layer 815 having the opening 815a is formed as shown in FIG. 7. The partial removal of the insulating layer 815 is performed by, for example, dry etching using a fluorine-based gas. Thus, a region 811a covered with the insulating layer 815 and a region 811b exposed from the insulating layer 815 through the opening 815a are formed on the surface 811 of the base 81. The region 811a covered with the insulating layer 815 corresponds to the covered region 111 of the semiconductor device A10, and the region 811b exposed from the insulating layer 815 corresponds to the exposed region 112 of the semiconductor device A10.

Figure 8:
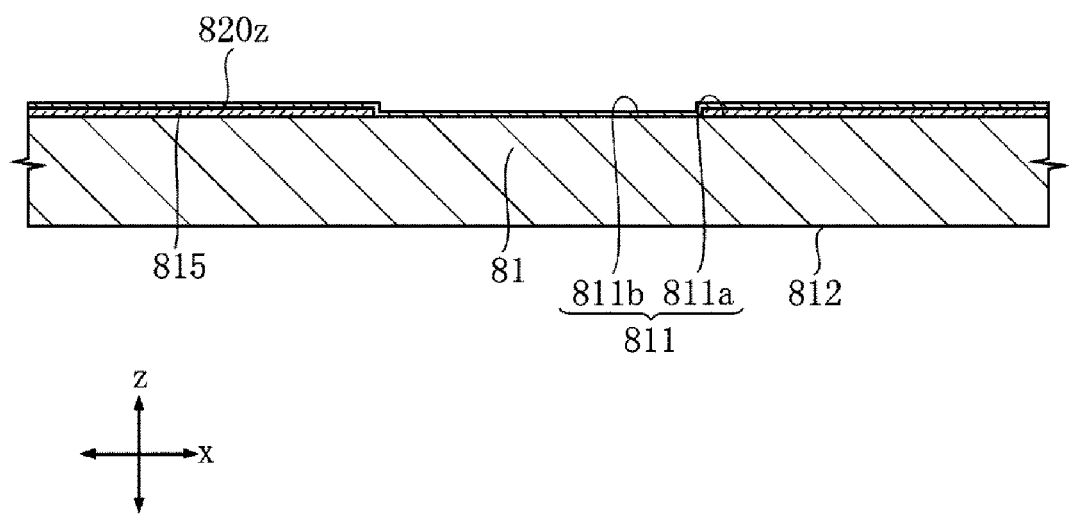
FIG. 8 is a cross-sectional view illustrating a manufacturing step of the semiconductor device shown in FIG. 1.

Next, as shown in FIG. 8, a base layer 820z is formed. A part of the base layer 820z (a base layer 820a to be described later) corresponds to the base layer 201 of the wiring part 20 of the semiconductor device A10, and a part of the base layer 820z (a base layer 852a to be described later) corresponds to the base layer 521 of the second metal layer 52 of the semiconductor device A10. The base layer 820z is formed by a sputtering method. The base layer 820z includes a Ti layer and a Cu layer stacked one above the other, and has a thickness of about 200 to 800 nm. In the step of forming the base layer 820z (base layer forming step), the Cu layer making contact with the Ti layer is formed after the Ti layer making contact with the insulating layer 815 and the base 81 is formed.

Figure 9:
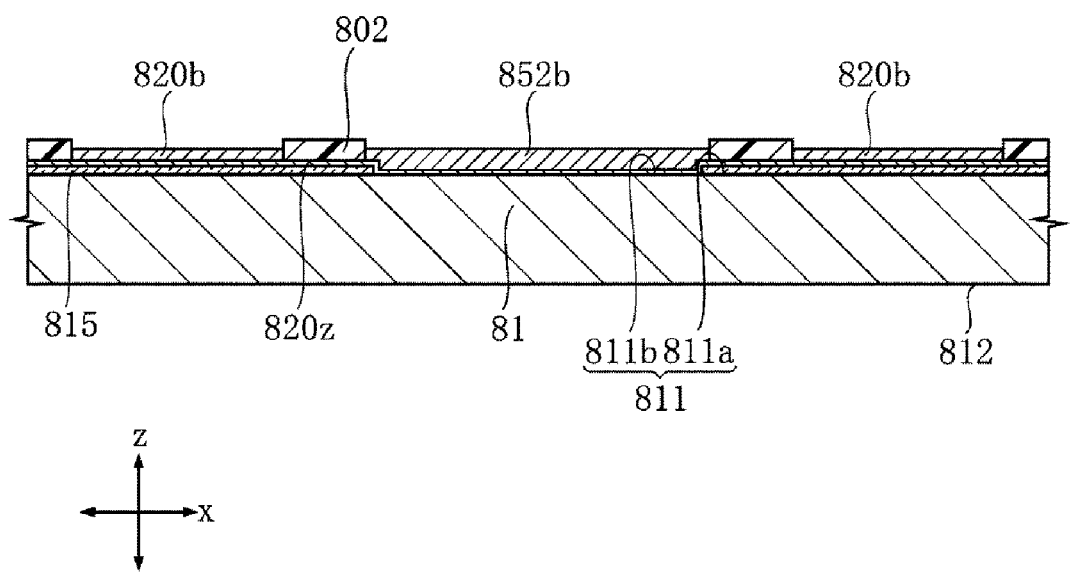
FIG. 9 is a cross-sectional view illustrating a manufacturing step of the semiconductor device shown in FIG. 1.
Figure 10:
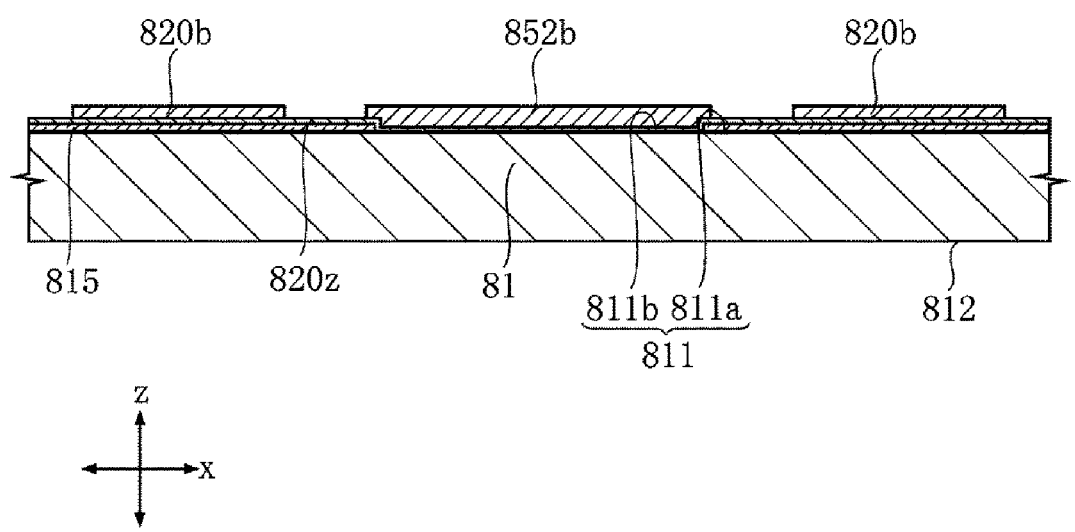
FIG. 10 is a cross-sectional view illustrating a manufacturing step of the semiconductor device shown in FIG. 1.

Next, as shown in FIGS. 9 and 10, plating layers 820b and 852b are formed. The plating layer 820b corresponds to the plating layer 202 of the wiring part 20 of the semiconductor device A10, and the plating layer 852b corresponds to the plating layer 522 of the second metal layer 52 of the semiconductor device A10. In the present embodiment, the plating layer 820b and the plating layer 852b are formed collectively. The plating layers 820b and 852b are both formed by pattern formation using photolithography and electrolytic plating. In the step of forming the plating layers 820b and 852b (plating layer forming step), first, a resist layer 802 for forming the plating layers 820b and 852b shown in FIG. 9 is formed by photolithography. In forming the resist layer 802, a photosensitive resist is applied so as to cover the entire surface of the base layer 820z by a spin coating method. Then, patterning is performed by exposing and developing the photosensitive resist. As a result, as shown in FIG. 9, a resist layer 802 constituting a pattern is formed. Then, plating layers 820b and 852b making contact with the base layer 820z exposed by the resist layer 802 are formed. The plating layers 820b and 852b are made of Cu. The plating layers 820b and 852b are formed by electrolytic plating using the base layer 820z as a conductive path. Thereafter, as shown in FIG. 10, the resist layer 802 is removed.

Figure 11:
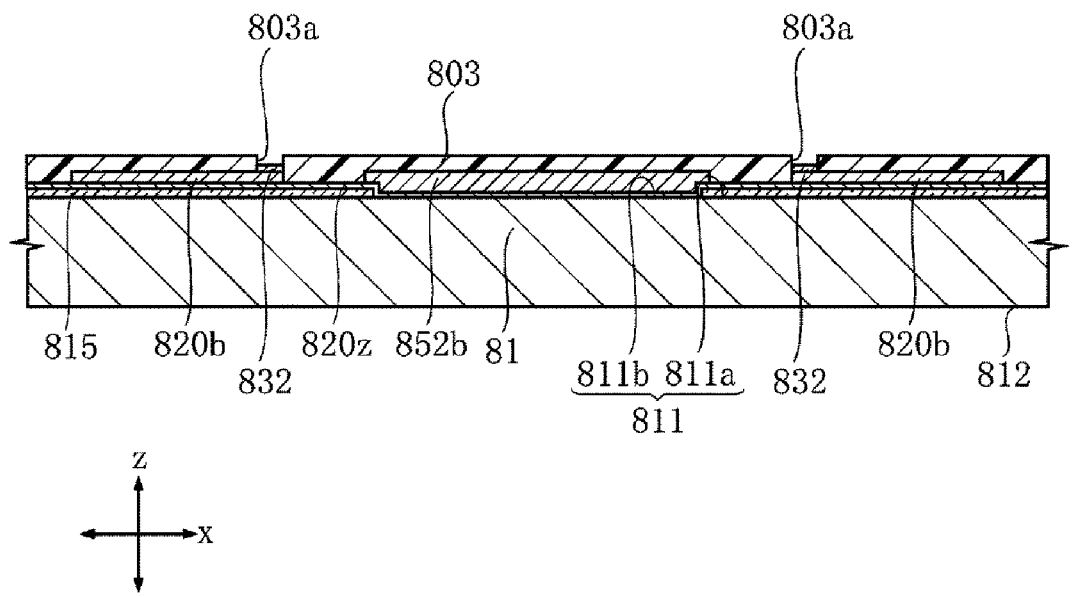
FIG. 11 is a cross-sectional view illustrating a manufacturing step of the semiconductor device shown in FIG. 1.
Figure 12:
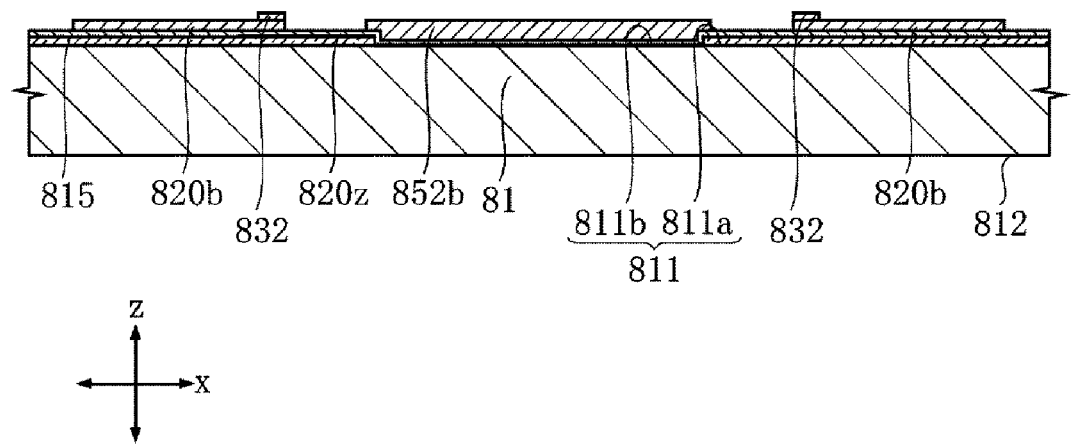
FIG. 12 is a sectional view illustrating a manufacturing step of the semiconductor device shown in FIG. 1

Next, as illustrated in FIGS. 11 and 12, a bonding layer 832 is formed. The bonding layer 832 corresponds to the bonding layer 32 of the semiconductor device A10. The bonding layer 832 is formed by pattern formation using photolithography and electrolytic plating. In the step of forming the bonding layer 832 (bonding layer forming step), first, a resist layer 803 for forming the bonding layer 832 shown in FIG. 11 is formed. The forming method of the resist layer 803 is the same as that of the resist layer 802. The resist layer 803 constituting the pattern has an opening 803a as shown in FIG. 11, and a part of the plating layer 820b is exposed from the opening 803a. The shape of the opening 803a according to the present embodiment is a rectangular parallelepiped shape. Then, the bonding layer 832 making contact with the plating layer 820b exposed from the resist layer 803 is formed. The bonding layer 832 includes a Cu layer, a Ni layer, and a Sn-containing alloy layer stacked one above another. The alloy layer is, for example, a lead-free solder such as a Sn—Ag alloy or a Sn—Sb alloy. The bonding layer 832 is formed so as to fill the opening 803a of the resist layer 803 by electrolytic plating using the base layer 820z and the plating layer 820b as conductive paths. Thereafter, as shown in FIG. 12, the resist layer 803 is removed.

Figure 13:
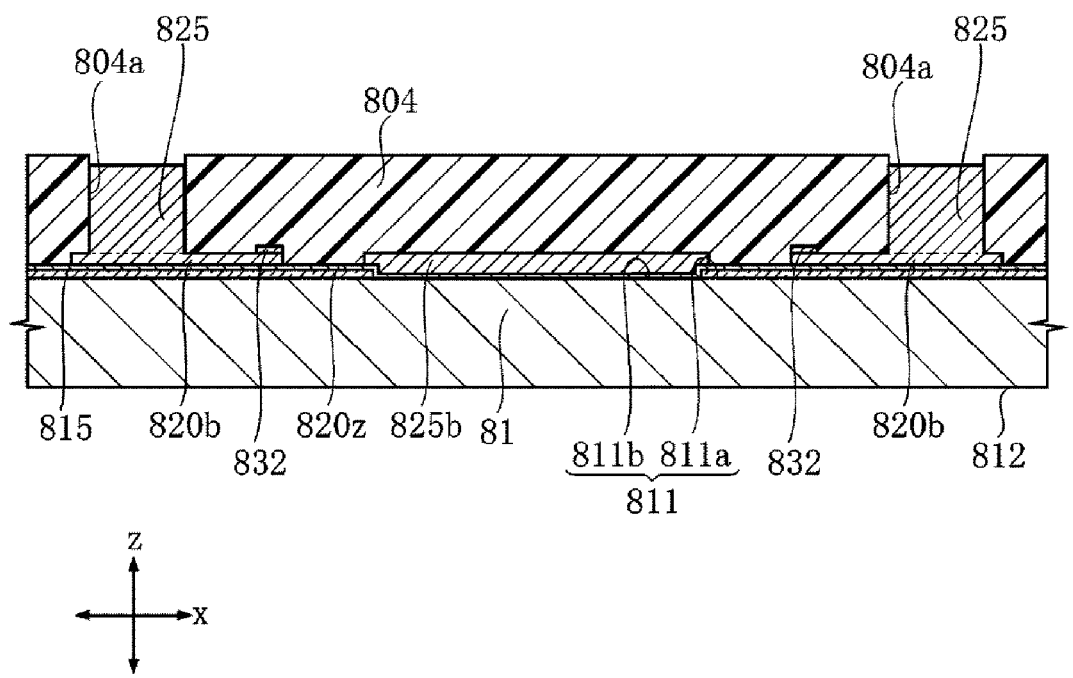
FIG. 13 is a cross-sectional view illustrating a manufacturing step of the semiconductor device shown in FIG. 1.
Figure 14:
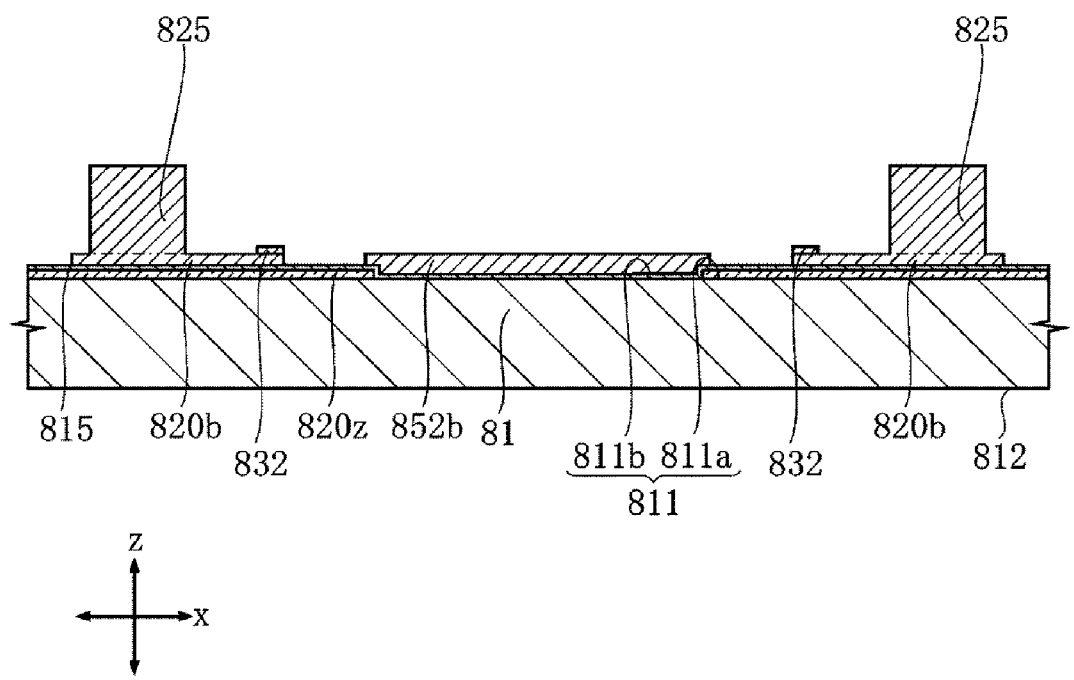
FIG. 14 is a cross-sectional view illustrating a manufacturing step of the semiconductor device shown in FIG. 1.

Next, as shown in FIGS. 13 and 14, columnar bodies 825 are formed. The columnar bodies 825 correspond to the columnar bodies 25 of the semiconductor device A10. The columnar bodies 825 are formed by pattern formation using photolithography and electrolytic plating. In the step of forming the columnar bodies 825 (columnar body forming step), first, a resist layer 804 for forming the columnar bodies 825 shown in FIG. 13 is formed. The resist layer 804 is formed, for example, by attaching a dry film resist suitable for a thick film. The present disclosure is not limited thereto. The resist layer 804 may be formed in the same manner as the resist layer 802 and the resist layer 803. The resist layer 804 constituting the pattern has openings 804a as shown in FIG. 13, and a part of the plating layer 820b is exposed from the openings 804a. The thickness of the resist layer 804 is determined depending on the height of the columnar bodies 825 to be formed. The shape of the openings 804a according to the present embodiment is a rectangular parallelepiped shape. Then, the columnar bodies 825 making contact with the plating layer 820b are formed in the openings 804a of the resist layer 804. The columnar bodies 825 are made of Cu. The columnar bodies 825 are formed so as to fill the openings 804a by electrolytic plating using the base layer 820z and the plating layer 820b as conductive paths. Thereafter, as shown in FIG. 14, the resist layer 804 is removed.

Figure 15:
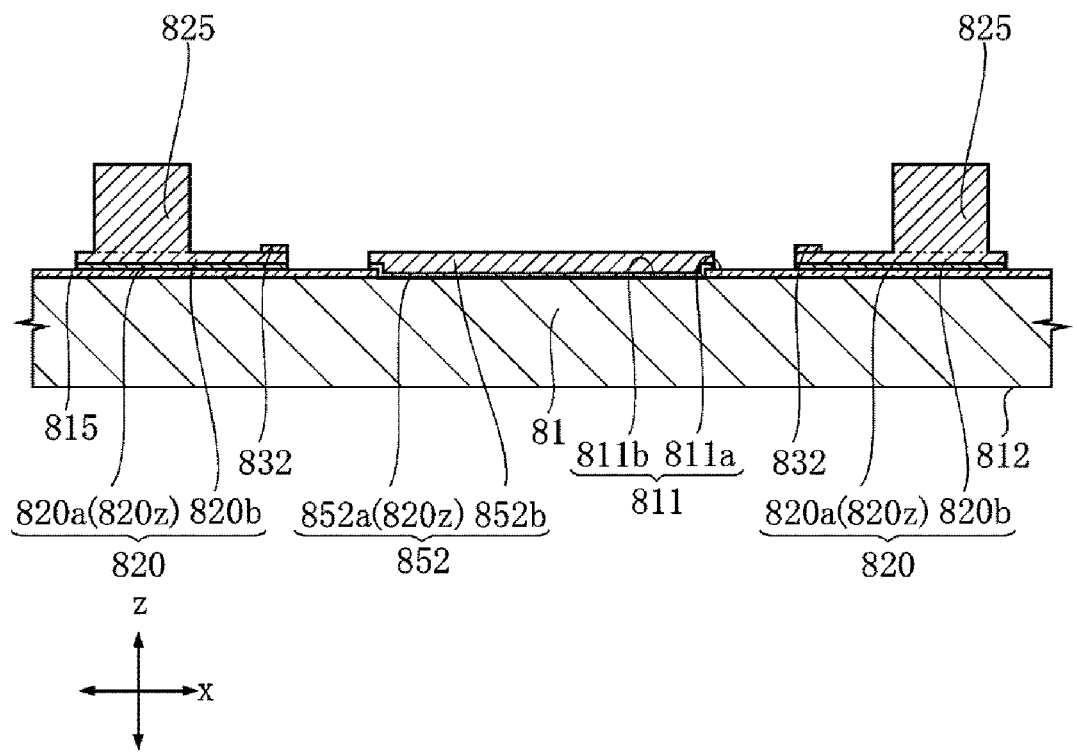
FIG. 15 is a cross-sectional view illustrating a manufacturing step of the semiconductor device shown in FIG. 1.

Next, as shown in FIG. 15, the entire unnecessary base layer 820z not covered with the plating layer 820b on the base 81 is removed. The unnecessary base layer 820z is removed by, for example, wet etching. In the wet etching, for example, a mixed solution of $H_2SO_4$ (sulfuric acid) and $H_2O_2$ (hydrogen peroxide) is used. By the step of removing a part of the base layer 820z (base layer removal step), as shown in FIG. 15, the insulating layer 815 is exposed from the portion from which the base layer 820z is removed. In addition, the base layer 820z is divided into a portion at least partially making contact with the base 81 (a portion located at the center in the left-right direction in FIG. 15) and a portion entirely making contact with the insulating layer 815 (a portion located on the left and right sides in FIG. 15). For ease of understanding, in the base layer 820z, the portion at least partially making contact with the base 81 is referred to as a base layer 852a, and the portion entirely making contact with the insulating layer 815 is referred to as a base layer 820a. Therefore, through this step, a wiring part 820 including the base layer 820a and the plating layer 820b is formed, and a second metal layer 852 including the base layer 852a and the plating layer 852b is formed. That is, the wiring part 820 and the second metal layer 852 are formed collectively. The wiring part 820 corresponds to the wiring part 20 (main surface wiring 21) of the semiconductor device A10, and the second metal layer 852 corresponds to the second metal layer 52 of the semiconductor device A10. From the foregoing, both the step of forming the wiring part 820 (wiring part forming step) and the step of forming the second metal layer 852 (second metal layer forming step) include the base layer forming step, the plating layer forming step, and the base layer removal step.

Figure 16:
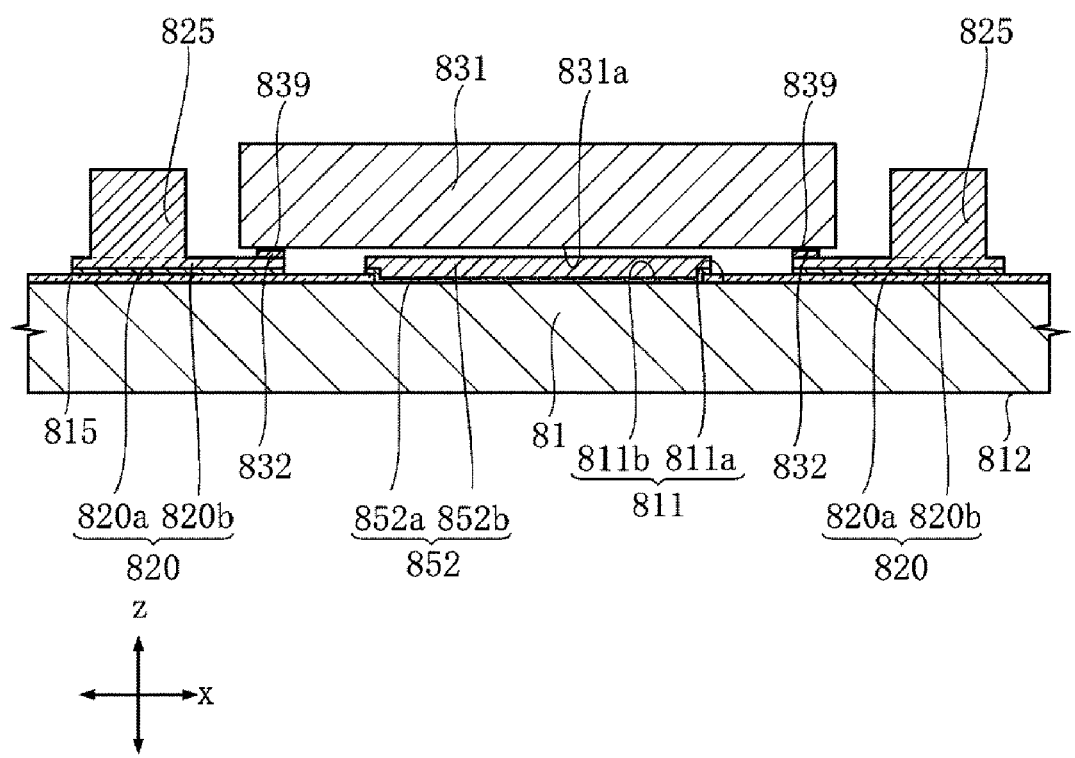
FIG. 16 is a cross-sectional view illustrating a manufacturing step of the semiconductor device shown in FIG. 1.

Next, as shown in FIG. 16, a semiconductor element 831 is mounted on the wiring part 820. The semiconductor element 831 corresponds to the semiconductor element 31 of the semiconductor device A10. The step of mounting the semiconductor element 831 (semiconductor element mounting step) is performed by FCB (Flip Chip Bonding). After flux is applied to the electrode bumps 839 of the semiconductor element 831, the semiconductor element 831 is temporarily attached to the bonding layer 832 by a flip chip bonder with the element main surface 831a facing the base 81. At this time, the bonding layer 832 is sandwiched between the wiring part 820 and the semiconductor element 831. Next, after the bonding layer 832 is melted by reflow, the bonding layer 832 is solidified by cooling, whereby the mounting of the semiconductor element 831 is completed.

Figure 17:
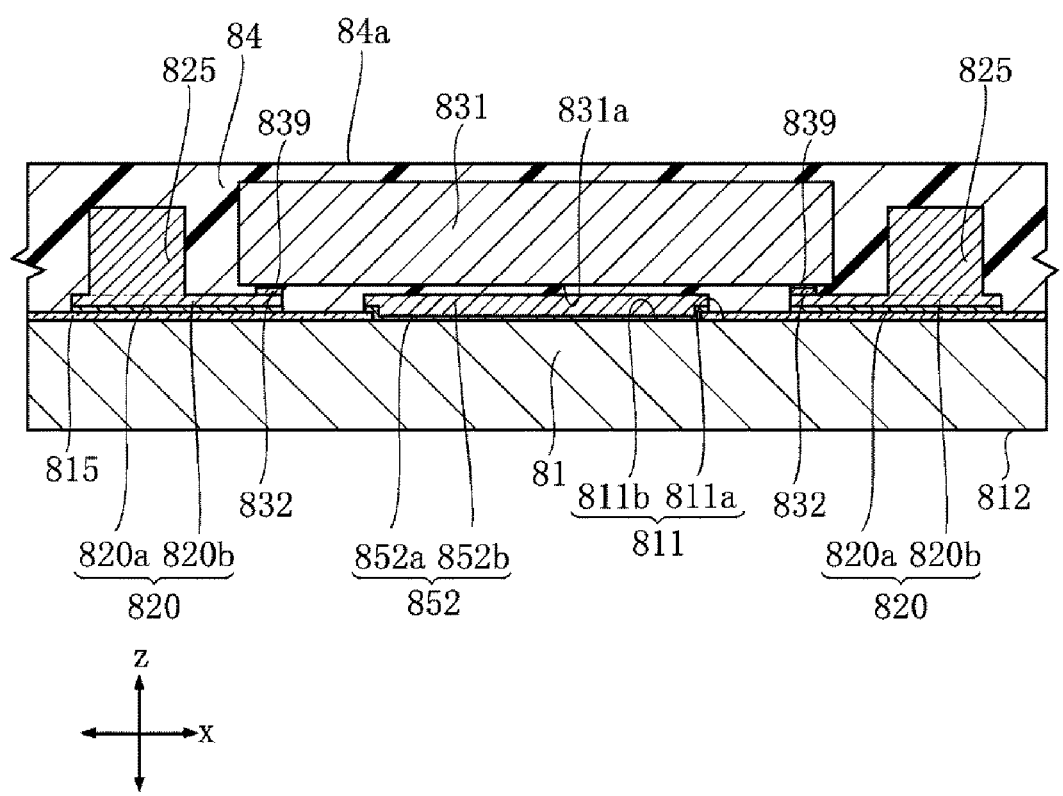
FIG. 17 is a cross-sectional view illustrating a manufacturing step of the semiconductor device shown in FIG. 1.

Next, as shown in FIG. 17, a sealing resin 84 that covers the semiconductor element 831 is formed. The sealing resin 84 corresponds to the sealing resin 4 of the semiconductor device A10. The sealing resin 84 according to the present embodiment is a synthetic resin having an electrical insulation property and mainly constituted by, for example, a black epoxy resin. In the step of forming the sealing resin 84 (sealing resin forming step), the sealing resin 84 is formed so as to cover the semiconductor element 831, the wiring part 820, and the columnar bodies 825 without exposing them. Therefore, the surface 84a of the sealing resin 84 is located above the semiconductor element 831 and the columnar bodies 825 in the thickness direction z in FIG. 17.

Figure 18:
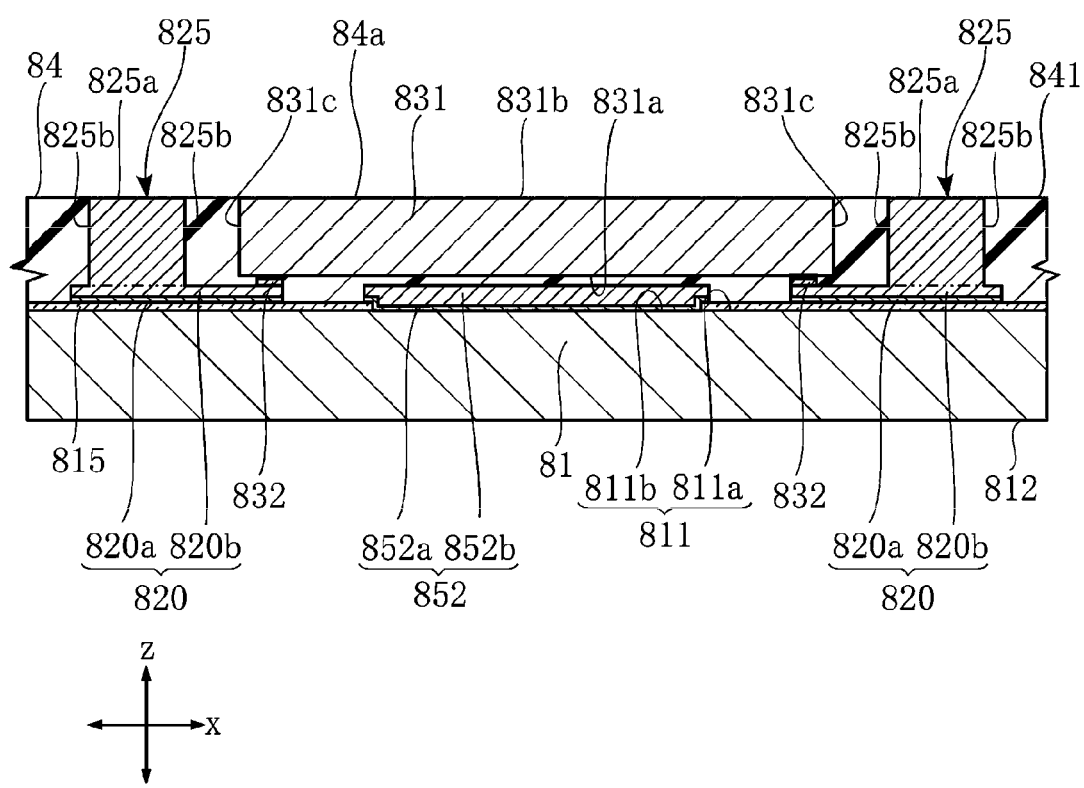
FIG. 18 is a cross-sectional view illustrating a manufacturing step of the semiconductor device shown in FIG. 1.

Next, as shown in FIG. 18, the columnar bodies 825 and the semiconductor element 831 are exposed from the sealing resin 84. The step of exposing the columnar bodies 825 (columnar body exposing step) and the step of exposing the semiconductor element 831 (semiconductor element exposing step) are collectively performed by, for example, mechanical grinding. In the columnar body exposing step and the semiconductor element exposing step, the columnar bodies 825 and the semiconductor element 831 are exposed from the sealing resin 84 by grinding the sealing resin 84 from the side of the surface 84a by mechanical grinding. Thus, an element back surface 831b of the semiconductor element 831 and exposed surfaces 825a of the columnar bodies 825, which are respectively exposed from the sealing resin 84, are formed. Furthermore, a resin main surface 841 of the sealing resin 84 is formed. The element back surface 831b of the semiconductor element 831, the exposed surfaces 825a of the columnar bodies 825, and the resin main surface 841 of the sealing resin 84 are all flat and flush with each other. The element back surface 831b of the semiconductor element 831 corresponds to the element back surface 312 of the semiconductor element 31 of the semiconductor device A10, the exposed surfaces 825a of the columnar bodies 825 correspond to the top surfaces 251 of the columnar bodies 25 of the semiconductor device A10, and the resin main surface 841 of the sealing resin 84 corresponds to the resin main surface 41 of the semiconductor device A10.

Figure 19:
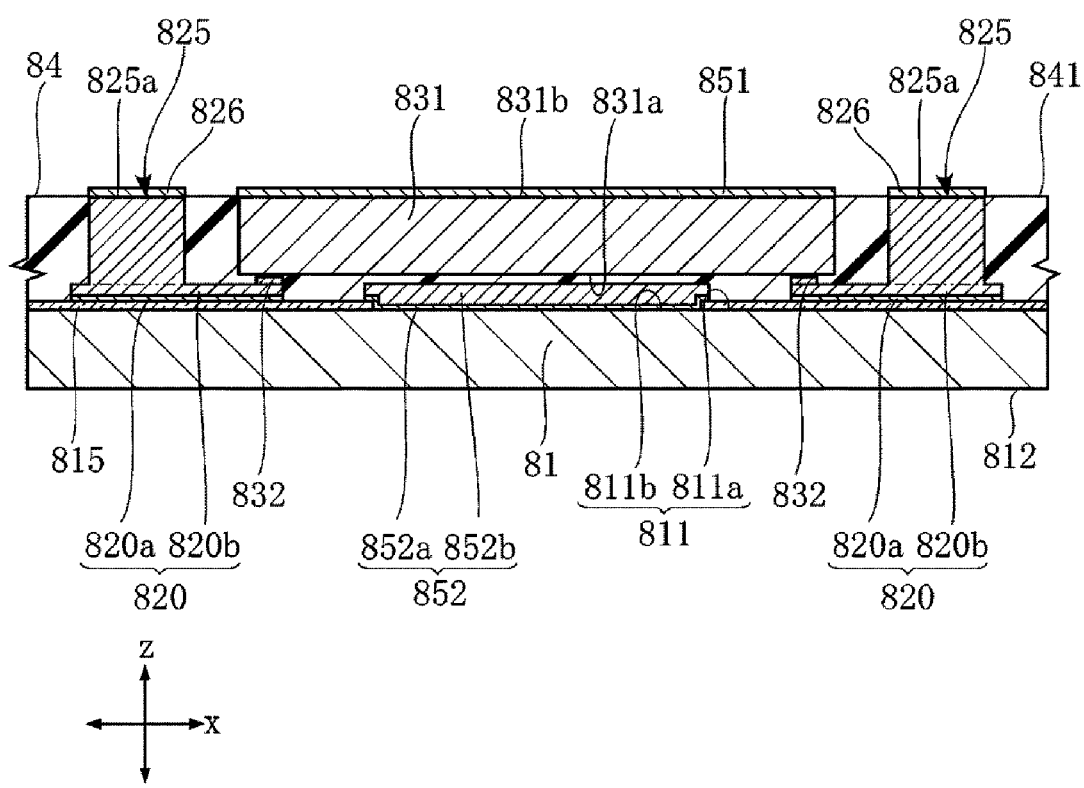
FIG. 19 is a cross-sectional view illustrating a manufacturing step of the semiconductor device shown in FIG. 1

Next, as shown in FIG. 19, electrode pads 826 and a first metal layer 851 are formed. The electrode pads 826 correspond to the electrode pads 26 of the semiconductor device A10, and the first metal layer 851 corresponds to the first metal layer 51 of the semiconductor device A10. In the present embodiment, the step of forming the electrode pads 826 (electrode pad forming step) and the step of forming the first metal layer 851 (first metal layer forming step) are collectively performed by electroless plating. In the present embodiment, a Ni layer, a Pd layer and an Au layer are deposited in the named order by electroless plating. At this time, the Ni layer is formed so as to make contact with and cover the element back surface 831b of the semiconductor element 831. The Pd layer is formed on the Ni layer, and the Au layer is formed on the Pd layer, whereby a first metal layer 851 is formed. Furthermore, the Ni layer is formed so as to make contact with and cover the exposed surfaces 825a of the columnar bodies 825. The Pd layer is formed on the Ni layer, and the Au layer is formed on the Pd layer, whereby electrode pads 26 are formed. In the present embodiment, the electrode pads 826 and the first metal layer 851 are formed simultaneously. Both electrode pads 826 and first metal layer 851 have a thickness of, for example, about 3 to 15 µm. In forming the electrode pads 826 and the first metal layer 851, it is assumed that they are formed at the same time even if a formation speed and a formation degree thereof are slightly different. As described above, the element back surface 831b, the exposed surface 825a, and the resin main surface 841 are flush with each other. Therefore, the electrode pads 826 and the first metal layer 851 coincide with each other in the thickness direction z.

Next, a part of the base 81 is ground by, for example, mechanical grinding from the side of the back surface 812 of the base 81 shown in FIG. 19. In addition, the step of grinding the base 81 may be performed as needed. Thereafter, the base 81 and the sealing resin 84 are cut along the first direction x, and the base 81 and the sealing resin 84 are cut along the second direction y, whereby the base 81 and the sealing resin 84 are divided into individual pieces for each range corresponding to the substrate 1 of the semiconductor device A10. In cutting, the base 81 and the sealing resin 84 are cut by, for example, blade dicing. In the present embodiment, the sealing resin 84 is cut from the side of the resin main surface 841 by a step cut. Thus, as shown in FIG. 2, a first resin side surface 431 and a second resin side surface 432 are formed on the resin side surface 43. Each of the individual pieces divided in this step becomes the semiconductor device A10. The semiconductor device A10 is manufactured through the above steps.

Next, the operations and effects of the semiconductor device A10 and the manufacturing method thereof will be described.

The semiconductor device A10 includes the first metal layer 51. The first metal layer 51 is in contact with the semiconductor element 31 (element back surface 312) and is exposed to the outside. With this configuration, the heat generated from the semiconductor element 31 when the semiconductor device A10 is energized is released to the outside through the first metal layer 51. Therefore, according to the semiconductor device A10, the heat generated from the semiconductor element 31 can be efficiently released to the outside. Furthermore, since the first metal layer 51 covers the semiconductor element 31 (element back surface 312), the semiconductor device A10 has a configuration in which the semiconductor element 31 is not exposed to the ambient air.

The semiconductor device A10 further includes the second metal layer 52. The second metal layer 52 is disposed between the semiconductor element 31 (element main surface 311) and the substrate 1 (substrate main surface 11) in the thickness direction z. With this configuration, the heat generated from the semiconductor element 31 when the semiconductor device A10 is energized is released to the outside through the second metal layer 52 and the substrate 1. Therefore, according to the semiconductor device A10, the heat generated from the semiconductor element 31 can be radiated from the side of the element back surface 312 by the first metal layer 51 and can also be radiated from the side of the element main surface 311 by the second metal layer 52. That is, the heat of the semiconductor element 31 can be more efficiently released to the outside.

In the semiconductor device A10, the substrate main surface 11 of the substrate 1 includes the exposed region 112 exposed from the insulating layer 15, and the second metal layer 52 makes contact with the substrate 1 in at least a part of the exposed region 112 (in the entirety of the exposed region 112 in the present embodiment). By adopting such a configuration, the heat is easily transferred from the second metal layer 52 to the substrate 1 compared to a case where the insulating layer 15 is interposed between the second metal layer 52 and the substrate 1. Therefore, it is possible to improve heat dissipation of the semiconductor device A10.

In the semiconductor device A10, the top surfaces 251 of the columnar bodies 25, the resin main surface 41, and the element back surface 312 are flush with each other. By adopting such a configuration, it is possible to reduce the dimension of the semiconductor device A10 in the thickness direction z and to reduce the height of the device. Furthermore, since the electrode pad forming step and the first metal layer forming step can be performed collectively by electroless plating, it is possible to simultaneously form the electrode pads 26 (826) and the first metal layer 51 (851).

In the semiconductor device A10, the wiring part 20 and the second metal layer 52 are made of the same material. By adopting such a configuration, the wiring layer 20 (820) and the second metal layer 52 (852) are formed by performing the base layer forming step using the sputtering, the plating layer forming step using the electrolytic plating, and the base layer removal step for removing an unnecessary base layer. That is, since the wiring part forming step and the second metal layer forming step can be performed collectively, it is possible to simultaneously form the wiring part 20 (820) and the second metal layer 52 (852).

In the first embodiment, the case where the semiconductor device A10 includes the substrate 1 has been described. However, the semiconductor device A10 may not include the substrate 1. For example, in the above-described manufacturing process, in the step of grinding the base 81 from the back surface 812, a semiconductor device that does not include the substrate 1 can be manufactured by grinding the entire base 81 as well as a part of the base 81 in the step of grinding the base 81 from the back surface 812. At the same time, the insulating layer 815 may also be ground to expose the wiring part 820 (20). However, since the exposed wiring part 20 may cause an unintended short circuit, the insulating layer 815 may be left in some embodiments. The exposed wiring part 20 may be covered with an insulating film different from the insulating layer 815.

Second Embodiment

A semiconductor device A20 according to a second embodiment will be described with reference to FIGS. 20 and 21. In these figures, the same or similar elements as those of the semiconductor device A10 described above are denoted by like reference numerals, and a redundant description thereof is omitted.

Figure 20:
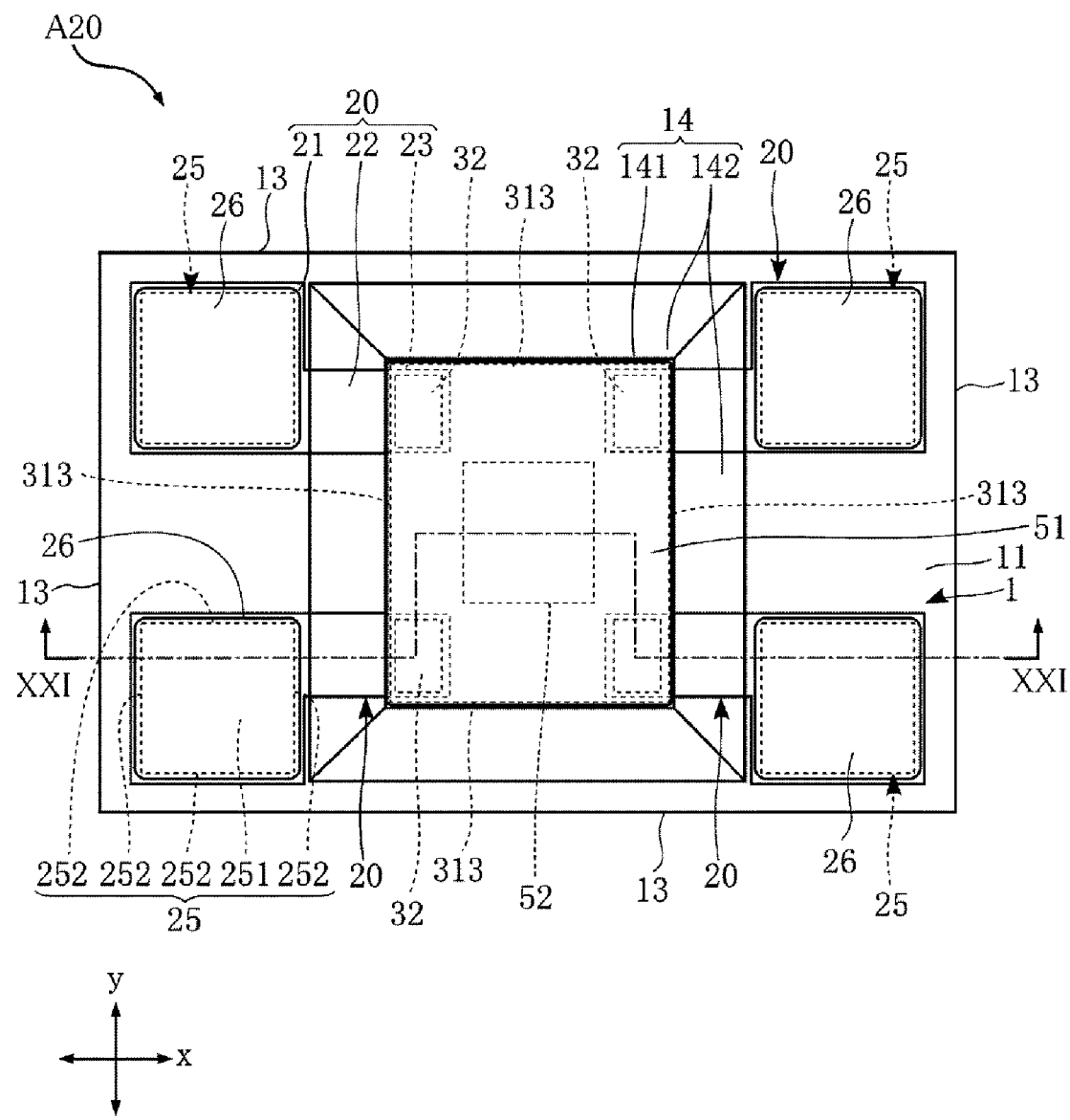
FIG. 20 is a plan view of a semiconductor device according to a second embodiment of the present disclosure.

FIG. 20 is a plan view of the semiconductor device A20. For convenience of understanding, the sealing resin 4 and the insulating layer 15 are omitted. FIG. 21 is a cross-sectional view taken along line XXI-XXI in FIG. 20. Although FIG. 21 shows a case where each resin side surface 43 is a single flat surface, the resin side surface 43 may have two steps as in the first embodiment. The semiconductor device A20 according to the present embodiment is different from the semiconductor device A10 in that a recess 14 is formed in the substrate 1.

The substrate 1 according to the present embodiment includes a substrate main surface 11, a substrate back surface 12, a plurality of substrate side surfaces 13, and a recess 14. In the present embodiment, a (100) plane in which the crystal orientation of the substrate 1 is (100) is adopted as the substrate main surface 11. Moreover, the substrate main surface 11 has a frame shape so as to surround the recess 14 in plan view as shown in FIG. 1.

The recess 14 is formed to be depressed from the substrate main surface 11. The recess 14 does not penetrate the substrate 1 in the thickness direction z of the substrate 1. In the present embodiment, the recess 14 has a rectangular shape in plan view. In the present embodiment, as shown in FIG. 21, a semiconductor element 31 is disposed so that a part thereof is accommodated in the recess 14. The recess 14 has a bottom surface 141 and a plurality of connection surfaces 142.

The bottom surface 141 is a surface on which the semiconductor element 31 is mounted. The bottom surface 141 is orthogonal to the thickness direction z of the substrate 1, and the shape of the bottom surface 141 is rectangular in plan view. The bottom surface 141 is flat. In the present embodiment, the bottom surface 141 corresponds to the "mounting surface" of the present disclosure.

Figure 21:
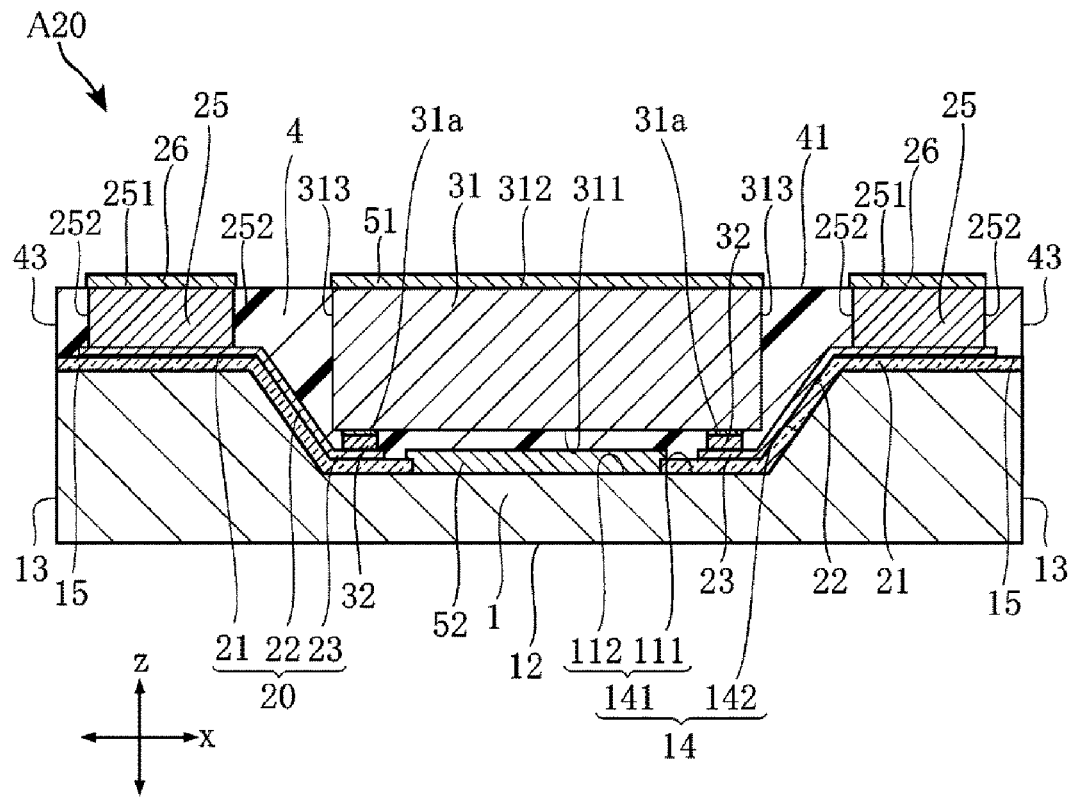
FIG. 21 is a cross-sectional view taken along line XXI-XXI in FIG. 20.

Each of the connection surfaces 142 is a surface connected to the substrate main surface 11 and the bottom surface 141 as shown in FIGS. 20 and 21. In the thickness direction z of the substrate 1, the upper end of each connection surface 142 shown in FIG. 21 is connected to the substrate main surface 11, and the lower end of each connection surface 142 shown in FIG. 21 is connected to the bottom surface 141. Each connection surface 142 is inclined with respect to the bottom surface 141. In the present embodiment, the recess 14 has four connection surfaces 142. The connection surfaces 142 are formed along the four sides of the bottom surface 141. In the present embodiment, all the connection surfaces 142 are constituted by the (111) plane because the substrate main surface 11 is the (100) plane. Accordingly, inclination angles of the connection surfaces 142 with respect to the bottom surface 141 are all the same and are about 55 degrees (for example, 54.7 degrees). In the present embodiment, the recess 14 is formed by anisotropic etching.

The wiring part 20 according to the present embodiment includes a plurality of main surface wirings 21, a plurality of connection surface wirings 22, and a plurality of bottom surface wirings 23.

Each of the main surface wirings 21 is a part of the wiring part 20 formed on the substrate main surface 11 of the substrate 1. Each main surface wiring 21 is connected to each connection surface wiring 22 at an intersection line between the substrate main surface 11 and each connection surface 142 extending along the second direction y. Each main surface wiring 21 extends from the intersection line along the first direction x. Each main surface wiring 21 is connected to each columnar body 25.

Each of the connection surface wirings 22 is a part of the wiring part 20 formed on each connection surface 142 of the substrate 1. Each connection surface wiring 22 is formed on one of a pair of connection surfaces 142 spaced apart in the first direction x, and is rectangular in plan view. In the present embodiment, each connection surface wiring 22 is formed to be parallel to the first direction x. Furthermore, in the thickness direction z of the substrate 1, the upper end of each connection surface wiring 22 shown in FIG. 21 is connected to each main surface wiring 21, and the lower end of each connection surface wiring 22 shown in FIG. 21 is connected to each bottom surface wiring 23.

Each of the bottom surface wirings 23 is a part of the wiring part 20 formed on the bottom surface 141 of the substrate 1. In the present embodiment, each bottom surface wiring 23 is connected to each connection surface wiring 22 at the intersection line between the bottom surface 141 and each connection surface 142 extending along the second direction y. Each bottom surface wiring 23 extends from the intersection line toward the inside of the bottom surface 141. As shown in FIG. 21, a semiconductor element 31 is conductively bonded to each bottom surface wiring 23 via each bonding layer 32.

Next, an example of a method of manufacturing the semiconductor device A20 will be described with reference to FIGS. 22 to 27. A description of the parts common to the method of manufacturing the semiconductor device A10 according to the first embodiment will be omitted. These figures are cross-sectional views showing a manufacturing process of the semiconductor device A20, and show a cross section in the y-z plane taken along line XXI-XXI in FIG. 20.

Figure 22:
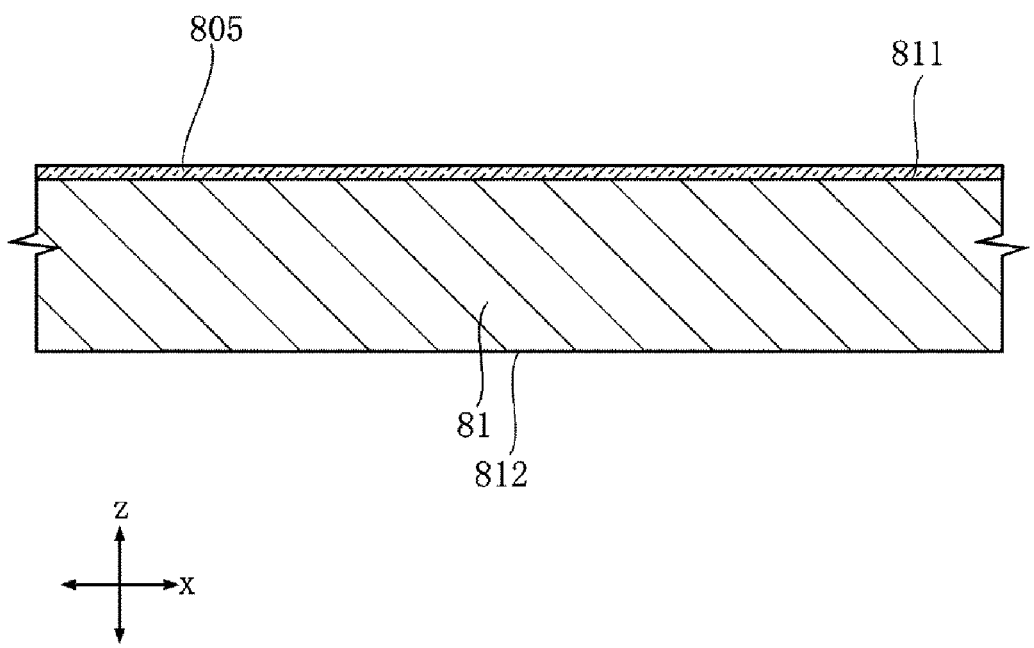
FIG. 22 is a cross-sectional view illustrating a manufacturing step of the semiconductor device shown in FIG. 20.
Figure 23:
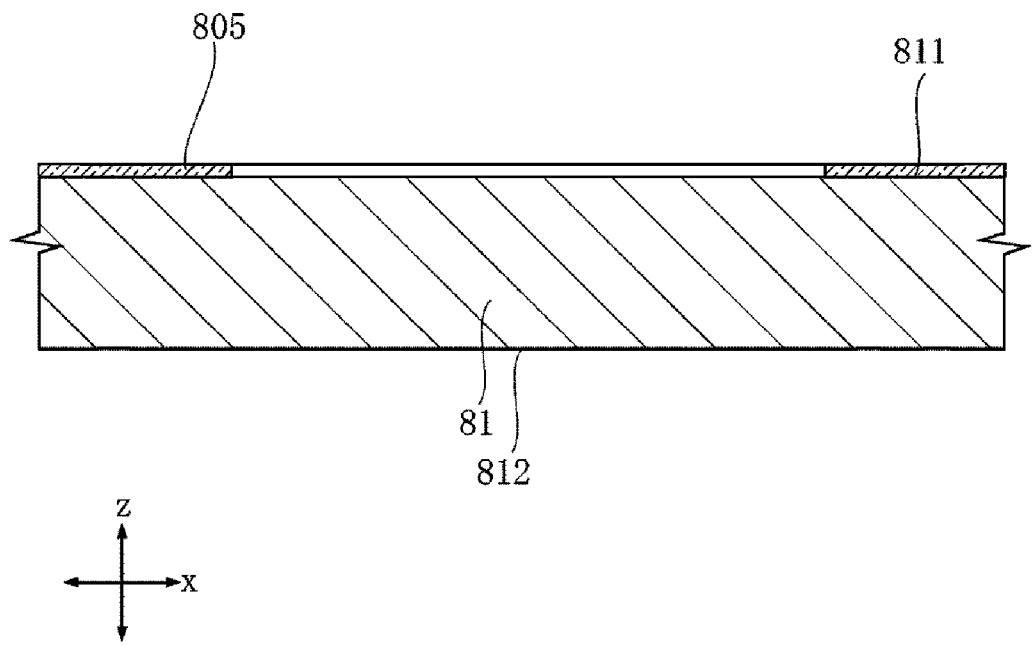
FIG. 23 is a cross-sectional view illustrating a manufacturing step of the semiconductor device shown in FIG. 20.
Figure 24:
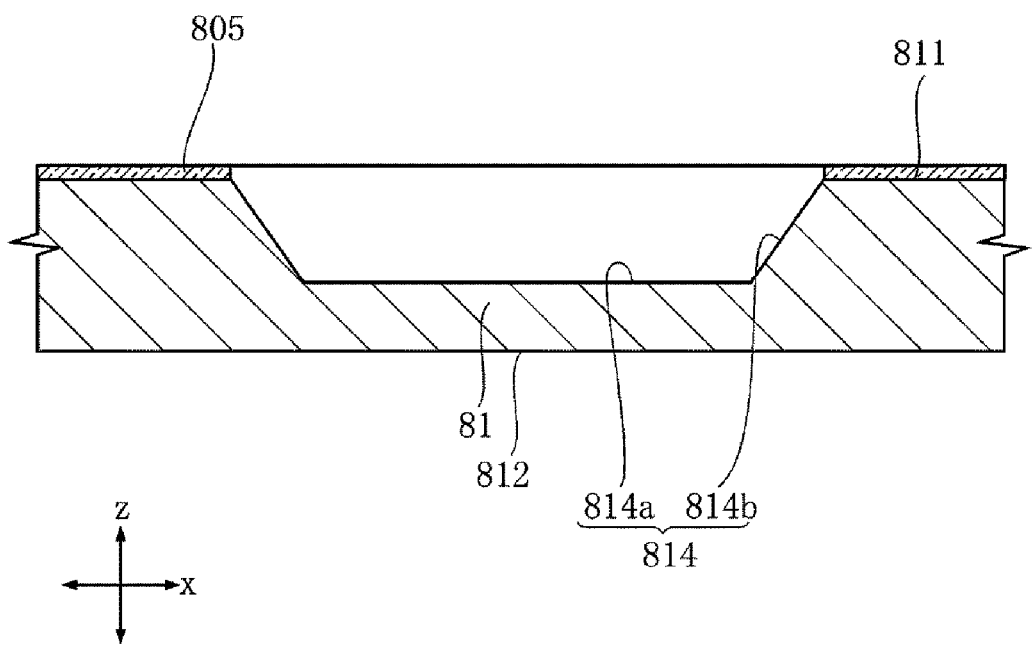
FIG. 24 is a cross-sectional view illustrating a manufacturing step of the semiconductor device shown in FIG. 20.

First, as shown in FIGS. 22 to 24, a base 81 is provided, and a recess 814 is formed in the base 81. The recess 814 corresponds to the recess 14 of the semiconductor device A20. Specifically, as shown in FIG. 22, the base 81 is provided as in the first embodiment. In addition, the base 81 according to the present embodiment adopts a (100) plane having a crystal orientation of (100) as a front surface 811.

Next, as shown in FIG. 22, the front surface 811 is thermally oxidized to form a mask layer 805 made of $SiO_2$. At this point, the mask layer 805 covers the entire front surface 811. The thickness of the mask layer 805 is, for example, about 0.7 to 2.0 μm.

Next, as shown in FIG. 23, the mask layer 805 is patterned by etching. Specifically, a resist is formed on the mask layer 805 by photolithography. The mask layer 805 is etched, and then the resist is peeled off. Thus, an opening is formed in the mask layer 805. The shape and size of the opening are set according to the shape and size of the recess 814 to be finally obtained. In the present embodiment, the opening is rectangular.

Next, as shown in FIG. 24, the recess 814 is formed in the base 81. In the step of forming the recess 814 (recess formation step), for example, anisotropic etching using KOH is performed. KOH is an example of an alkaline etching solution that can realize good anisotropic etching for a Si single crystal. By performing such anisotropic etching, a recess 814 having a bottom surface 814a and a connection surface 814b shown in FIG. 24 is formed. In the present embodiment, the (100) plane is adopted as the front surface 811. Therefore, each connection surface 814b is a (111) plane, and an angle formed by the connection surface 814b with respect to the front surface 811 (x-y plane) is about 55 degrees (e.g., 54.7 degrees). In the present embodiment, a depth (dimension in the thickness direction z) of the recess 814 is about 50 to 80 µm. The etching solution is not limited to KOH, and may be an alkaline solution such as TMAH (tetramethyl ammonium hydroxide) or EDP (ethylene diamine pyrocatechol). Alternatively, an isotropic etching may be performed by using a hydrofluoric acid (HF/HNO$_3$ mixed acid) solution as an etching solution.

Next, the mask layer 805 is removed. The removal of the mask layer 805 is performed by etching through the use of, for example, HF. Through the recess forming step described above, the recess 814 is formed in each opening formed in the mask layer 805.

Figure 25:
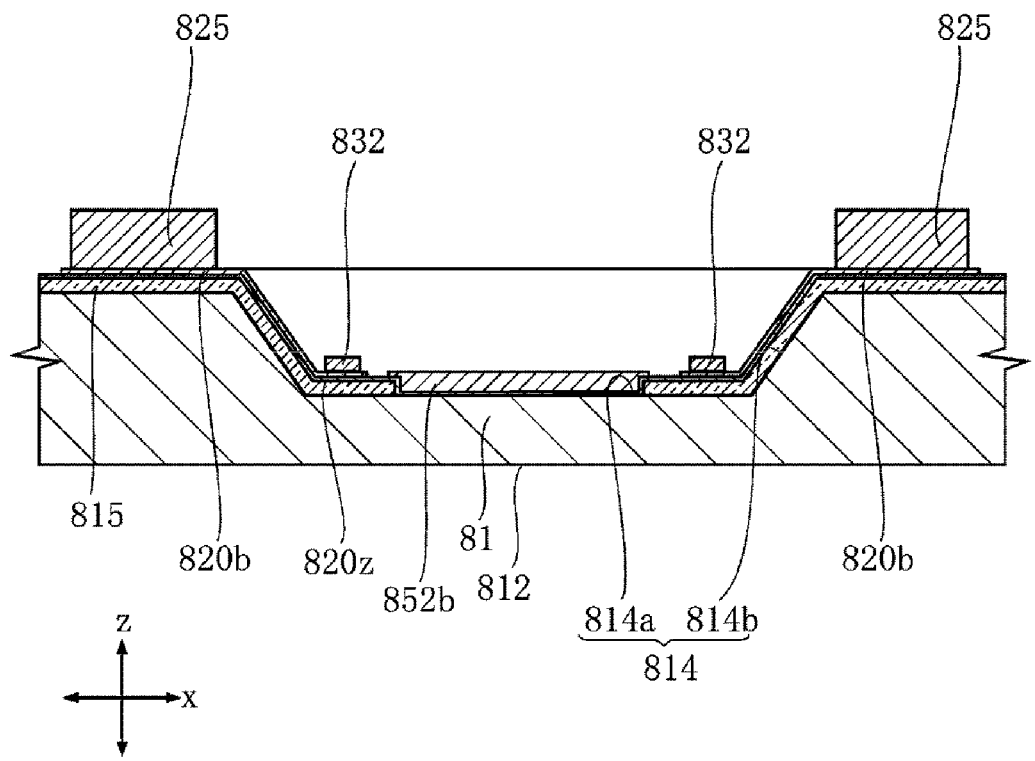
FIG. 25 is a cross-sectional view illustrating a manufacturing step of the semiconductor device shown in FIG. 20.

Next, as shown in FIG. 25, an insulating layer 815, a base layer 820z, plating layers 820b and 852b, a bonding layer 832, and columnar bodies 825 are formed. These steps are performed in the same manner as the insulating layer forming step, the base layer forming step, the plating layer forming step, the bonding layer forming step, and the columnar body forming step according to the first embodiment. However, in the present embodiment, a spray coating method or an electro-deposition method is used instead of the above-described spin coating method when forming the resist layer 802 in the plating layer forming step and when forming the resist layer 803 in the bonding layer forming step. The spin coating method may be used as in the first embodiment. Moreover, the formation order of the steps is the same as that of the first embodiment.

Figure 26:
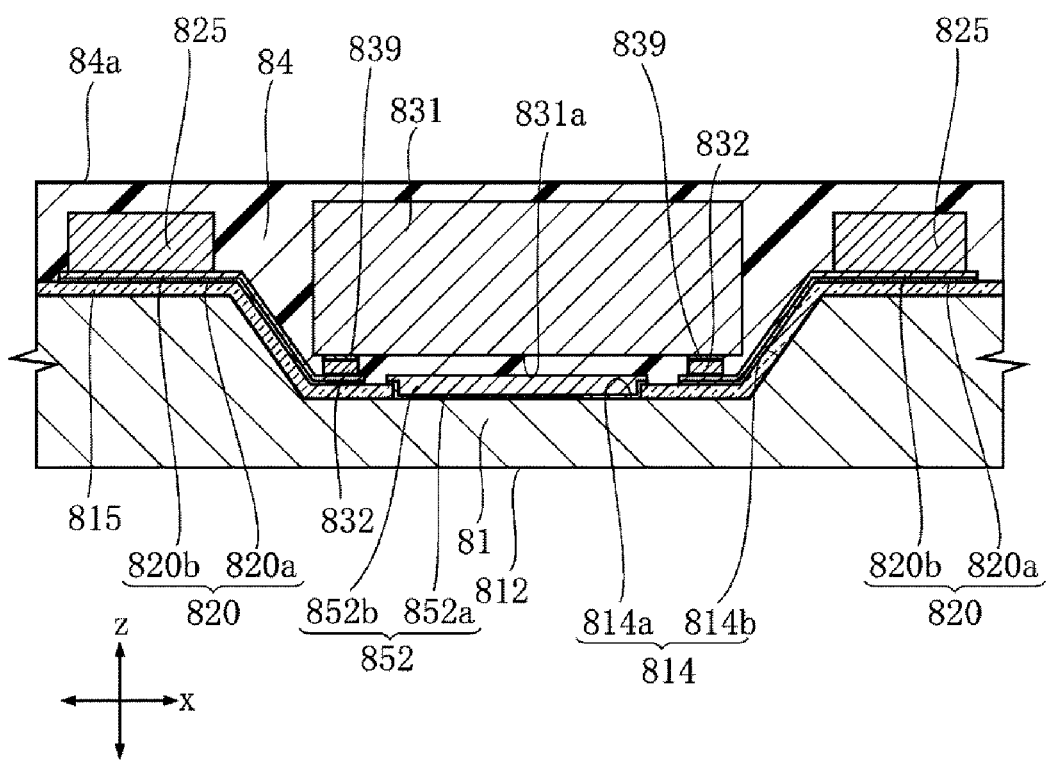
FIG. 26 is a cross-sectional view illustrating a manufacturing step of the semiconductor device shown in FIG. 20.

Next, as shown in FIG. 26, after removing the unnecessary base layer 820z not covered with the plating layers 820b and 852b, a semiconductor element 831 is mounted on the substrate 81, and a sealing resin 84 is formed. These steps are performed in the same manner as the base layer removal step, the semiconductor element mounting step, and the sealing resin forming step according to the first embodiment. However, in the semiconductor element mounting step according to the present embodiment, the semiconductor element 831 is mounted on the bottom surface 814a of the recess 814 so that a part of the semiconductor element 831 is accommodated in the recess 814.

Figure 27:
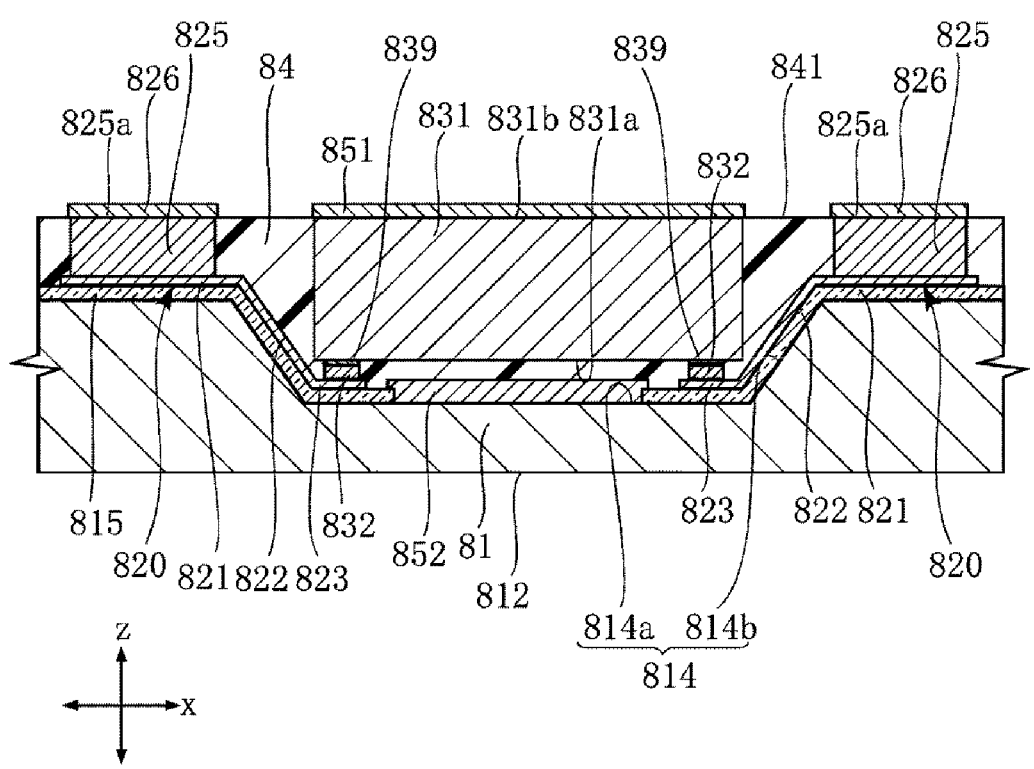
FIG. 27 is a cross-sectional view illustrating a manufacturing step of the semiconductor device shown in FIG. 20.

Next, as shown in FIG. 27, the columnar bodies 825 and the semiconductor element 831 are exposed from the sealing resin 84, and then the electrode pads 826 and the first metal layer 851 are formed. In addition, the formation of the electrode pads 826 and the first metal layer 851 is performed in the same manner as the columnar body exposing step, the semiconductor element exposing step, the electrode pad forming step, and the first metal layer forming step according to the first embodiment. In FIG. 27, the base layer 820a and the plating layer 820b are described as a wiring part 820, and the base layer 852a and the plating layer 852b are described as a second metal layer 852.

Next, as in the first embodiment, the base 81 is ground from the side of the back surface 812 as necessary. Thereafter, the base 81 and the sealing resin 84 are cut along the first direction x and the second direction y by blade dicing, thereby dividing the base 81 and the sealing resin 84 into individual pieces corresponding to the substrate 1 of the semiconductor device A20. The semiconductor device A20 is manufactured through the above steps.

Next, the operations and effects of the semiconductor device A20 and the manufacturing method thereof will be described.

According to the present embodiment, the semiconductor device A20 includes the first metal layer 51 like the semiconductor device A10. Therefore, the heat generated from the semiconductor element 31 can be released to the outside from the side of the element back surface 312. That is, the present embodiment has the same effects as those of the first embodiment.

According to the present embodiment, the semiconductor device A20 includes the second metal layer 52 like the semiconductor device A10. Therefore, the heat generated from the semiconductor element 31 may be radiated not only from the side of the element back surface 312 by the first metal layer 51 but also from the side of the element main surface 311 by the second metal layer 52. That is, the present embodiment has the same effects as those the first embodiment.

In addition, in the present embodiment, the same configuration as that of the first embodiment has the same effects as those of the first embodiment.

Figure 28:
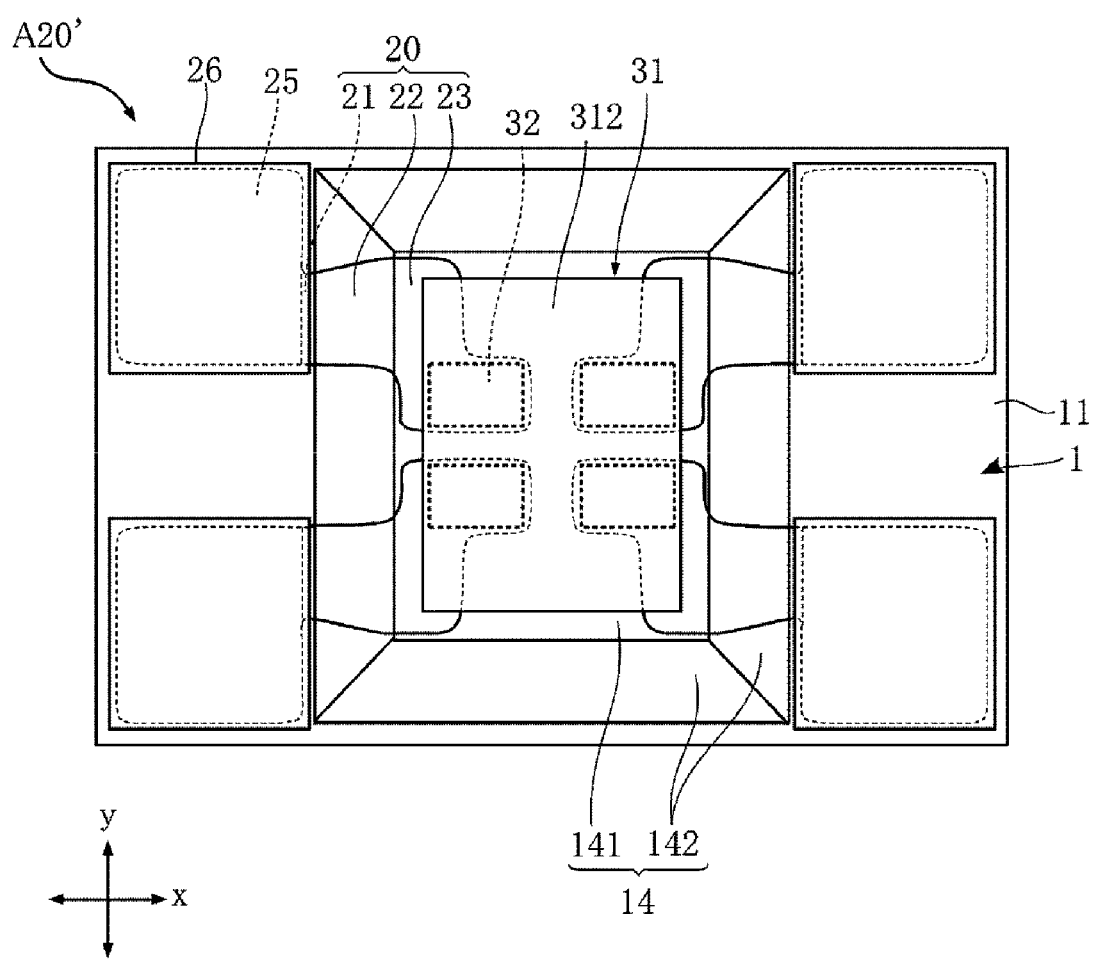
FIG. 28 is a plan view of a semiconductor device according to a modification of the second embodiment.

In the second embodiment, there has been described the case where the plan-view shape of the wiring part 20 is the shape shown in FIG. 20. However, the present disclosure is not limited thereto. For example, the plan-view shape of the wiring part 20 may be a shape as shown in FIG. 28. FIG. 28 shows a semiconductor device A20' according to such a modification. FIG. 28 is a plan view showing the semiconductor device A20' and corresponds to FIG. 20.

The semiconductor device A20' differs from the semiconductor device A20 in the shape of the wiring part 20. The semiconductor element 31 of the semiconductor device A20' is different from the semiconductor element 31 of the semiconductor device A20 in the arrangement of the electrode bumps 31a. Four electrode bumps 31a are arranged near the center of the element main surface 311 of the semiconductor element 31. The bottom surface wiring 23 formed on the bottom surface 141 of the substrate 1 extends to the vicinity of the center of the bottom surface 141 so that it can be connected to each of the electrode bumps 31a. Furthermore, the connection surface wiring 22 formed on the connection surface 142 of the substrate 1 increases in width (a dimension in the second direction y) as it comes close to the bottom surface 141 from the substrate main surface 11. In the semiconductor device A20', as shown in FIG. 28, an inner side of the connection surface wiring 22 (the center side in the second direction y of the semiconductor device A20') is parallel to the first direction x, but an outer side of the connection surface wiring 22 (the side opposite to the center side in the second direction y of the semiconductor device A20') is inclined with respect to the first direction x.

The semiconductor device A20' configured as described above can achieve the same effects as those of the semiconductor device A20.

In addition, the shape of the connection surface wiring 22 is not limited to what has been described above (see FIG. 28). The outer side of the connection surface wiring 22 may be parallel to the first direction x, and the inner side of the connection surface wiring 22 may be inclined with respect to the first direction x. Further, the inner side and the outer side of the connection surface wiring 22 may be inclined with respect to the first direction x. Moreover, a width of the connection surface wiring 22 may be reduced as it comes close to the bottom surface 141 from the substrate main surface 11.

In this modification, there has been described the case where the second metal layer 52 is not provided. However, the present disclosure is not limited thereto. The second metal layer 52 may be provided.

Third Embodiment

A semiconductor device A30 according to a third embodiment will be described with reference to FIGS. 29 and 30.

In these figures, the same or similar elements as those of the semiconductor devices A10 and A20 described above are denoted by like reference numerals, and a redundant description thereof is omitted.

Figure 29:
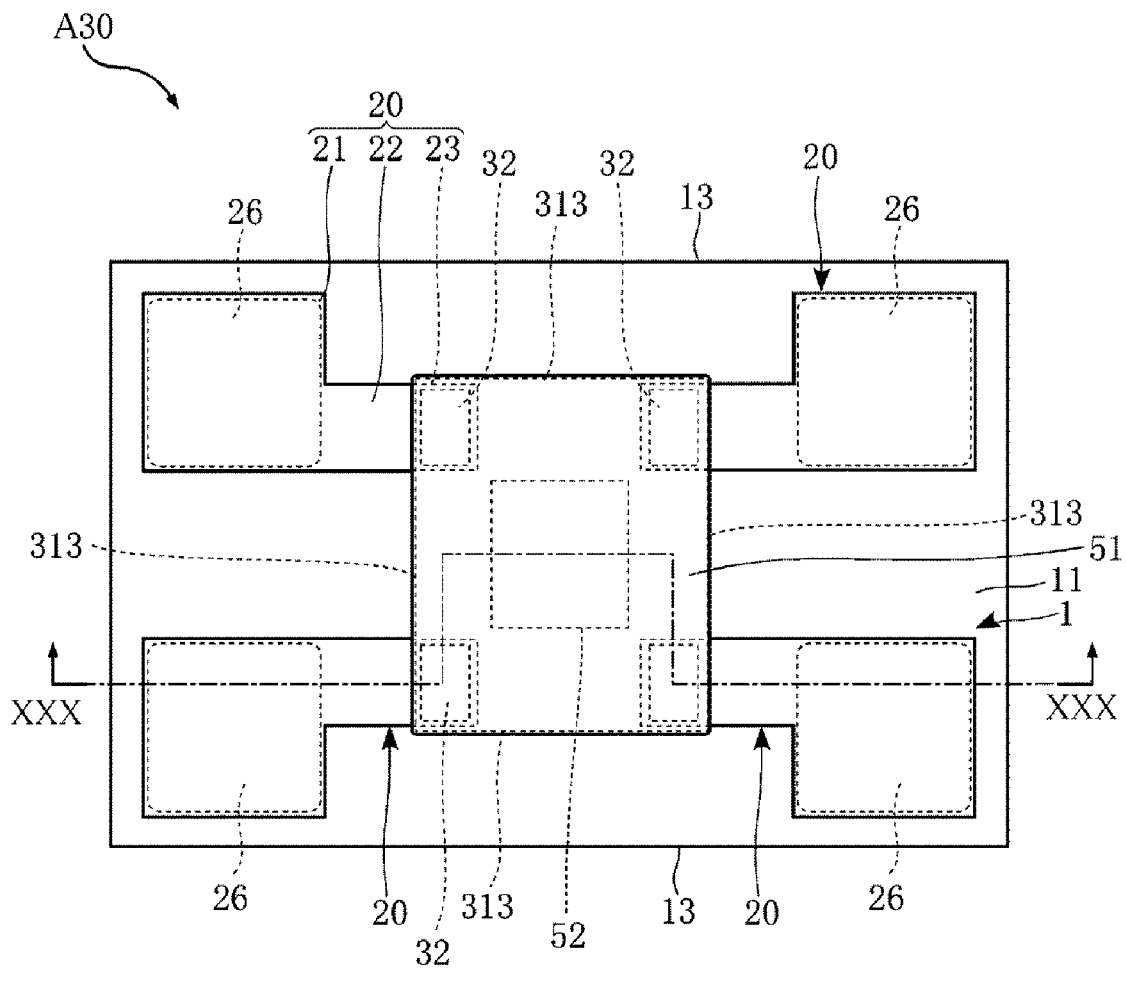
FIG. 29 is a plan view of a semiconductor device according to a third embodiment of the present disclosure.

FIG. 29 is a plan view of the semiconductor device A30. For convenience of understanding, the sealing resin 4 and the insulating layer 15 are omitted. FIG. 30 is a cross-sectional view taken along line XXX-XXX in FIG. 29. In addition, in FIG. 30, there is shown a case where each resin side surface 43 is a flat surface. However, each resin side surface 43 may have two steps as in the first embodiment. The semiconductor device A30 according to the present embodiment is different from the semiconductor device A10 in that the semiconductor device A30 does not include the columnar bodies 25 and the electrode pads 26 are disposed on the side of the substrate back surface 12 of the substrate 1.

The substrate 1 according to the present embodiment includes a substrate main surface 11, a substrate back surface 12, a plurality of substrate side surfaces 13, and a plurality of through-holes 16. In the present embodiment, similar to the substrate 1 according to the second embodiment, the (100) plane in which the crystal orientation of the substrate 1 is (100) is adopted as the substrate main surface 11. Further, a semiconductor element 31 is mounted on the substrate main surface 11 as shown in FIG. 30. In the present embodiment, the substrate main surface 11 corresponds to the "mounting surface" of the present disclosure.

Figure 30:
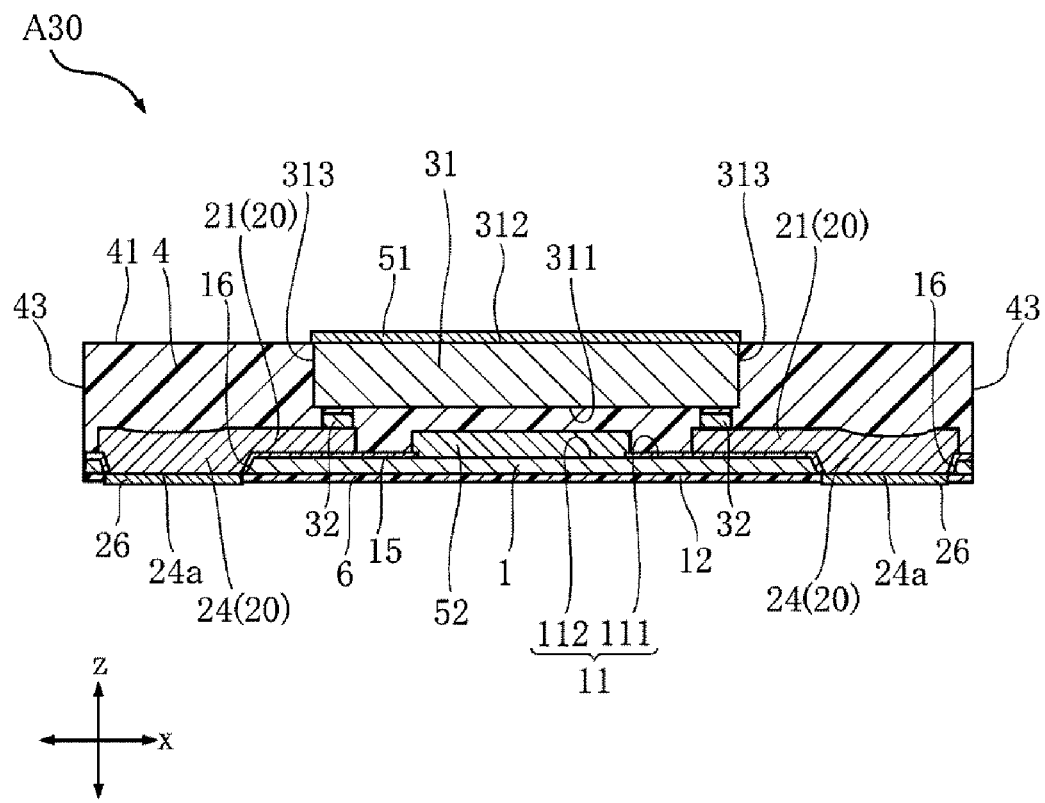
FIG. 30 is a cross-sectional view taken along line XXX-XXX in FIG. 29.

As shown in FIG. 30, each of the through-holes 16 penetrates the substrate 1 from the substrate main surface 11 to the substrate back surface 12 in the thickness direction z. In the present embodiment, as shown in FIG. 30, the substrate 1 includes four through-holes 16, each of which is provided near each of the four corners of the substrate 1. In the present embodiment, the plan-view shape of each through-hole 16 is rectangular. An opening size of each through-hole 16 on the side of the substrate main surface 11 is, for example, about 200 to 300 μm. The number, arrangement, shape, and dimensions of the through-holes 16 are not limitative. The insulating layer 15 is also formed on the inner surface of each through-hole 16 as shown in FIG. 30.

The wiring part 20 according to the present embodiment includes a plurality of main surface wirings 21 and a plurality of through-wirings 24. Each through-wiring 24 is formed so as to penetrate the substrate 1. Each through-wiring 24 is formed inside each through-hole 16 so as to fill each through-hole 16. Each through-wiring 24 is exposed from the substrate main surface 11 and the substrate back surface 12 of the substrate 1. In each through-wiring 24, one end exposed from the substrate main surface 11 is connected to the main surface wiring 21. Furthermore, the other end of each through-wiring 24 exposed from the back surface 12 of the substrate 1 is connected to each electrode pad 26. In the present embodiment, each through-wiring 24 has a prismatic shape and has an exposed surface 241. Each exposed surface 241 is a surface existing on the other end side of each through-wiring 24 and exposed from the substrate back surface 12 and is flush with the substrate back surface 12. In addition, the shape of each through-wiring 24 is not limited and may be, for example, a cylindrical shape or the like. In the present embodiment, the main surface wirings 21 and the through-wirings 24 are integrally formed of the same material. The main surface wirings 21 and the through-wirings 24 may be separately formed of different materials.

In the present embodiment, each electrode pad 26 is formed so as to make contact with the entire exposed surface 241 of each through-wiring 24 exposed from the back surface 12 of the substrate 1.

In the present embodiment, the semiconductor device A30 includes a resin film 6. The resin film 6 is formed on the back surface 12 of the substrate 1. The resin film 6 covers the entire back surface 12 of the substrate 1, and covers the entire surface of the semiconductor device A30 on the side of the substrate back surface 12 of the substrate 1 other than the portion where the electrode pads 26 are formed. The resin film 6 serves to electrically insulate the electrode pads 26 from each other.

Next, an example of a method of manufacturing the semiconductor device A30 will be described with reference to FIGS. 31 to 35. A description of the parts common to the method of manufacturing the semiconductor device A10 and the method of manufacturing the semiconductor device A20 is omitted. These figures are cross-sectional views showing a manufacturing process of the semiconductor device A30, and show a cross section in the y-z plane taken along line XXX-XXX in FIG. 29.

Figure 31:
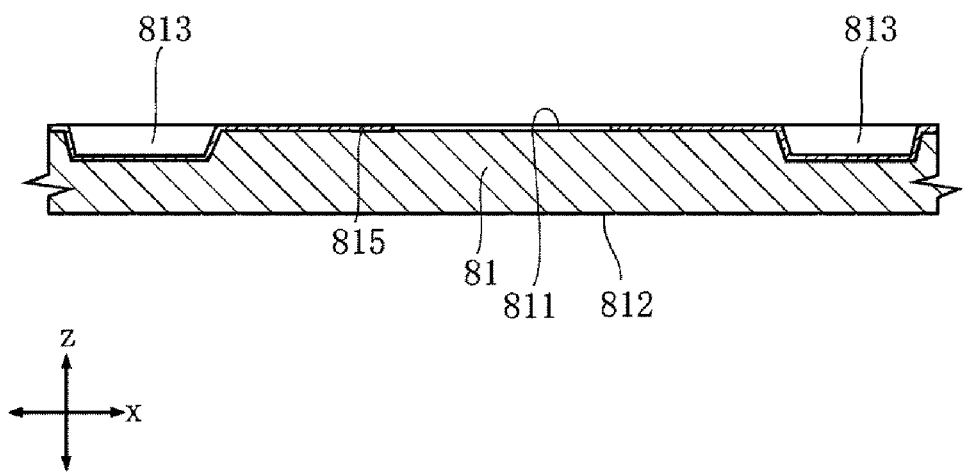
FIG. 31 is a cross-sectional view illustrating a manufacturing step of the semiconductor device shown in FIG. 29.

First, as shown in FIG. 31, a base 81 is provided, and a recess 813 is formed on the front surface 811 of the base 81. The recess 813 is a portion that becomes a through-hole 816 later, and is formed by the same method as the forming method of the recess 814 according to the second embodiment (see FIGS. 22 to 24).

Figure 32:
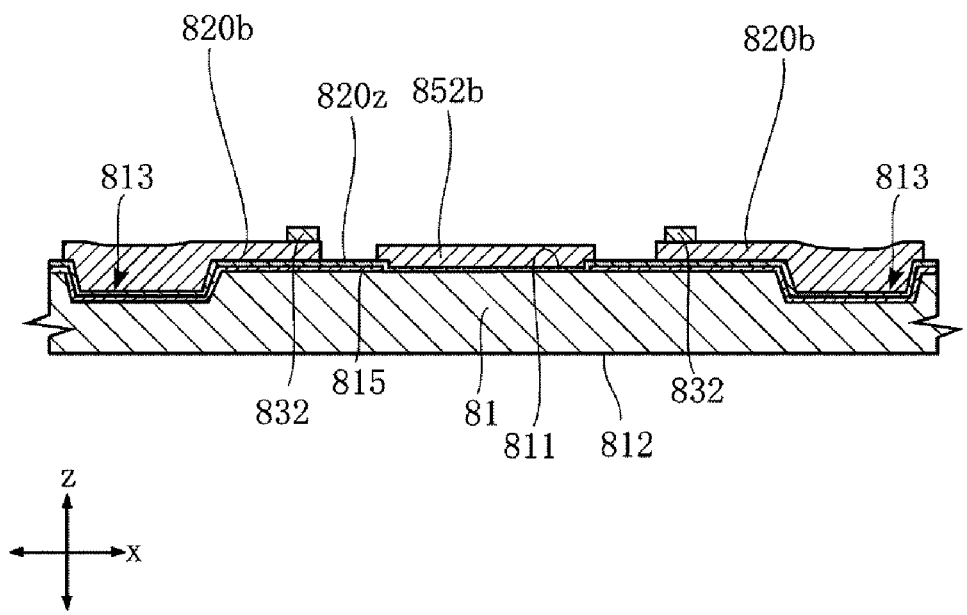
FIG. 32 is a cross-sectional view illustrating a manufacturing step of the semiconductor device shown in FIG. 29.

Next, as shown in FIG. 32, an insulating layer 815, a base layer 820z, plating layers 820b and 852b, and a bonding layer 832 are formed. The formation of the layers is performed in the same manner as the insulating layer forming step, the base layer forming step, the plating layer forming step, and the bonding layer forming step according to the first embodiment. In the plating layer forming step according to the present embodiment, an inhibitor and an accelerator are added to a plating solution. A plating material preferentially deposits and grows on the portion of the base layer 820z located in the recess 813 rather than on the portion of the base layer 820z located in the front surface 811. Thus, the plating layer 820b to be formed is formed thicker on the portion located in the recess 813 than on the portion located on the surface 811. The thick portion of the plating layer 820b formed in the recess 813 becomes the through-wiring 24 of the semiconductor device A30.

Figure 33:
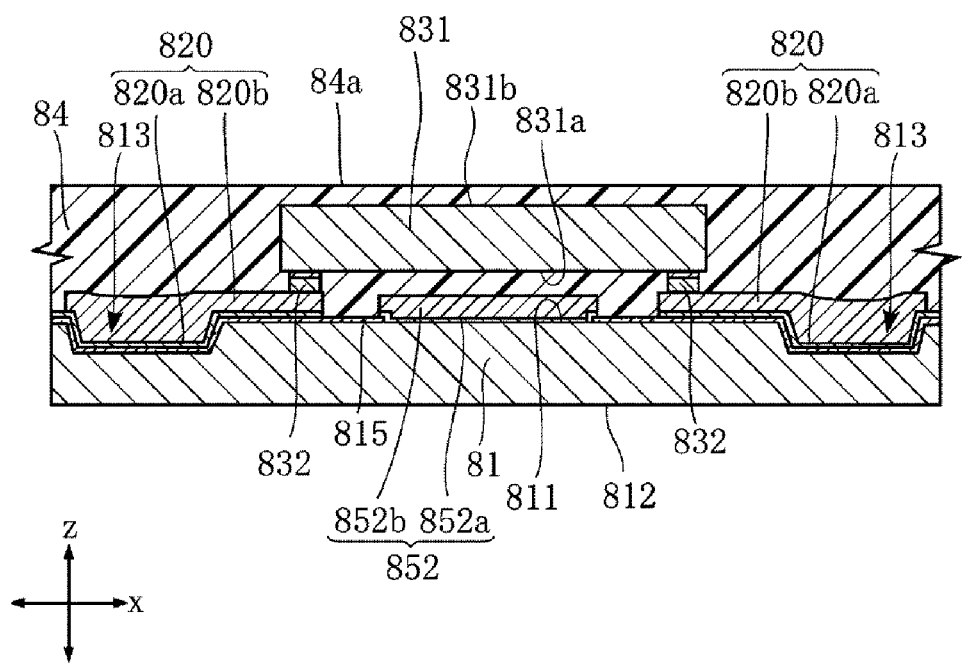
FIG. 33 is a cross-sectional view illustrating a manufacturing step of the semiconductor device shown in FIG. 29.

Next, as shown in FIG. 33, after removing the unnecessary base layer 820z not covered with the plating layers 820b and 852b, a semiconductor element 831 is mounted on the substrate 81, and a sealing resin 84 is formed. These steps are performed in the same manner as the base layer removal step, the semiconductor element mounting step, and the sealing resin forming step according to the first embodiment.

Figure 34:
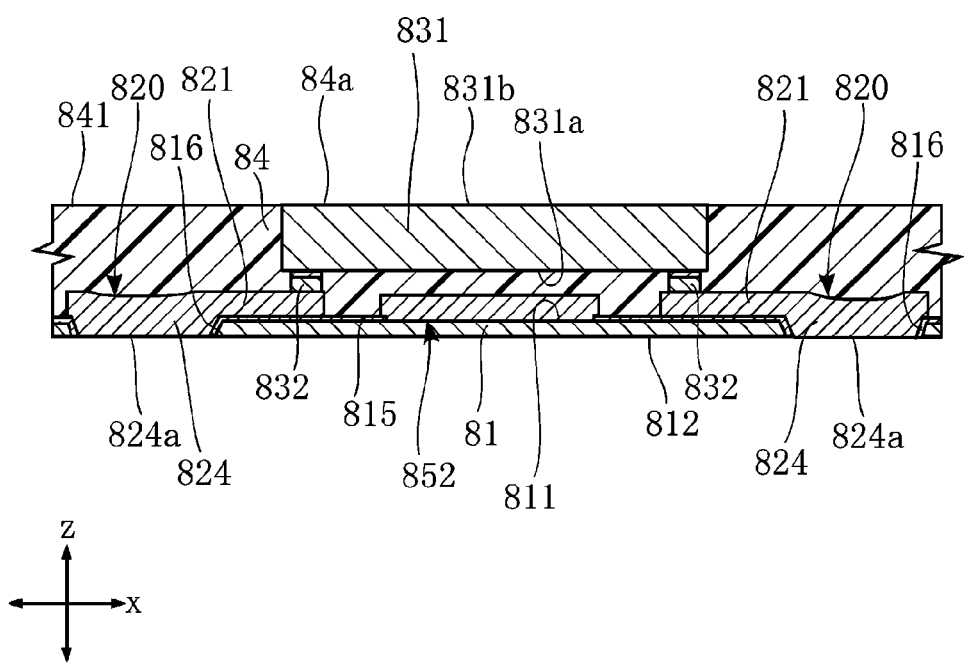
FIG. 34 is a cross-sectional view illustrating a manufacturing step of the semiconductor device shown in FIG. 29.
Figure 35:
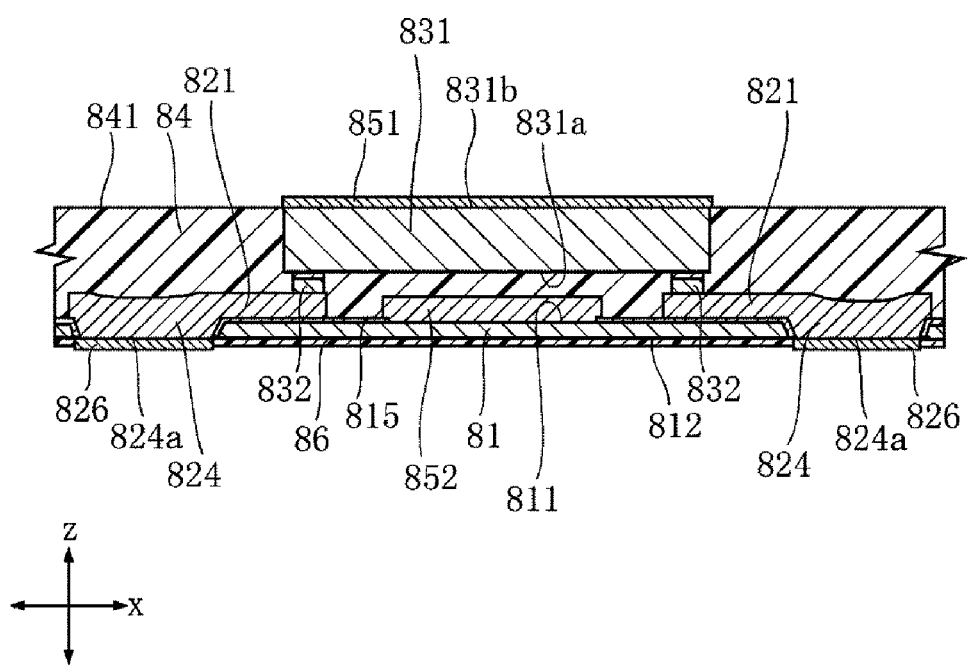
FIG. 35 is a cross-sectional view illustrating a manufacturing step of the semiconductor device shown in FIG. 29.

Next, as shown in FIG. 34, parts of the sealing resin 84 and the base 81 are ground by, for example, mechanical grinding. In FIGS. 34 and 35, the base layer 820a and the plating layer 820b are indicated as a wiring part 820, and the base layer 852a and the plating layer 852b are indicated as a second metal layer 852. In the present embodiment, the sealing resin 84 is ground from the side of the front surface 84a (the upper side in the figures) to expose the semiconductor element 831. By virtue of this grinding, the element main surface 831a of the semiconductor element 831 and the resin main surface 841 of the sealing resin 84 are caused to become flat and flush with each other. Furthermore, the base 81 is ground from the side of the back surface 812 (lower side in the figures) to form a through-hole 816 and a through-wiring 824. In the present embodiment, grinding is performed until the overall dimension in the thickness direction z (a dimension from the back surface 812 to the top surface of the sealing resin 84) reaches a desired dimension (for example, about 200 to 300 μm). By virtue of this grinding, the through-wiring 824 is caused to have an exposed surface 824a exposed from the back surface 812 of the base 81. Furthermore, as the bottom surface portion of the recess 813 is ground, the recess 813 is penetrated to become a through-hole 816. In the present embodiment, the recess 813 having a depth of about 50 to 80 μm becomes a through-hole 816 having the same thickness (for example, about 30 to 50 μm) as the base 81 by grinding. That is, the through-wiring 824 is also ground by about 20 to 30 μm. Furthermore, the exposed surface 824a of the through-wiring 824 and the back surface 812 of the base 81 are both flat and flush with each other.

Next, as shown in FIG. 35, a resin film 86 is formed so as to cover the back surface 812 of the base 81. In the resin film 86, an opening surrounding the exposed surface 824a of the through-wiring 824 is formed. Then, as shown in FIG. 35, an electrode pad 826 making contact with the exposed surface 824a of the through-wiring 824 is formed in the opening of the resin film 86, and a first metal layer 51 making contact with the element back surface 831b of the semiconductor element 831 is formed.

Next, as in the first embodiment, the base 81 and the sealing resin 84 are cut along the first direction x and the second direction y by blade dicing to divide them into individual pieces for each range corresponding to the substrate 1 of the semiconductor device A30. The semiconductor device A30 is manufactured through the above steps.

Next, the operations and effects of the semiconductor device A30 and the manufacturing method thereof will be described.

According to the present embodiment, the semiconductor device A30 includes the first metal layer 51 as in the semiconductor devices A10 and A20. Therefore, the heat generated from the semiconductor element 31 may be released to the outside from the side of the element back surface 312. That is, the present embodiment has the same effects as those of the first embodiment.

According to the present embodiment, the semiconductor device A30 includes the second metal layer 52 as in the semiconductor devices A10 and A20. Therefore, the heat generated from the semiconductor element 31 can be radiated not only from the side of the element back surface 312 by the first metal layer 51 but also from the side of the element main surface 311 by the second metal layer 52. That is, the present embodiment has the same effects as those of the first embodiment.

In addition, in the present embodiment, the same configuration as that of the first embodiment or the second embodiment has the same effects as those of the first embodiment or the second embodiment.

Figure 36:
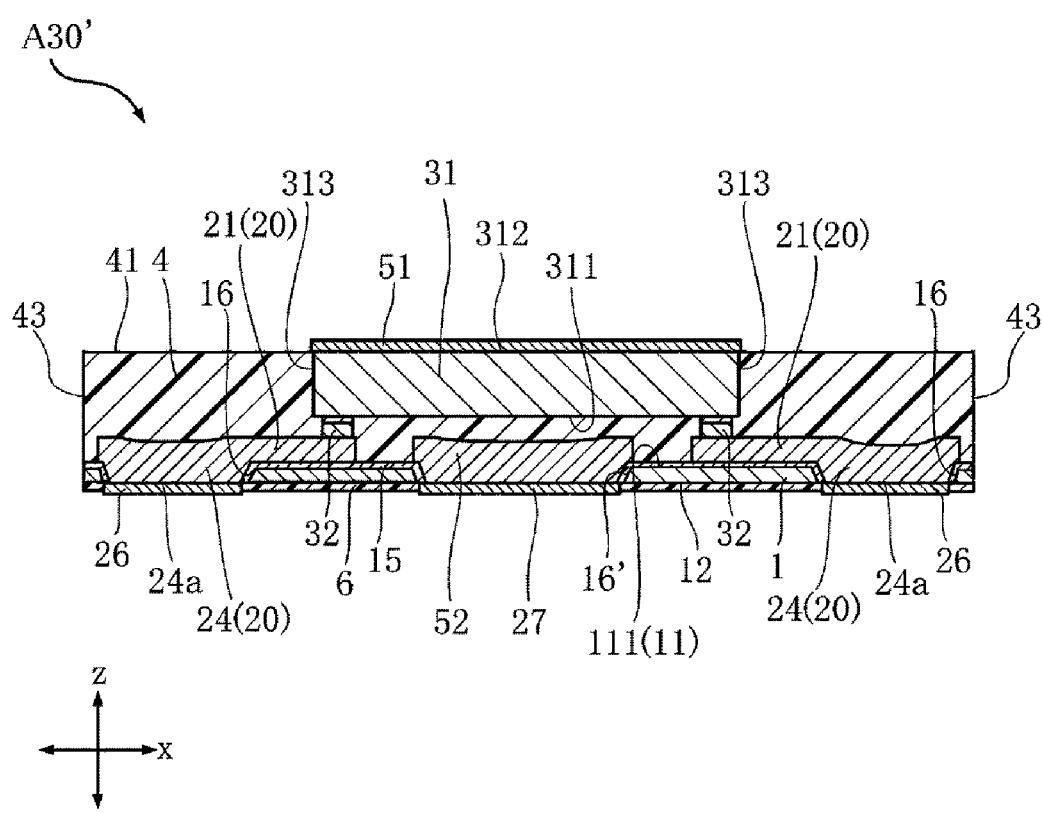
FIG. 36 is a cross-sectional view of a semiconductor device according to a modification of the third embodiment.

In the third embodiment, there has been described the case where the second metal layer 52 is formed on the substrate 1. However, the present disclosure is not limited thereto. For example, the second metal layer 52 may be formed so as to penetrate the substrate 1. FIG. 36 shows a semiconductor device A30' according to such a modification. FIG. 36 is a cross-sectional view showing the semiconductor device A30' and corresponds to the cross section shown in FIG. 30.

The substrate 1 of the semiconductor device A30' further has a through-hole 16' as compared with the substrate 1 of the semiconductor device A30. The through-hole 16' overlaps the semiconductor element 31 in plan view. The through-hole 16' is rectangular in plane view. The through-hole 16' is formed in the same manner as the through-hole 16. The through-hole 16' may be formed at the same time as the through-hole 16 or at a different time. The number and shape of the through-holes 16' are not limited. In the present modification, the insulating layer 15 is also formed on the inner surface of the through-hole 16' as shown in FIG. 36.

In the semiconductor device A30', as shown in FIG. 36, the second metal layer 52 is formed inside the through-hole 16' so as to partially fill the through-hole 16'. The second metal layer 52 is exposed from the substrate main surface 11 and the substrate back surface 12 of the substrate 1. A metal film 27 is formed on the surface of the second metal layer 52 exposed from the back surface 12 of the substrate. The metal film 27 is made of, for example, the same material as the electrode pads 26. That is, the metal film 27 includes a Ni layer making contact with the second metal layer 52, a Pd layer stacked on the Ni layer, and an Au layer stacked on the Pd layer. The Au layer is exposed to the outside. The metal film 27 is formed by electroless plating like the electrode pad 26. In this modification, in order to cover the back surface of the second metal layer 52 with the metal film 27, the resin film 6 (86) is formed to be opened. In the semiconductor device A30', the resin film 6 may be formed instead of the metal film 27.

The semiconductor device A30' configured as described above can have the same effects as those of the semiconductor device A30. Furthermore, according to the semiconductor device A30', the second metal layer 52 is formed so as to penetrate the substrate 1. The material of the second metal layer 52 is metal (mainly Cu) and has a thermal conductivity higher than that of Si, which is the material of the substrate 1. Therefore, the semiconductor device A30' can release the heat of the semiconductor element 31 to the outside more efficiently than the semiconductor device A30.

In the above modification, there has been described the case where the through-hole 16' is added to the semiconductor device A30. However, the through-hole 16' may be further added to the semiconductor device A10 or A20, and a part of the second metal layer 52 may be formed inside the through-hole 16' so as to fill the through-hole 16'. That is, the second metal layer 52 may be configured to penetrate the substrate 1 in the semiconductor device A10 or A20. In this case, the inner surface of the through-hole 16' may or may not be inclined with respect to the thickness direction z as in the semiconductor device A30'. The formation method of the through-hole 16' is not specifically limited.

Fourth Embodiment

A semiconductor device A40 according to a fourth embodiment will be described with reference to FIGS. 37 to 39. In these figures, the same or similar elements as those of the semiconductor devices A10, A20, and A30 described above are denoted by like reference numerals, and a redundant description thereof is omitted.

Figure 37:
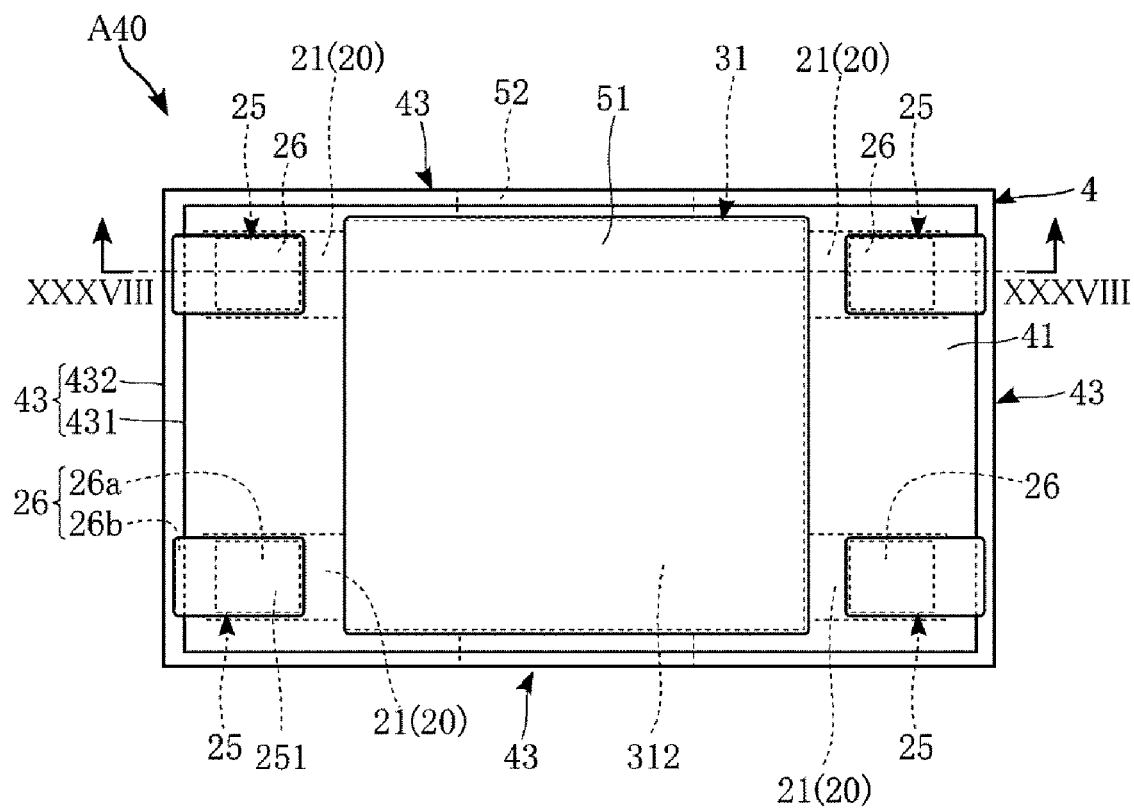
FIG. 37 is a plan view of a semiconductor device according to a fourth embodiment of the present disclosure.

FIG. 37 is a plan view of the semiconductor device A40. FIG. 38 is a cross-sectional view taken along line XXXVIII-XXXVIII in FIG. 37. FIG. 39 is an enlarged view (partially enlarged sectional view) of a part of the cross section shown in FIG. 38. FIG. 39 is a view for mainly explaining cross-sectional structures of the electrode pads 26 and the first metal layer 51.

The semiconductor device A40 is different from the above-described semiconductor device A10 mainly in the formation range and stacking structure of the electrode pads 26.

Figure 38:
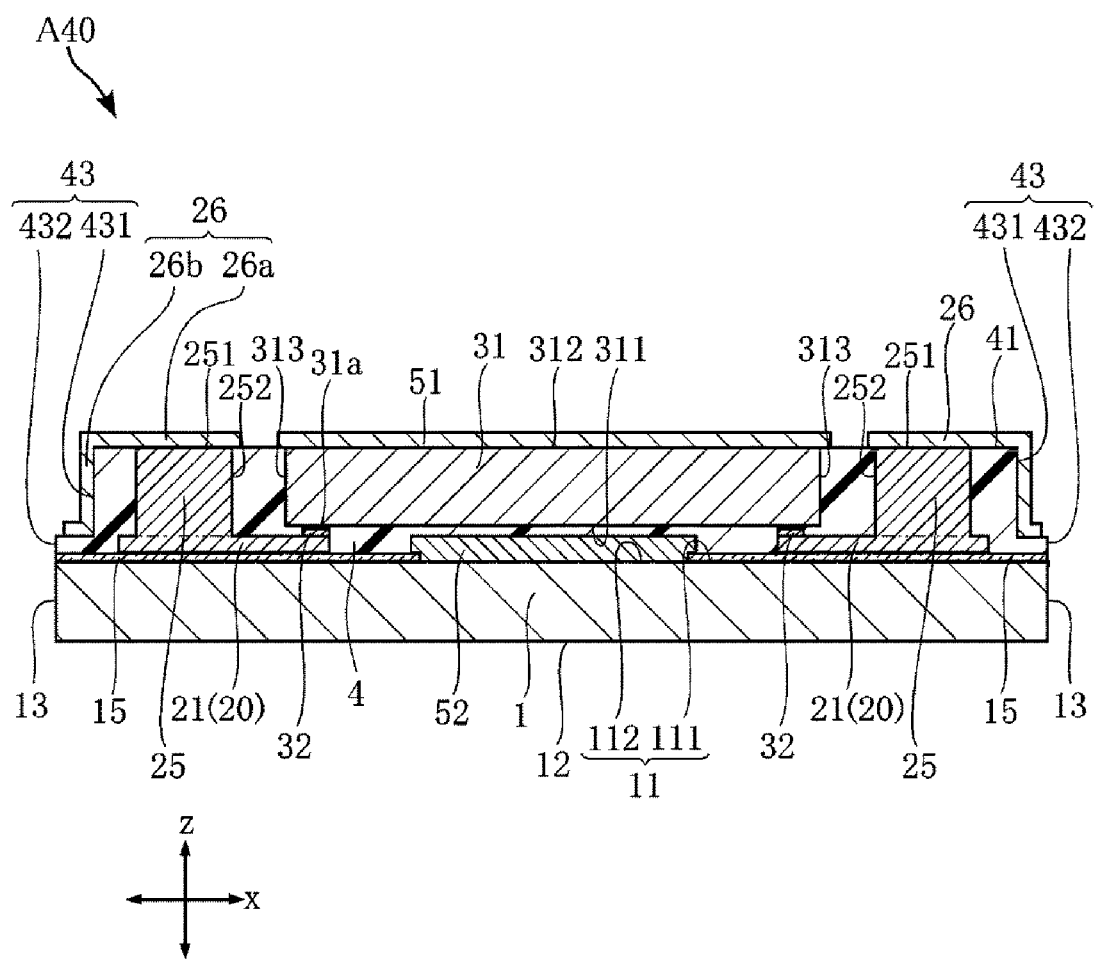
FIG. 38 is a cross-sectional view taken along line XXXVIII-XXXVIII in FIG. 37.

As shown in FIGS. 37 and 38, each of the electrode pads 26 extends in the first direction x from the top surface 251 of each of the columnar bodies 25 to a part of the resin side surface 43 (first resin side surface 431) through a part of the resin main surface 41. Each of the electrode pads 26 includes a first electrode portion 26a and a second electrode portion 26b.

The first electrode portion 26a is formed across the top surface 251 of each of the columnar bodies 25 and a part of the resin main surface 41 of the sealing resin 4. The second electrode portion 26b is formed on a part of the resin side surface 43 (first resin side surface 431) of the sealing resin 4. The second electrode portion 26b is connected to the first electrode portion 26a.

Figure 39:
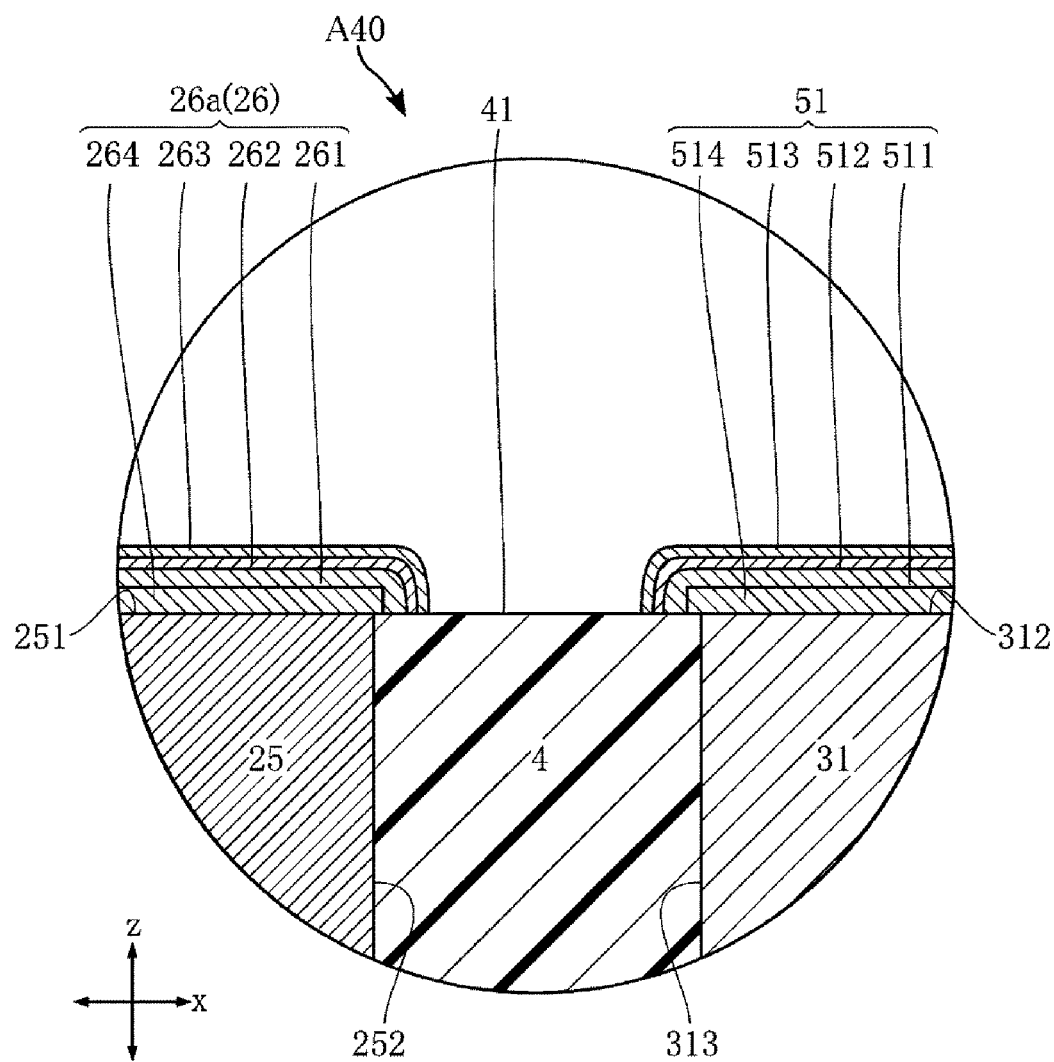
FIG. 39 is an enlarged view (partially enlarged sectional view) of a part of the cross-sectional view shown in FIG. 38.

As shown in FIG. 39, each of the electrode pads 26 includes, for example, a base layer 264, a Ni layer 261, a Pd layer 262, and an Au layer 263 stacked in the named order. The base layer 264 includes a Ti layer and a Cu layer stacked one above the other. In the base layer 264, the Ti layer is formed on each of the columnar bodies 25 (the top surface 251) or the sealing resin 4, and the Cu layer is formed on the Ti layer. The base layer 264 may be formed by stacking the Ti layer and the Cu layer through a sputtering method or a vacuum vapor deposition method and then patterning the Ti layer and the Cu layer. The Ni layer 261, the Pd layer 262, and the Au layer 263 may be formed by electroless plating as in the first embodiment. The electrode pad 26 may not include the Pd layer 262.

As shown in FIGS. 37 and 38, the first metal layer 51 has a formation range which is substantially the same as that of the first embodiment, but the constituent material thereof is different from that of the first embodiment.

As shown in FIG. 39, the first metal layer 51 includes, for example, a base layer 514, a Ni layer 511, a Pd layer 512, and an Au layer 513 stacked in the named order. The base layer 514 includes a Ti layer and a Cu layer stacked one above the other. In the base layer 514, the Ti layer is formed on the semiconductor element 31 (the element back surface 312), and the Cu layer is formed on the Ti layer. The base layer 514 may be formed by stacking a Ti layer and a Cu layer through a sputtering method or a vacuum vapor deposition method and then patterning the Ti layer and Cu layer. The Ni layer 511, the Pd layer 512, and the Au layer 513 may be formed by electroless plating as in the first embodiment. The first metal layer 51 may not include the Pd layer 512. In addition, the first metal layer 51 of the present embodiment includes a base layer 514 so that the formation range is slightly wider than the first metal layer 51 of the first embodiment. As in the present embodiment, the first metal layer 51 according to the first to third embodiments may also have a structure in which the base layer 514, the Ni layer 511, the Pd layer 512, and the Au layer 513 are stacked in the named order.

Next, an example of a method of manufacturing the semiconductor device A40 will be described with reference to FIGS. 40 to 45. A description of the parts common to the method of manufacturing the semiconductor device A10 according to the first embodiment is omitted. These figures are cross-sectional views showing a manufacturing process of the semiconductor device A40, and correspond to the cross section shown in FIG. 38.

The manufacturing method of the semiconductor device A40 differs from the manufacturing method of the semiconductor device A10 in the process of the electrode pad forming step and the first metal layer forming step. Therefore, the steps up to the columnar body exposing step and the semiconductor element exposing step described above are substantially the same as those of the manufacturing method of the semiconductor device A10 (see FIGS. 5 to 18). The electrode pad forming step and the first metal layer forming step of the present embodiment include the following six steps.

Figure 40:
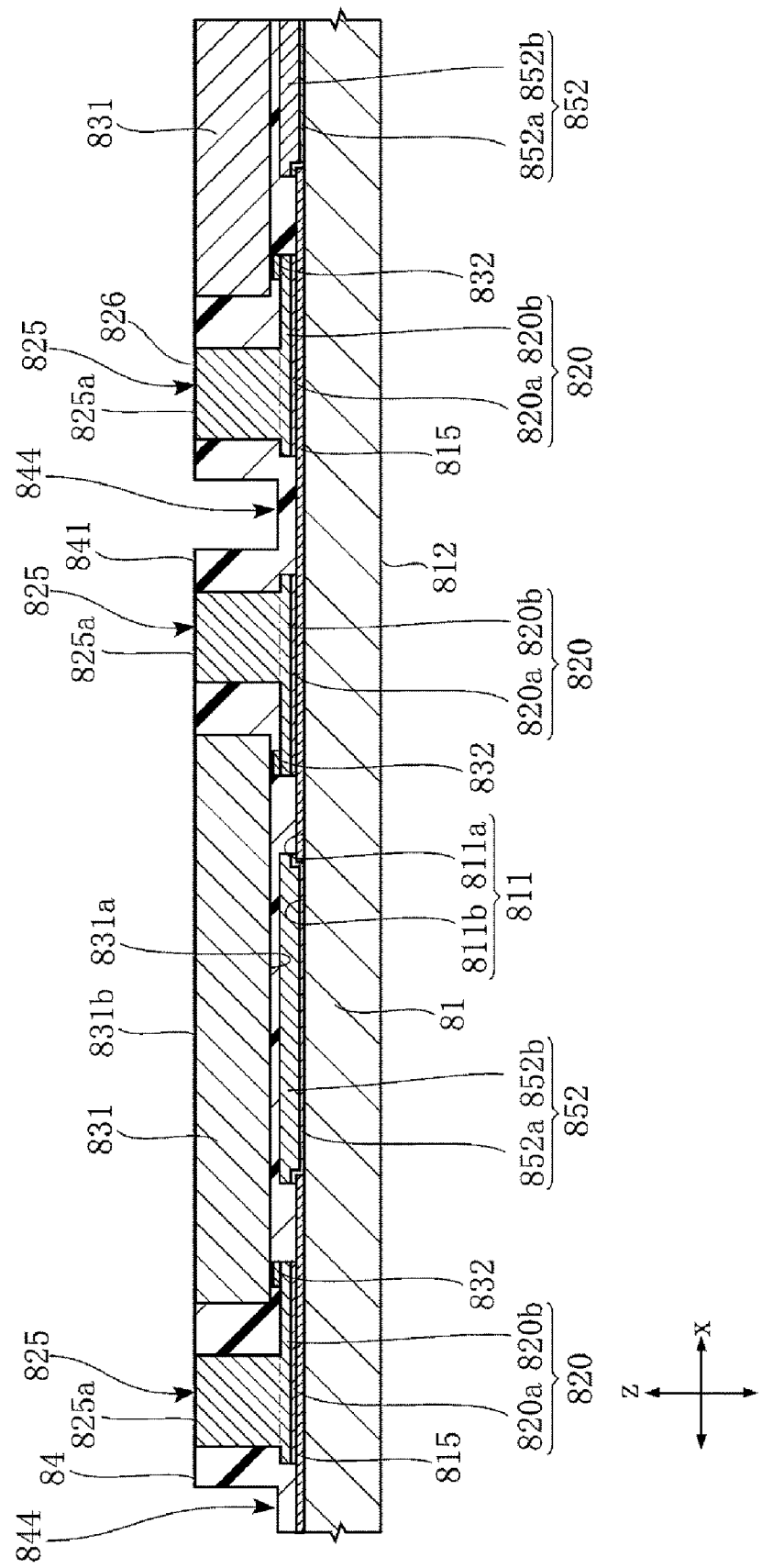
FIG. 40 is a cross-sectional view illustrating a manufacturing step of the semiconductor device shown in FIG. 37.

In the first step, as shown in FIG. 40, a recess 844 is formed in the sealing resin 84. In the step of forming the recess 844 (resin processing step), for example, half-cut dicing using a dicing blade is used. The z-direction dimension of the recess 844 is not particularly limited as long as the recess 844 does not penetrate the sealing resin 84.

Figure 41:
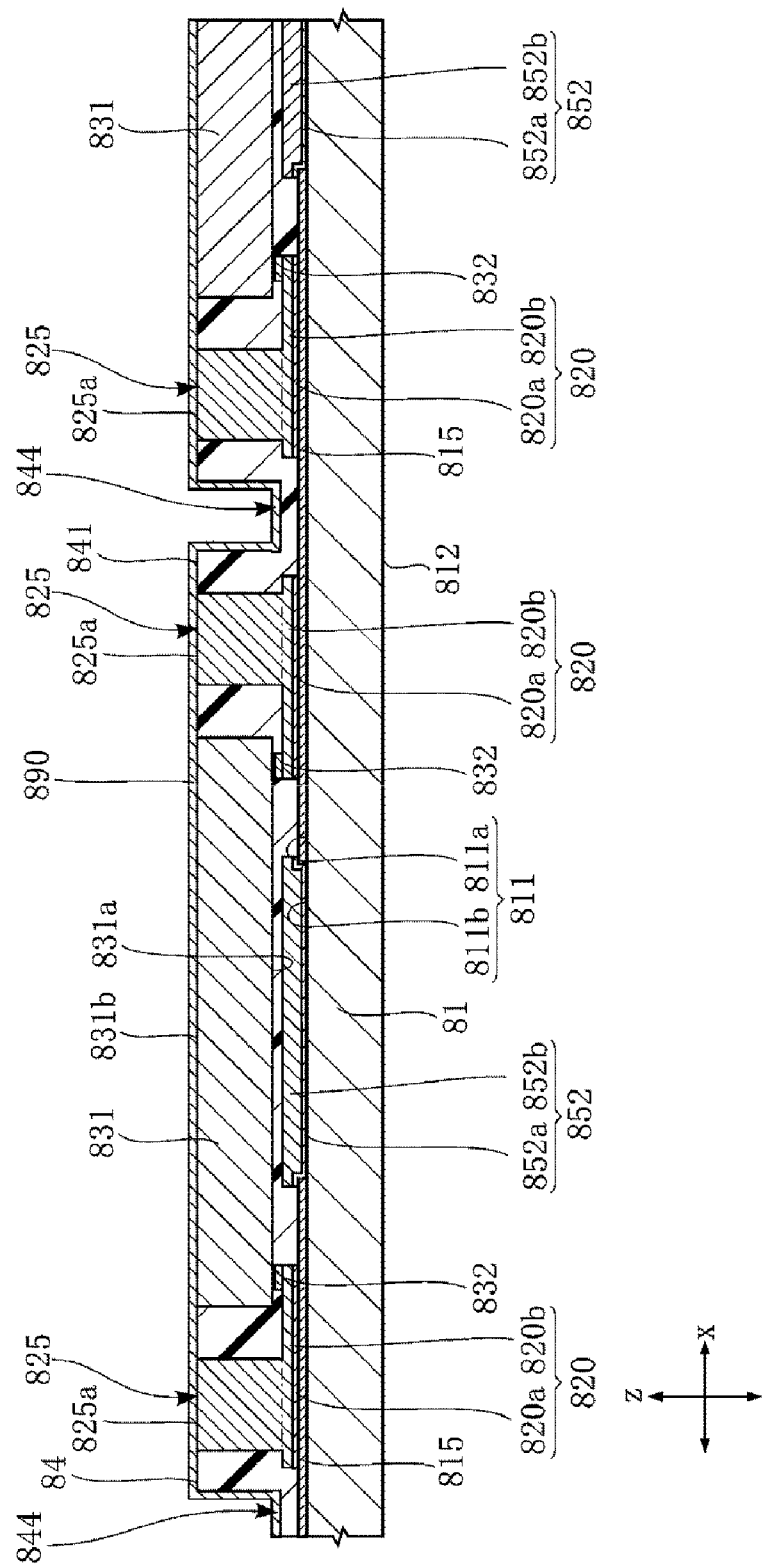
FIG. 41 is a cross-sectional view illustrating a manufacturing step of the semiconductor device shown in FIG. 37.

In the second step, as shown in FIG. 41, a base layer 890 is formed. The base layer 890 is formed by, for example, a sputtering method or a vacuum vapor deposition method. The base layer 890 is constituted by a Ti layer and a Cu layer stacked one above the other. In the step of forming the base layer 890, after forming the Ti layer entirely covering the element back surface 831b, the exposed surface 825a, the resin main surface 841, and the recess 844, a Cu layer covering the entire Ti layer is formed.

Figure 42:
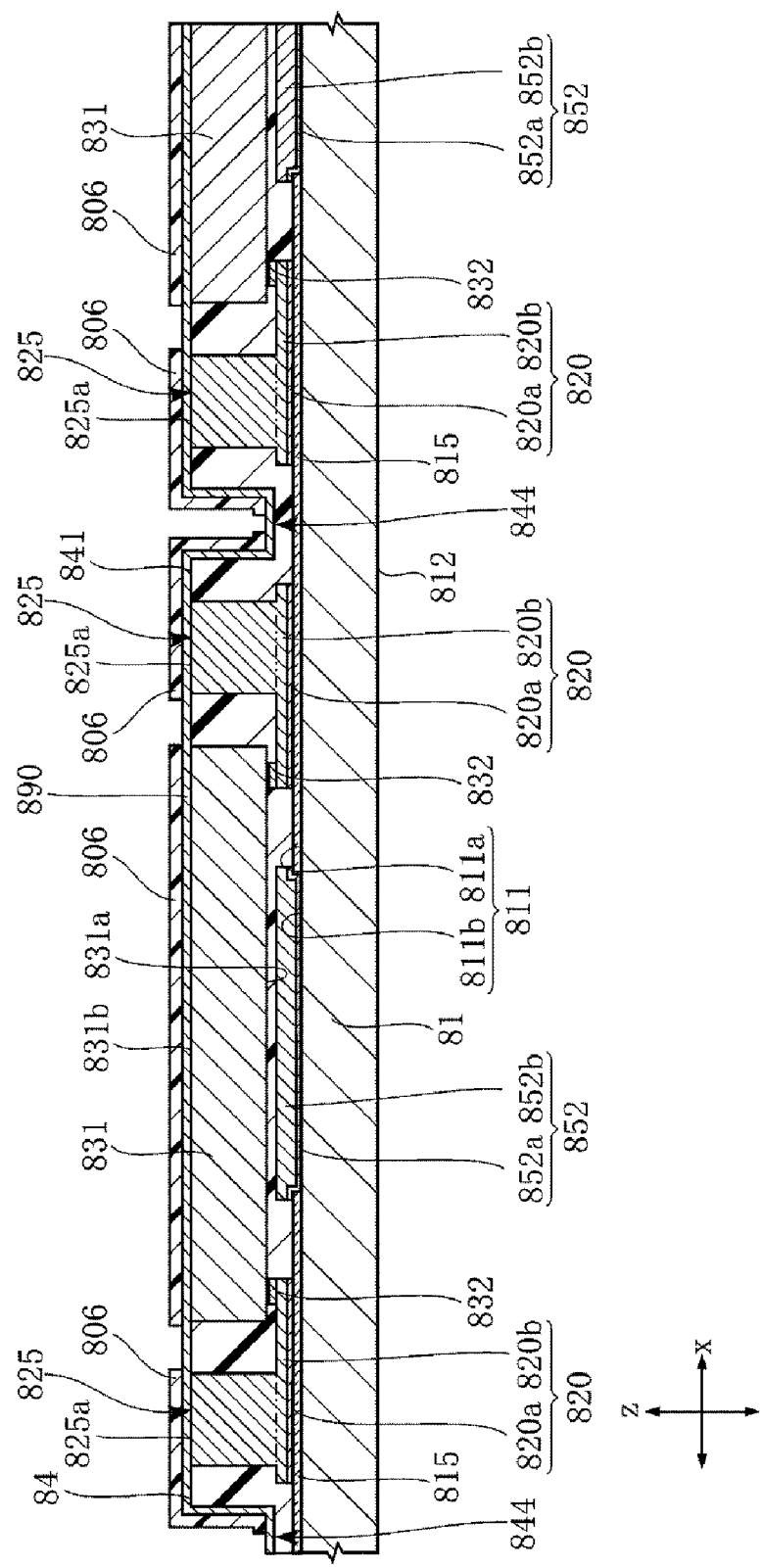
FIG. 42 is a cross-sectional view illustrating a manufacturing step of the semiconductor device shown in FIG. 37.

In the third step, as shown in FIG. 42, a resist layer 806 is formed. In forming the resist layer 806, a photosensitive resist is applied so as to cover the entire surface of the base layer 890 by a spin coating method. Then, the resist layer 806 is patterned by exposing and developing the photosensitive resist. Thus, as shown in FIG. 42, a patterned resist layer 806 is formed, and a part of the base layer 890 is exposed from the resist layer 806.

Figure 43:
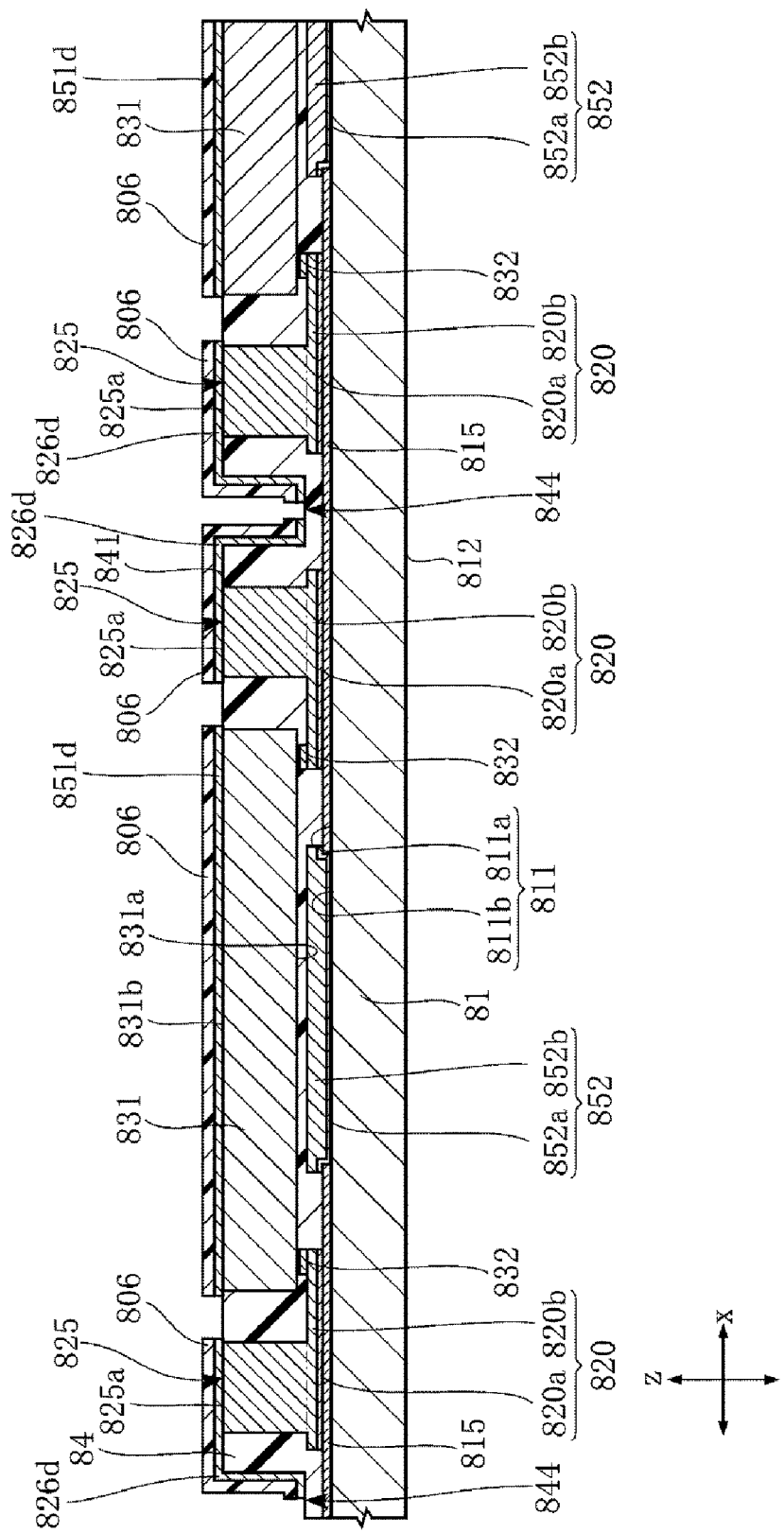
FIG. 43 is a cross-sectional view illustrating a manufacturing step of the semiconductor device shown in FIG. 37.

In the fourth step, as shown in FIG. 43, the base layer 890 is patterned to form a base layer 826d and a base layer 851d. Specifically, the base layer 890 is patterned by removing the base layer 890 exposed from the resist layer 806. By virtue of this patterning, the base layer 890 is divided into the base layer 826d and the base layer 851d. The base layer 826d corresponds to the base layer 264 of each of the electrode pads 26 of the semiconductor device A40, and the base layer 851d corresponds to the base layer 514 of each of the electrode pads 26 of the semiconductor device A40.

Figure 44:
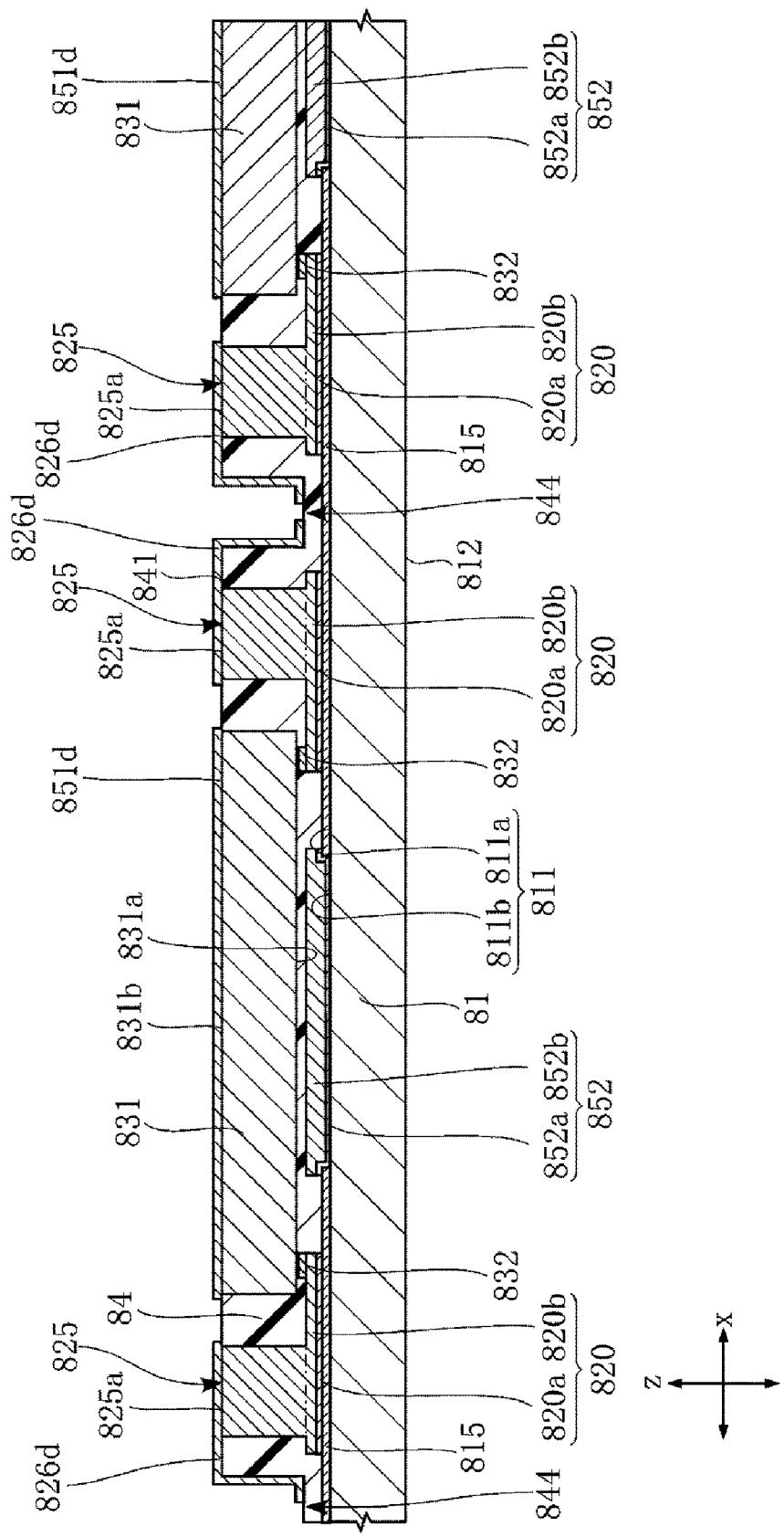
FIG. 44 is a cross-sectional view illustrating a manufacturing step of the semiconductor device shown in FIG. 37.

In the fifth step, as shown in FIG. 44, the resist layer 806 is removed.

Figure 45:
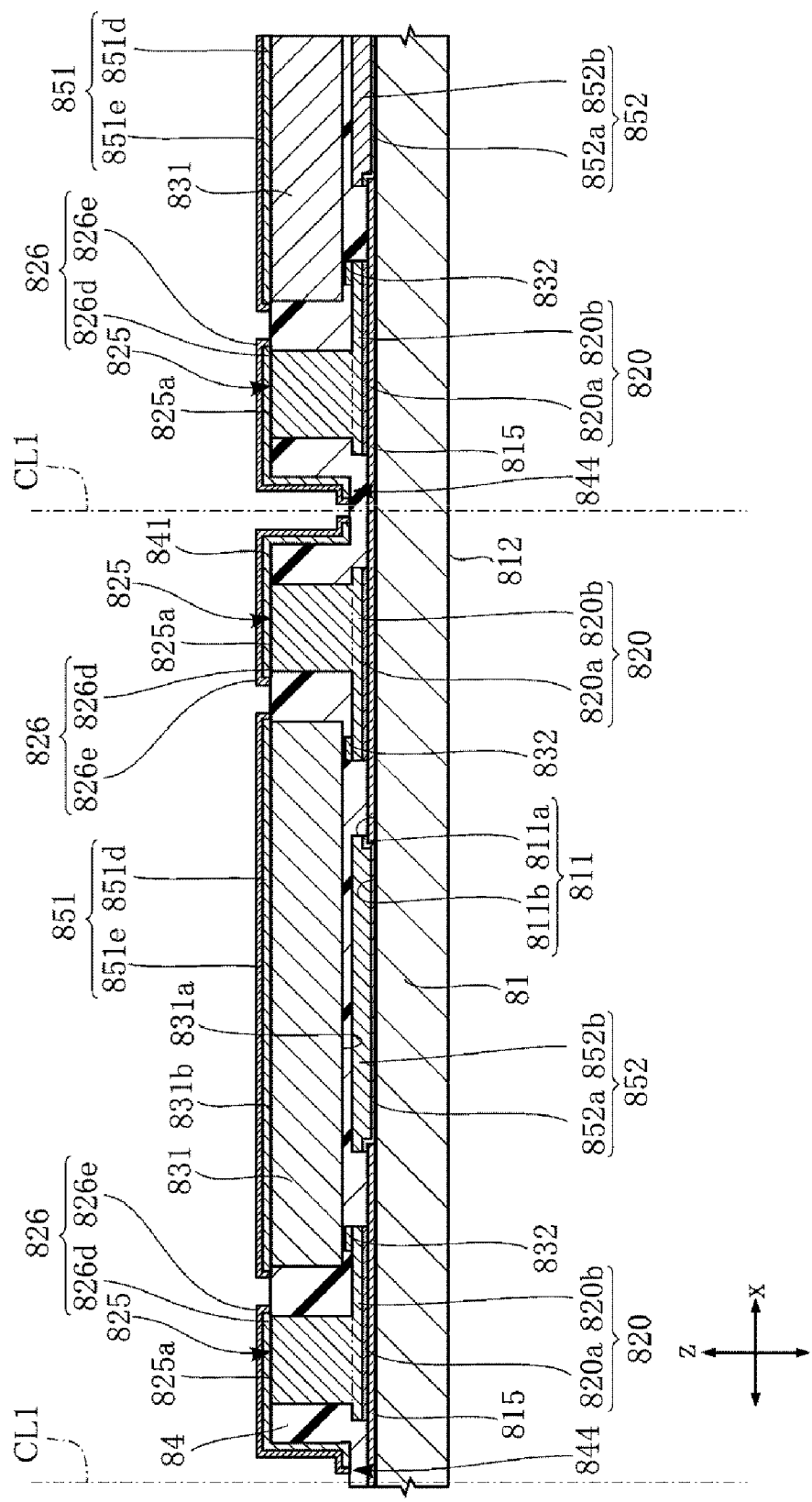
FIG. 45 is a cross-sectional view illustrating a manufacturing step of the semiconductor device shown in FIG. 37.

In the sixth step, as shown in FIG. 45, a plating layer 826e and a plating layer 851e are formed. The plating layer 826e and the plating layer 851e are formed collectively by electroless plating. In this step, a Ni layer, a Pd layer, and an Au layer are deposited in the named order by electroless plating. At this time, the Ni layer is formed so as to make contact with and cover the base layer 826d, the Pd layer is formed on the Ni layer, and the Au layer is formed on the Pd layer, thereby forming the plating layer 826e. Furthermore, the Ni layer is formed so as to make contact with and cover the base layer 851d, the Pd layer is formed on the Ni layer, and the Au layer is formed on the Pd layer, thereby forming the plating layer 851e.

As shown in FIG. 45, the electrode pads 826 including the base layer 826d and the plating layer 826e, and a first metal layer 851 including the base layer 851d and the plating layer 851e, are formed by going through the six steps described above.

After the electrode pad forming step and the first metal layer forming step, as in the first embodiment, the base 81 is ground from the side of the back surface 812 as necessary, and the base 81 is then divided into individual pieces for each range corresponding to the substrate 1 of the semiconductor device A40 by, for example, blade dicing. In the present embodiment, in the blade dicing for dividing the base 81 into individual pieces, for example, the dicing may be performed along the cutting line CL1 shown in FIG. 45 without performing step cutting. The cutting line CL1 is set so as to pass through the recess 844 formed in the resin processing step.

Next, the operations and effects of the semiconductor device A40 and the manufacturing method thereof will be described.

According to the present embodiment, the semiconductor device A40 includes the first metal layer 51 as in the semiconductor device A10. Therefore, the heat generated from the semiconductor element 31 can be released to the outside from the side of the element back surface 312. That is, the present embodiment has the same effects as those of the first embodiment.

According to the present embodiment, each of the electrode pads 26 includes a first electrode portion 26a and a second electrode portion 26b. The first electrode portion 26a is formed across a part of the resin main surface 41 and the top surface 251 and is electrically connected to each of the columnar bodies 25. The second electrode portion 26b is connected to the first electrode portion 26a and covers the first resin side surface 431. That is, the semiconductor device A40 has a side electrode (electrode pad 26) that covers a part of the resin side surface 43 of the sealing resin 4. According to such a configuration, when the semiconductor device A40 is mounted on a circuit board of an electronic device using a solder, a solder fillet is formed so as to cover the second electrode portion 26b of each of the electrode pads 26. Therefore, the solder bonding state can be visually confirmed from the side of the semiconductor device A40. That is, the solder bonding state can be easily confirmed visually without using an X-ray inspection apparatus or the like. Furthermore, since the solder fillet is formed across the first electrode portion 26a and the second electrode portion 26b, the bonding area between the semiconductor device A40 and the circuit board increases. This makes it possible to improve a bonding strength of the semiconductor device A40.

In addition, in the present embodiment, the same configuration as that of the first embodiment to the third embodiment has the same effects as those of the first embodiment to the third embodiment.

Fifth Embodiment

A semiconductor device A50 according to a fifth embodiment will be described with reference to FIG. 46. In this figure, the same or similar elements as those of the semiconductor devices A10, A20, A30, and A40 described above are denoted by like reference numerals, and a redundant description thereof is omitted.

Figure 46:
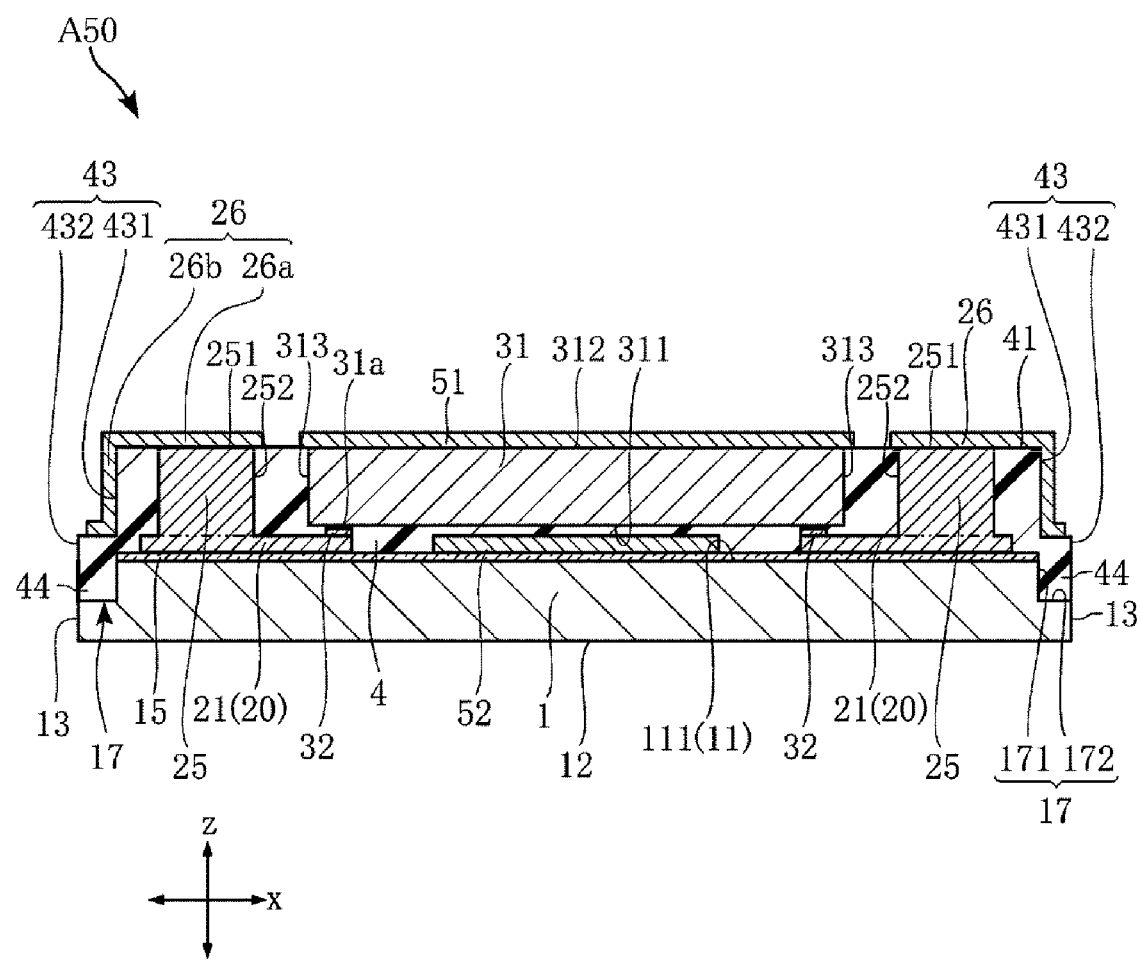
FIG. 46 is a cross-sectional view of a semiconductor device according to a fifth embodiment of the present disclosure.

FIG. 46 is a cross-sectional view of the semiconductor device A50 and corresponds to the cross section of the fourth embodiment shown in FIG. 38.

The semiconductor device A50 is mainly different in the shapes of the substrate 1 and the sealing resin 4 from the semiconductor device A40 described above. Specifically, the substrate 1 has a cutout portion 17, unlike the substrate 1 according to the fourth embodiment. The sealing resin 4 includes a filling portion 45, unlike the sealing resin 4 according to the fourth embodiment.

The cutout portion 17 is a portion recessed from the substrate main surface 11 and the substrate side surface 13 of the substrate 1. Due to the cutout portion 17, the substrate side surface 13 of the substrate 1 has two levels. The cutout portion 17 is disposed on the periphery of the substrate 1 in a plan view. The cutout portion 17 does not overlap the main surface wiring 21 and the columnar bodies 25 in plan view.

The cutout portion 17 is filled with a part of the sealing resin 4 (filling portion 45). The cutout portion 17 has a side wall surface 171 and a bottom surface 172.

The side wall surface 171 is connected to the substrate main surface 11 and the bottom surface 172. In the example shown in FIG. 45, the side wall surface 171 is flat and substantially orthogonal to both the substrate main surface 11 and the bottom surface 172. The side wall surface 171 may be inclined with respect to both the substrate main surface 11 and the bottom surface 172. In this case, an inclination angle is, for example, about 55 degrees (e.g., 54.7 degrees).

The bottom surface 172 is connected to the side wall surface 171 and the substrate side surface 13. In the example shown in FIG. 45, the bottom surface 172 is flat and faces the same direction as the substrate main surface 11. The bottom surface 172 is located between the substrate main surface 11 and the substrate back surface 12 in the z direction.

In the example shown in FIG. 46, both the side wall surface 171 and the bottom surface 172 are not covered with the insulating layer 15. That is, the side wall surface 171 and the bottom surface 172 are exposed from the insulating layer 15. Unlike the example shown in FIG. 46, both the side wall surface 171 and the bottom surface 172 may be covered with the insulating layer 15.

The filling portion 45 is a portion of the sealing resin 4 that is filled in the cutout portion 17. The filling portion 45 covers the side wall surface 171 and the bottom surface 172. The surface of the filling portion 45 facing the x direction is flush with the substrate side surface 13.

In addition, the semiconductor device A50 is different from the semiconductor device A40 in terms of the following points. The second metal layer 52 is formed on the insulating layer 15 without making contact with the substrate main surface 11 of the substrate 1. That is, the insulating layer 15 is interposed between the second metal layer 52 and the substrate 1. For this reason, the entire substrate main surface 11 is a covered region 111 and does not include an exposed region 112.

Next, an example of a method of manufacturing the semiconductor device A50 will be described with reference to FIGS. 47 to 50. A description of the parts common to the method of manufacturing the semiconductor device A40 according to the fourth embodiment will be omitted. These figures are cross-sectional views showing a manufacturing process of the semiconductor device A50, and correspond to the cross section shown in FIG. 46.

As compared with the method of manufacturing the semiconductor device A40, the method of manufacturing the semiconductor device A50 mainly includes a step of processing the base 81 (base processing step) before the base layer forming step (see FIG. 8). As in the fourth embodiment, the base processing step is performed after preparing the base 81 and forming the insulating layer 815 on the entire front surface 811 of the base 81 (see FIG. 5). The base processing step includes the following four steps.

Figure 47:
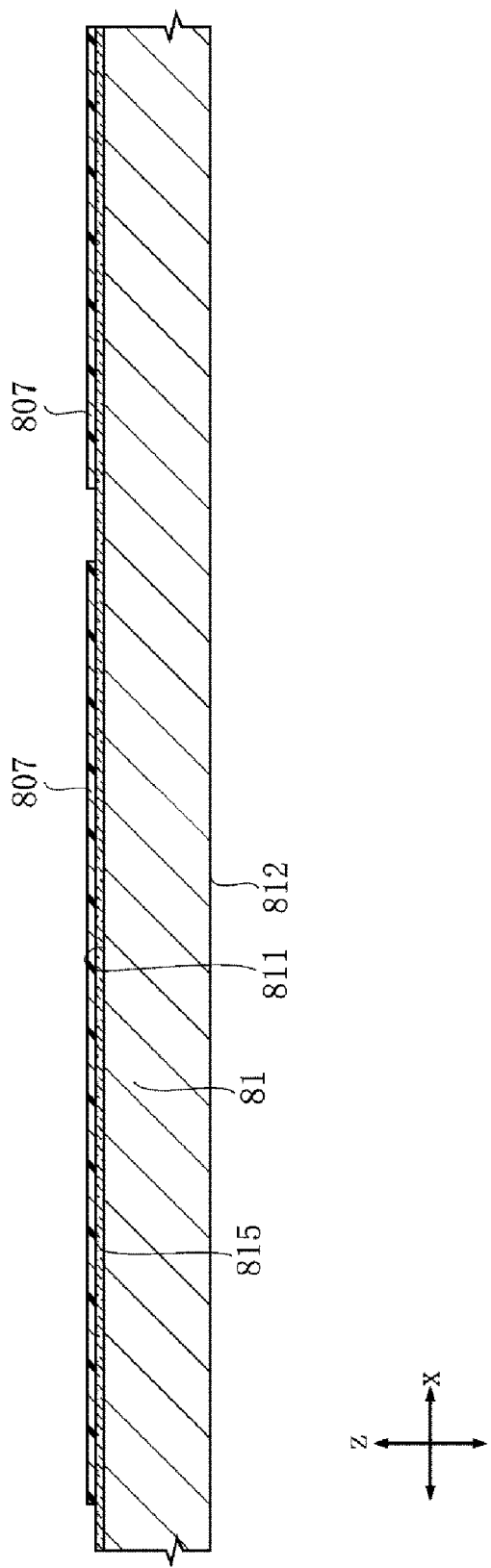
FIG. 47 is a cross-sectional view illustrating a manufacturing step of the semiconductor device shown in FIG. 46.

In the first step, as shown in FIG. 47, a resist layer 807 is formed. The resist layer 807 is formed by, for example, photolithography. Specifically, the resist layer 807 is formed so as to cover the entire surface of the insulating layer 815 shown in FIG. 47, and then the resist layer 807 is exposed and developed to form a pattern. The resist layer 807 constituting the pattern is opened, and the insulating layer 815 is exposed from the opened portion.

Figure 48:
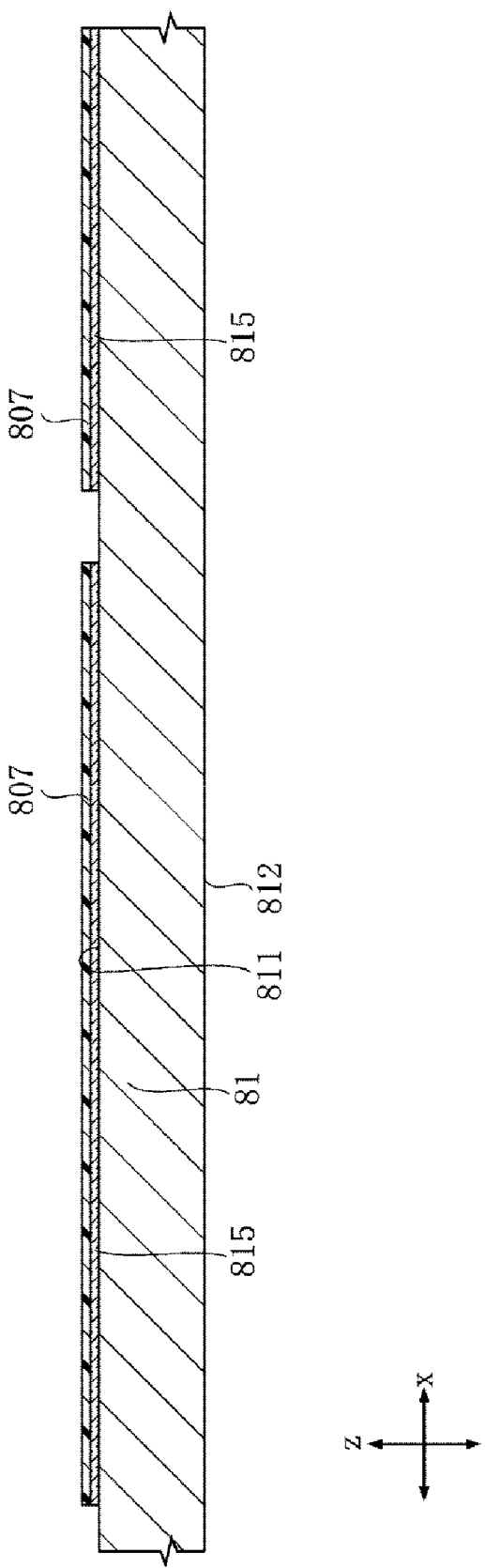
FIG. 48 is a cross-sectional view illustrating a manufacturing step of the semiconductor device shown in FIG. 46.

In the second step, as shown in FIG. 48, a part of the insulating layer 815 is removed. Specifically, the insulating layer 815 exposed from the resist layer 807 is removed. The partial removal of the insulating layer 815 is performed by, for example, dry etching using a fluorine-based gas. Thus, a part of the front surface 811 of the base 81 is exposed from both the insulating layer 815 and the resist layer 807.

Figure 49:
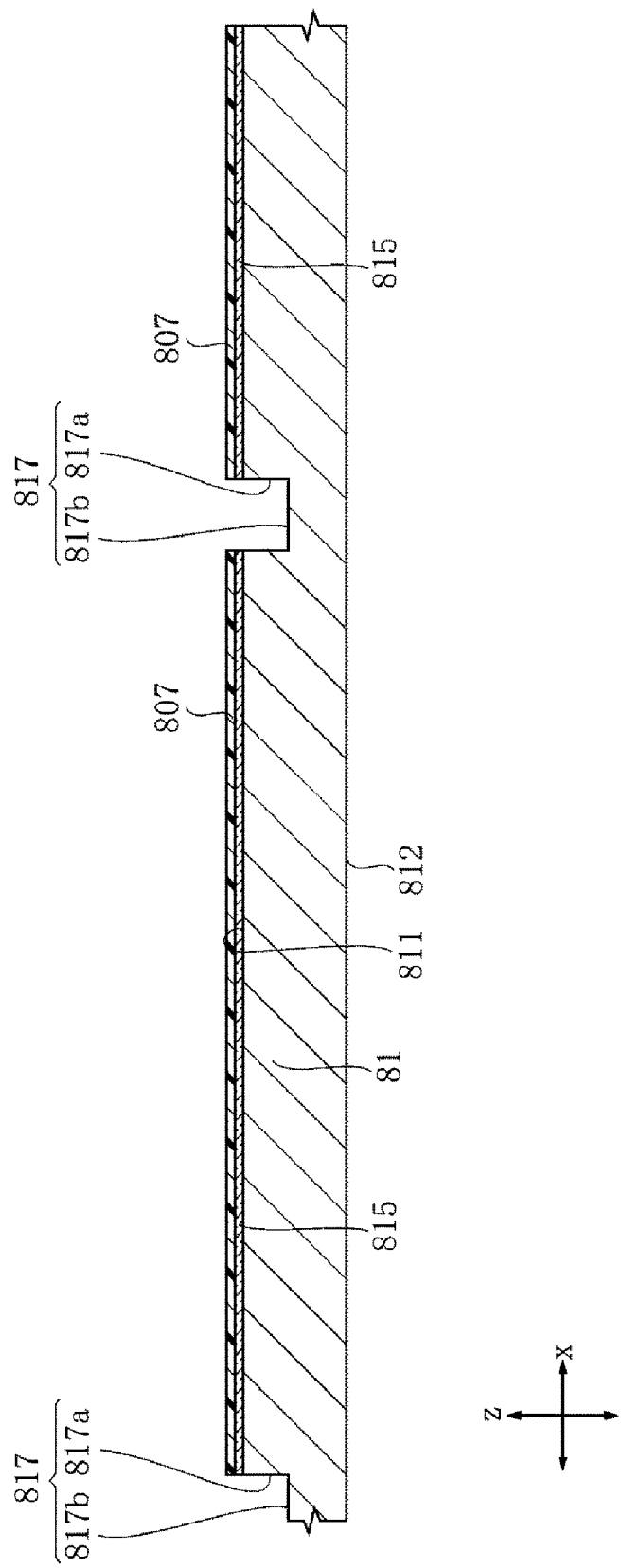
FIG. 49 is a cross-sectional view illustrating a manufacturing step of the semiconductor device shown in FIG. 46.

In the third step, a recess 817 is formed in the base 81 as shown in FIG. 49. The recess 817 is formed by anisotropic wet etching using, for example, KOH. An alkaline solution such as TMAH or EDP may be used instead of KOH. Furthermore, an isotropic wet etching may be performed by using a hydrofluoric acid (HF/HNO$_3$ mixed acid) solution as an etching solution. Moreover, the present disclosure is not limited to the wet etching, and dry etching such as reactive ion etching may be used. The cutout portion 817 may be formed by half etching using a dicing blade. As shown in FIG. 49, the formed recess 817 has a side wall surface 817a and a bottom surface 817b. The side wall surface 817a is connected to the front surface 811 of the base 81, and the bottom surface 817b is connected to the side wall surface 817a. The bottom surface 817b is flat and faces the same direction as the front surface 811. When the front surface 811 of the base 81 is a (110) plane, the side wall surface 817a formed by wet etching is substantially orthogonal to the front surface 811 as shown in FIG. 49. When the front surface 811 of the substrate 81 is a (100) plane, the side wall surface 817a formed by wet etching is inclined at about 54.7 degrees with respect to the front surface 811.

Figure 50:
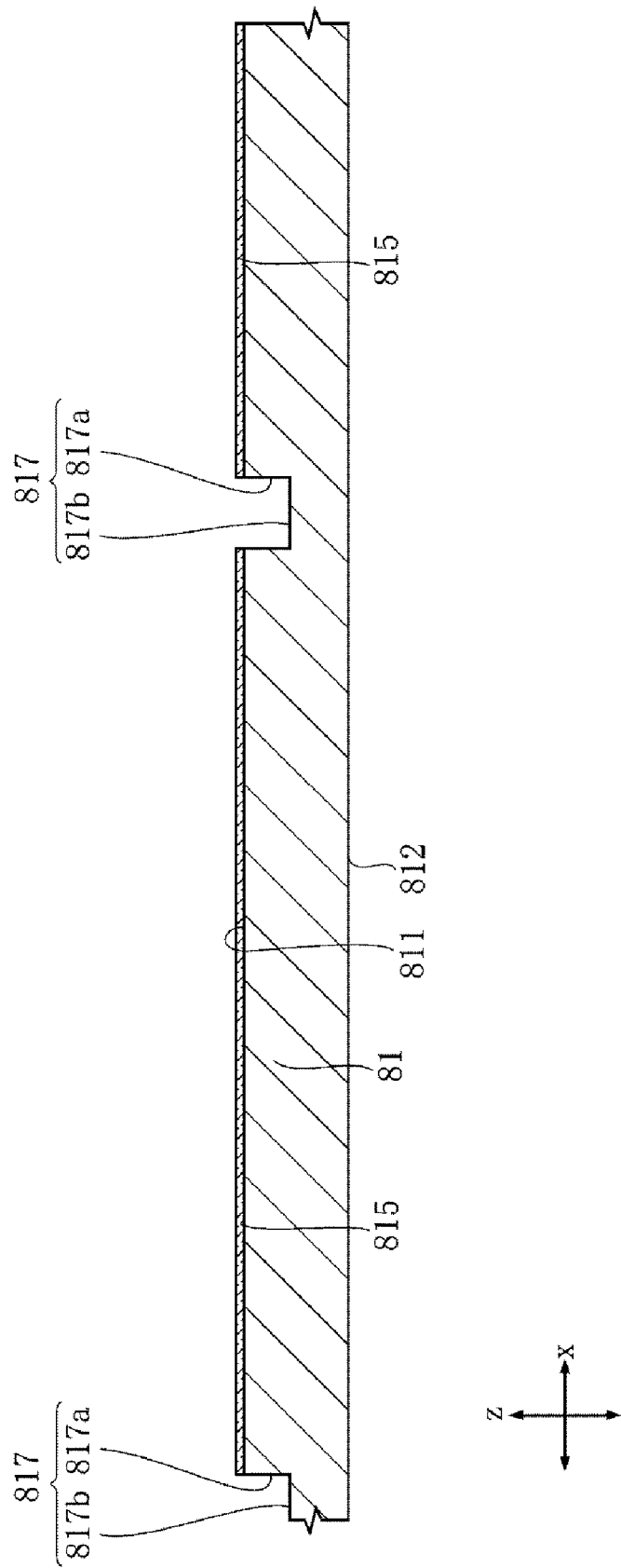
FIG. 50 is a cross-sectional view illustrating a manufacturing step of the semiconductor device shown in FIG. 46.

In the fourth step, the resist layer 807 is removed as shown in FIG. 50.

Through the four steps described above, a recess 817 is formed in the base 81 as shown in FIG. 50. Thereafter, as in the fourth embodiment, the steps after the base layer forming step (see FIG. 8) are sequentially performed. Then, for example, by blade dicing, the base 81 is divided into individual pieces for each range corresponding to the substrate 1 of the semiconductor device A50, thereby forming the semiconductor device A50. At this time, the cutout portion 17 is formed in the substrate 1 of the semiconductor device A50 by cutting the substrate 1 so as to pass through the recess 817.

Next, the operations and effects of the semiconductor device A50 and the manufacturing method thereof will be described.

According to the present embodiment, the semiconductor device A50 includes the first metal layer 51 as in the semiconductor device A10. Therefore, the heat generated from the semiconductor element 31 may be radiated to the outside from the side of the element back surface 312. That is, the present embodiment has the same effects as those of the first embodiment.

According to the present embodiment, in the semiconductor device A50, the cutout portion 17 is formed in the substrate 1, and the cutout portion 17 is filled with a part of the sealing resin 4 (filling portion 45). According to such a configuration, the semiconductor device A50 can increase the distance in the z direction between the substrate 1 and the electrode pads 26 on the lateral side of the semiconductor device A50 as compared to the semiconductor device A40. Therefore, it is possible to suppress the solder used for mounting the semiconductor device A50 on a circuit board or the like from being formed across the substrate 1 and the electrode pads 26. In particular, when the substrate 1 is not an insulator but a conductor, if the solder is formed across the substrate 1 and the electrode pads 26, an unintended short circuit may occur. Therefore, an unintended short circuit can be suppressed by suppressing the solder from being formed across the substrate 1 and the electrode pads 26.

In addition, in the present embodiment, the same configuration as in the first to fourth embodiments has the same effects as those of the first to fourth embodiments. For example, in the present embodiment, each of the electrode pads 26 includes the first electrode portion 26a and the second electrode portion 26b. Therefore, it is easy to visually check the solder bonding state when the semiconductor device A50 is mounted on a circuit board or the like.

In the fourth and fifth embodiments, the semiconductor devices A40 and A50 include the first metal layer 51. However, the first metal layer 51 may not be included. For example, if the resist layer 806 on the element back surface 831b is not formed in the third step of the first metal layer forming step (see FIG. 42), it is possible to manufacture a semiconductor device that does not include the first metal layer 51. Alternatively, an insulating protective film may be formed instead of the first metal layer 51.

In the fourth and fifth embodiments, there has been described the case where the semiconductor devices A40 and A50 have the electrode pads 26 formed on the resin side surface 43 facing the x direction. However, the present disclosure is not limited thereto. The electrode pads 26 may also be formed on the resin side surface 43 facing the y direction. That is, the semiconductor devices A40 and A50 may have a QFN (Quad Flatpack No-leaded) package structure instead of a DFN (Dual Flatpack No-leaded) package structure.

In the first to fifth embodiments, each of the semiconductor devices A10, A20, A30, A40, and A50 includes the second metal layer 52. However, the second metal layer 52 may not be provided. For example, in the plating layer forming step (see FIGS. 9 and 10), a semiconductor device that does not include the second metal layer 52 can be manufactured by forming the resist layer 802 even at the position where the plating layer 852b is to be formed.

Figure 51:
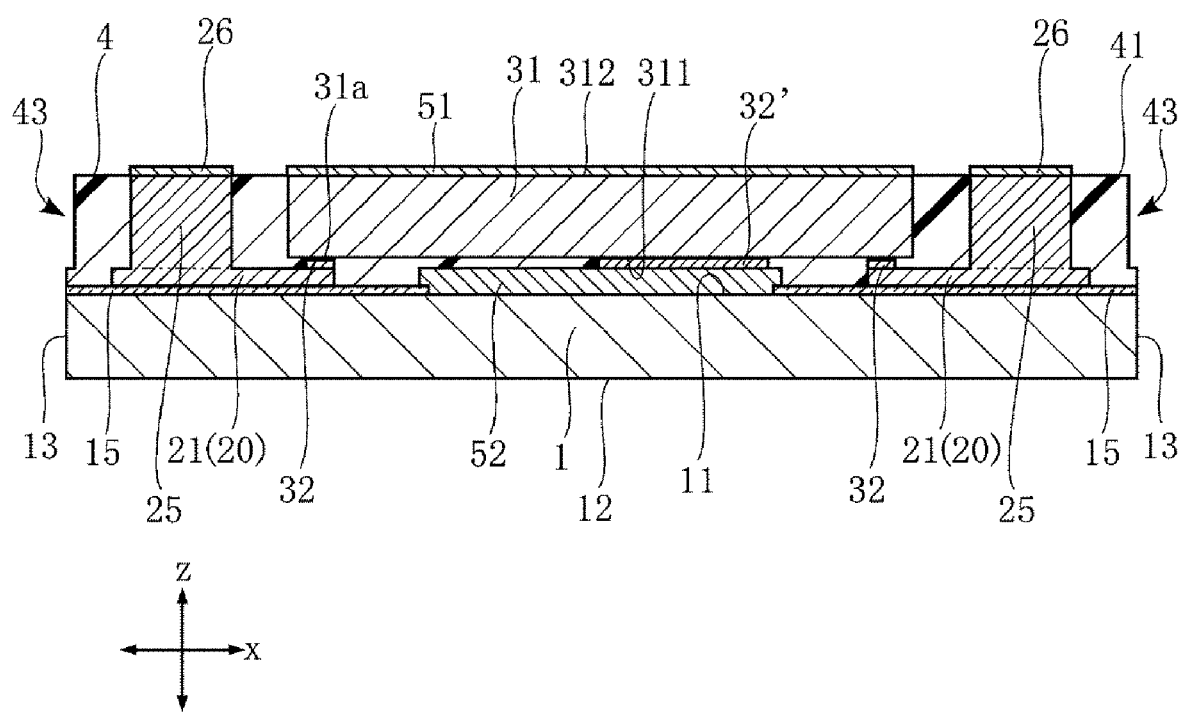
FIG. 51 is a cross-sectional view of a semiconductor device according to a modification of the present disclosure.

In the first to fifth embodiments, there has been described the case where in each of the semiconductor devices A10, A20, A30, A40, and A50, the semiconductor element 31 and the second metal layer 52 are separated from each other, and the sealing resin 4 is filled between the semiconductor element 31 and the second metal layer 52. However, the present disclosure is not limited thereto. For example, the semiconductor element 31 and the second metal layer 52 may be bonded by a conductor. FIG. 51 is a view for explaining such a modification and is a sectional view corresponding to FIG. 2. This figure shows, for example, a case where the semiconductor element 31 and the second metal layer 52 are bonded by a bonding layer 32' in the semiconductor device A10. In this modification, the bonding layer 32' is made of the same material as the bonding layer 32. Furthermore, as shown in FIG. 51, the bonding layer 32' is formed so as to cover a part of the surface (upper surface in the figure) of the second metal layer 52 facing the semiconductor element 31. In addition, the bonding layer 32' may be formed so as to cover the entire surface of the second metal layer 52 facing the semiconductor element 31. Furthermore, the arrangement and shape of the bonding layer 32' are not limited to those shown in FIG. 51. With this configuration, the heat generated from the semiconductor element 31 is transferred to the second metal layer 52 through the bonding layer 32'. Since the bonding layer 32' is mainly made of a metal material, the bonding layer 32' has a higher thermal conductivity than the sealing resin 4. Therefore, the heat dissipation performance of the semiconductor device can be further improved. When the semiconductor element 31 and the second metal layer 52 are bonded by the bonding layer 32', the second metal layer 52 may be used as an internal wiring. In this case, it is preferable to interpose an insulating material between the second metal layer 52 and the substrate 1.

In the first to fifth embodiments, there has been described the case where each of the semiconductor devices A10, A20, A30, A40, and A50 includes one semiconductor element 31. However, the present disclosure is not limited thereto. One or more semiconductor elements differing from the semiconductor element 31 may be included. FIG. 52 is a view for explaining such a modification and is a sectional view corresponding to FIG. 2. This figure shows, for example, a case where the semiconductor device A10 further includes a semiconductor element 33. In this modification, the semiconductor element 33 is a discrete semiconductor such as, for example, a diode or the like. Instead of the discrete semiconductor, an integrated circuit may be used like the semiconductor element 31. The semiconductor element 33 is a surface-mounted package. With such a configuration, the semiconductor device can be multi-functionalized.

In the first to fifth embodiments, there has been described the case where each of the semiconductor devices A10, A20, A30, A40, and A50 includes four columnar bodies 25. However, the number of the columnar bodies 25 is not limited thereto. The number of the columnar bodies 25 may be changed as appropriate according to the number of the electrode bumps 31a formed on the semiconductor element 31.

The semiconductor device and the method of manufacturing the semiconductor device according to the present disclosure are not limited to the above embodiments. The specific configuration of each part of the semiconductor device according to the present disclosure and the specific technique of each step of the method of manufacturing the semiconductor device according to the present disclosure may be variously modified.

A semiconductor device and a method of manufacturing the semiconductor device according to the present disclosure include embodiments relating to the following supplemental notes.

[Supplemental Note 1]
A semiconductor device, including:
a semiconductor element including an element main surface and an element back surface facing opposite sides in a thickness direction;
a wiring part electrically connected to the semiconductor element;
an electrode pad electrically connected to the wiring part;
a sealing resin configured to cover a part of the semiconductor element; and
a first metal layer configured to make contact with the element back surface and exposed from the sealing resin,
wherein the semiconductor element overlaps the first metal layer when viewed in the thickness direction.

[Supplementary Note 2]
The semiconductor device of Supplementary Note 1, wherein a material from which the first metal layer is made is the same as a material from which the electrode pad is made.

[Supplementary Note 3]
The semiconductor device of Supplementary Note 2, wherein the material is a Ni layer, a Pd layer and an Au layer stacked one above another.

[Supplementary Note 4]
The semiconductor device of Supplementary Note 2 or 3, wherein the electrode pad and the first metal layer are insulated from each other.

[Supplementary Note 5]
The semiconductor device of any one of Supplementary Notes 1 to 4, further including:
a second metal layer insulated from the wiring part,
wherein the second metal layer is disposed more to the front toward a direction that the element main surface faces than the semiconductor element in the thickness direction, and at least a part of the second metal layer overlaps the semiconductor element when viewed in the thickness direction.

[Supplementary Note 6]
The semiconductor device of Supplementary Note 5, wherein both the second metal layer and the wiring part include a base layer and a plating layer stacked one above the other.

[Supplementary Note 7]
The semiconductor device of Supplementary Note 6, wherein the base layer includes a Ti layer and a Cu layer stacked one above the other, and the plating layer is made of Cu.

[Supplementary Note 8]
The semiconductor device of any one of Supplementary Notes 1 to 7, further including:
a substrate made of a semiconductor material and provided with the wiring part disposed thereon; and
an insulating layer configured to insulate the substrate and the wiring part.

[Supplementary Note 9]
The semiconductor device of any one of Supplementary Notes 5 to 7, further including:
a substrate made of a semiconductor material and provided with the wiring part disposed thereon; and
an insulating film configured to insulate the substrate and the wiring part,
wherein the substrate has a mounting surface on which the semiconductor element is mounted,
wherein the mounting surface includes a covered region where the insulating film is formed and an exposed region exposed from the insulating film, and
wherein the second metal layer is in contact with the mounting surface in at least a part of the exposed region.

[Supplementary Note 10]
The semiconductor device of Supplementary Note 8 or 9, wherein the semiconductor material is Si.

[Supplementary Note 11]
The semiconductor device of any one of Supplementary Notes 1 to 10, further including:
a columnar body having conductivity and protruding from the wiring part in the thickness direction,
wherein the electrode pad is in contact with the columnar body.

[Supplementary Note 12]
The semiconductor device of Supplementary Note 11, wherein the columnar body has a top surface facing the same direction as the element back surface and exposed from the sealing resin,
wherein the sealing resin has a resin main surface facing the same direction as the element back surface, and
wherein the top surface and the resin main surface are flush with the element back surface.

[Supplementary Note 13]

The semiconductor device of Supplementary Note 12, wherein the top surface is covered with the electrode pad, and wherein the electrode pad and the first metal layer coincide with each other in the thickness direction.

[Supplementary Note 14]

The semiconductor device of Supplementary Note 12, wherein the sealing resin has a first resin side surface and a second resin side surface, wherein the first resin side surface is connected to the resin main surface, and wherein the second resin side surface is disposed more inside the sealing resin than the first resin side surface when viewed in the thickness direction.

[Supplementary Note 15]

The semiconductor device of Supplementary Note 14, wherein the electrode pad includes a first electrode portion formed across the resin main surface and the top surface, and a second electrode portion connected to the first electrode portion and configured to cover the first resin side surface.

[Supplementary Note 16]

The semiconductor device of any one of Supplementary Notes 1 to 15, further including:

a bonding layer electrically connected to the wiring part and configured to bond the semiconductor element.

[Supplementary Note 17]

A method of manufacturing a semiconductor device, including:

providing a substrate made of a semiconductor material;

forming a wiring part arranged on the substrate;

mounting a semiconductor element by electrically connecting the semiconductor element having an element main surface and an element back surface facing opposite sides in a thickness direction to the wiring part such that the element main surface faces the substrate;

forming a sealing resin that covers the semiconductor element;

exposing the semiconductor element by removing a part of the sealing resin and exposing the element back surface;

forming a first metal layer in contact with the element back surface exposed by the sealing resin; and forming an electrode pad electrically connected to the wiring part.

[Supplementary Note 18]

The method of Supplementary Note 17, wherein the first metal layer and the electrode pad are formed by electroless plating.

[Supplementary Note 19]

The method of Supplementary Note 18, wherein forming the first metal layer and forming the electrode pad are collectively performed.

[Supplementary Note 20]

The method of any one of Supplementary Notes 17 to 19, further including:

forming a second metal layer disposed between the semiconductor element and the substrate in the thickness direction.

[Supplementary Note 21]

The method of Supplementary Note 20, further including:

forming, collectively with forming the second metal layer and forming the wiring part, a base layer by a sputtering method; and forming a plating layer by electrolytic plating.

[Supplementary Note 22]

The method of Supplementary Note 21, wherein forming the second metal layer and forming the wiring part are collectively performed.

[Supplementary Note 23]

The method of any one of Supplementary Notes 17 to 22, further including:

forming a columnar body having conductivity and protruding from the wiring part in the thickness direction, wherein the columnar body has a top surface facing the same direction as the element back surface and exposed from the sealing resin, and wherein forming the electrode pad includes forming the electrode pad covering the top surface.

According to the present disclosure in some embodiments, it is possible to efficiently release heat generated from a semiconductor element to the outside.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:

a semiconductor element including an element main surface and an element back surface facing opposite sides in a thickness direction;

a wiring part electrically connected to the semiconductor element;

an electrode pad electrically connected to the wiring part;

a sealing resin configured to cover a part of the semiconductor element; and a first metal layer configured to make contact with the element back surface and exposed from the sealing resin, wherein the semiconductor element overlaps the first metal layer when viewed in the thickness direction, the sealing resin includes:

a resin main surface facing a same direction as the element back surface, a first resin side surface, and a second resin side surface, the first resin side surface is connected to the resin main surface, the second resin side surface is disposed more inside the sealing resin than the first resin side surface when viewed in the thickness direction, the electrode pad includes:

a first electrode portion formed across the resin main surface and a top surface, and a second electrode portion connected to the first electrode portion and configured to cover the first resin side surface, the first resin side surface and the second resin side surface face a horizontal direction that is orthogonal to the thickness direction, and the second electrode portion is exposed from the sealing resin and overlaps the semiconductor element when viewed in the horizontal direction.

2. The semiconductor device of claim 1, wherein a material from which the first metal layer is made is the same as a material from which the electrode pad is made.

3. The semiconductor device of claim 2, wherein the material is a Ni layer, a Pd layer and an Au layer stacked one above another.

4. The semiconductor device of claim 2, wherein the electrode pad and the first metal layer are insulated from each other.

5. The semiconductor device of claim 1, further comprising:
   a second metal layer insulated from the wiring part,
   wherein the second metal layer is disposed more frontward in a direction that the element main surface faces than the semiconductor element in the thickness direction, and at least a part of the second metal layer overlaps the semiconductor element when viewed in the thickness direction.

6. The semiconductor device of claim 5, wherein both the second metal layer and the wiring part include a base layer and a plating layer stacked one above the other.

7. The semiconductor device of claim 6, wherein the base layer includes a Ti layer and a Cu layer stacked one above the other, and the plating layer is made of Cu.

8. The semiconductor device of claim 1, further comprising:
   a substrate made of a semiconductor material and provided with the wiring part disposed thereon; and
   an insulating layer configured to insulate the substrate and the wiring part.

9. The semiconductor device of claim 5, further comprising:
   a substrate made of a semiconductor material and provided with the wiring part disposed thereon; and
   an insulating film configured to insulate the substrate and the wiring part,
      wherein the substrate has a mounting surface on which the semiconductor element is mounted,
      wherein the mounting surface includes a covered region where the insulating film is formed and an exposed region exposed from the insulating film, and
      wherein the second metal layer is in contact with the mounting surface in at least a part of the exposed region.

10. The semiconductor device of claim 8, wherein the semiconductor material is Si.

11. The semiconductor device of claim 1, further comprising:
    a columnar body having conductivity and protruding from the wiring part in the thickness direction,
    wherein the electrode pad is in contact with the columnar body.

12. The semiconductor device of claim 11,
    wherein the columnar body has a top surface facing the same direction as the element back surface and exposed from the sealing resin, and
    wherein the top surface and the resin main surface are flush with the element back surface.

13. The semiconductor device of claim 12,
    wherein the top surface is covered with the electrode pad, and
    wherein the electrode pad and the first metal layer coincide with each other in the thickness direction.

14. The semiconductor device of claim 1, further comprising:
    a bonding layer electrically connected to the wiring part and configured to bond the semiconductor element.

* * * * *